(12) United States Patent
Wang et al.

(10) Patent No.: US 10,436,973 B2
(45) Date of Patent: Oct. 8, 2019

(54) QUANTUM DOT COMPOSITE MATERIAL AND MANUFACTURING METHOD AND APPLICATION THEREOF

(71) Applicant: Lextar Electronics Corporation, Hsinchu (TW)

(72) Inventors: Hung-Chia Wang, Taichung (TW); Xue-Jie Zhang, Guangzhou (CN); Shin-Ying Lin, Tainan (TW); An-Cih Tang, Taichung (TW); Ru-Shi Liu, New Taipei (TW); Tzong-Liang Tsai, Taichung (TW); Yu-Chun Lee, Zhubei (TW); Ching-Yi Chen, New Taipei (TW); Hung-Chun Tong, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 266 days.

(21) Appl. No.: 15/362,120

(22) Filed: Nov. 28, 2016

(65) Prior Publication Data
US 2017/0153382 A1    Jun. 1, 2017

Related U.S. Application Data

(60) Provisional application No. 62/334,502, filed on May 11, 2016, provisional application No. 62/291,552, (Continued)

(30) Foreign Application Priority Data
Oct. 7, 2016 (TW) .............................. 105132612 A

(51) Int. Cl.
*F21V 8/00* (2006.01)
*C09K 11/66* (2006.01)
(Continued)

(52) U.S. Cl.
CPC .......... *G02B 6/0073* (2013.01); *C09K 11/025* (2013.01); *C09K 11/665* (2013.01);
(Continued)

(58) Field of Classification Search
CPC ..... C09K 11/025; C09K 11/665; B82Y 20/00; B82Y 40/00; Y10S 977/778; Y10S 977/781
See application file for complete search history.

(56) References Cited

U.S. PATENT DOCUMENTS 7,641,815 B2    1/2010  Varadarajan et al.
8,952,239 B2    2/2015  Pfenninger et al.
(Continued)

FOREIGN PATENT DOCUMENTS

CN    101443431 A    5/2009
CN    101785114 A    7/2010
(Continued)

OTHER PUBLICATIONS

Pan et al, "Air-Stable Surface-Passivated Perovskite Quantum Dots for Ultra-Robust, Single- and Two-Photon-Induced Amplified Spontaneous Emission", J. Phys. Chem. Lett., 6, 2015, pp. 5027-5033, Dec. 1, 2015.*
(Continued)

*Primary Examiner* — C Melissa Koslow
(74) *Attorney, Agent, or Firm* — McClure, Qualey & Rodack, LLP

(57) ABSTRACT

A quantum dot composite material and a manufacturing method and an application thereof are provided. The quantum dot composite material includes an all-inorganic perovskite quantum dot and a modification protection on a surface of the all-inorganic perovskite quantum dot. The all-inorganic perovskite quantum dot has a chemical formula of $CsPb(Cl_aBr_{1-a-b}I_b)_3$, wherein $0 \leq a \leq 1$, $0 \leq b \leq 1$.

16 Claims, 37 Drawing Sheets

Related U.S. Application Data filed on Feb. 5, 2016, provisional application No. 62/260,657, filed on Nov. 30, 2015.

(51) Int. Cl.

| | | |
|---|---|---|
| H01L 25/075 | (2006.01) | |
| H01L 33/50 | (2010.01) | |
| H01L 33/56 | (2010.01) | |
| H01L 33/62 | (2010.01) | |
| C09K 11/02 | (2006.01) | |
| B82Y 20/00 | (2011.01) | |
| B82Y 40/00 | (2011.01) | |

(52) U.S. Cl.
CPC ......... *G02B 6/0031* (2013.01); *G02B 6/0051* (2013.01); *H01L 25/0753* (2013.01); *H01L 33/504* (2013.01); *H01L 33/56* (2013.01); *H01L 33/62* (2013.01); *B82Y 20/00* (2013.01); *B82Y 40/00* (2013.01); *H01L 2224/48091* (2013.01); *H01L 2224/49111* (2013.01); *H01L 2224/73265* (2013.01); *H01L 2933/0041* (2013.01); *Y10S 977/774* (2013.01); *Y10S 977/892* (2013.01); *Y10S 977/95* (2013.01)

(56) References Cited

U.S. PATENT DOCUMENTS

| | | | |
|---|---|---|---|
| 9,577,127 | B1 * | 2/2017 | Wang |
| 2006/0226759 | A1 | 10/2006 | Masuda et al. |
| 2012/0037883 | A1 | 2/2012 | Jiang et al. |
| 2012/0113672 | A1 † | 5/2012 | Dubrow |
| 2013/0320370 | A1 | 12/2013 | Schubert et al. |
| 2014/0339495 | A1 | 11/2014 | Bibl et al. |
| 2015/0176777 | A1 | 6/2015 | Hikmet et al. |
| 2015/0221619 | A1 | 8/2015 | Rhee |
| 2016/0190105 | A1 | 6/2016 | Rhee et al. |
| 2016/0190515 | A1 | 6/2016 | Huang et al. |
| 2017/0117444 | A1 | 4/2017 | Stoll et al. |
| 2017/0346024 | A1 * | 11/2017 | Lee .................. B01J 13/06 |

FOREIGN PATENT DOCUMENTS

| | | | |
|---|---|---|---|
| CN | 104861958 A | | 8/2015 |
| CN | 105062193 A | | 11/2015 |
| CN | 105086993 A | | 11/2015 |
| JP | H11340516 | | 12/1992 |
| JP | 2008218733 A | | 9/2008 |
| JP | 201452606 A | | 3/2014 |
| TW | I523271 | | 2/2016 |
| WO | 20007109734 A2 | | 9/2007 |
| WO | 2012102107 A1 | | 8/2012 |
| WO | 2015092397 A1 | | 6/2015 |
| WO | WO 2016/072806 | * | 5/2016 |

OTHER PUBLICATIONS

Hung et al, "Water resistant CsPbX3 nanocrsytals coated with polyhedral oligomeric silsesquioxane and their use as solid-state luminophors in all-perovskite white light-emitting devices", Chem. Sci., 7, 2016, pp. 5699-5703, Jun. 13, 2016.*
TIPO Office Action dated Apr. 25, 2017 in Taiwan application (No. 105132612).
Partial EP Search Report dated May 29, 2017 in EP Application (No. 16201099.5-1375).
Yantara, et al.: "Inorganic Halide Perovskites for Efficient Light-Emitting Diodes"; The Journal of Physical Chemistry Letters; copyright 2015; American Chemical Society; pp. 4360-4364.
Leijtens, et al.: "Stability of Metal Halide Perovskite Solar Cells"; Advanced Energy Materials; 2015; pp. 1-23.
Pathak, et al.: "Perovskite Crystals for Tunable White Light Emission"; Chemistry of Materials; copyright 2015 American Chemical Society; pp. 8066-8075.
Akkerman, et al.: :"Tuning the Optical Properties of Cesium Lead Halide Perovskite Nanocrystals by Anion Exchange Reactions"; © 2015 American Chemical Society; pp. 10276-10281, J. Am. Chem. Soc., 137, Jul. 27, 2015.
EP Search Report dated Oct. 26, 2017 in European application (No. 16201099.5-1375 / 3192846).
Non-Final Office Action issued in U.S. Appl. No. 15/358,339, filed Nov. 22, 2016, dated Oct. 19, 2017.
Song, et al.: "Quantum Dot Light-Emitting Diodes Based on Inorganic Perovskite Cesium Lead Halides (CsPbX 3 )"; © 2015 Wiley-VCH Verlag GmbH & Co. KGaA, Weinheim; pp. 7162-7167, Advanced Materials , 27.
Final Office Action issued in U.S. Appl. No. 15/358,339, filed Nov. 22, 2016, dated Mar. 7, 2018.
Nedelcu, et al.: "Fast Anion-Exchange in Highly Luminescent Nanocrystals of Cesium Lead Halide Perovskites (CsPbX3, X=Cl, Br, I)"; ACS Publications; © 2015 American Chemical Society; pp. 5635-5640, Nanoletters, 15.
Zhang, et al.: "Solution-Phase Synthesis of Cesium Lead Halide Perovskite Nanowires"; © 2015 American Chemical Society; pp. 9230-9233, J. Am. Chem. Soc., 137.
Jung, et al.: "Perovskite Solar Cells: From Materials to Devices"; © 2014 Wiley-VCH Verlag GmbH & Co. KGaA, Weinheim; pp. 10-25, Materials Views, 11, No. 1.
Kim, et al.: "Lead Iodide Perovskite Sensitized All-Solid-State Submicron Thin Film Mesoscopic Solar Cell with Efficiency Exceeding 9%"; Scientific Reports; Published Aug. 21, 2012; pp. 1-7.
Zhou, et al.: "Interface engineering of highly efficient perovskite solar cells"; sciencemag.org; Aug. 1, 2014 • vol. 345 Issue 6196; pp. 542-547, Science.
Protesescu, et al.: "Nanocrystals of Cesium Lead Halide Perovskites (CsPbX3, X=Cl, Br, and I): Novel Optoelectronic Materials Showing Bright Emission with Wide Color Gamut"; © 2015 American Chemical Society; pp. 3692-3696, Nanoletters, 15.
"Perovskite" From Wikipedia, the free encyclopedia; Nov. 3, 2016; https://en.wikipedia.org/wiki/Perovskite; pp. 1-4.
Clarence Zener: "Interaction between the d-Shells in the Transition Metals. II. Ferromagnetic Compounds of Manganese with Perovskite Structure"; May 1, 1951; vol. 82, No. 3; pp. 403-405, Ferromagnetic Compounds of Manganese.
CN Office Action dated Apr. 28, 2019 in Chinese application (No. 201611040437.3).
Gao, et al.: "Decorating CdTe QD-Embedded Mesoporous Silica Nanospheres with Ag NPs to Prevent Bacteria Invasion for Enhanced Anticounterfeit Applications"; ACS Publications copyright 2015 American Chemical Society; pp. 10022-10033.
Loredana Protesescu, et al., "Nanocrystal of Cesium Lead Halide Perovskites (CsPbX3,X=Cl, Br, and I): Novel Optoelectronic Materials Showing Bright Emission with Wide Color Gamut", pp. 5, publication date: Jan. 29, 2015, Publisher: ACS Publications, Journal Nano Letters vol. 15, pp. 3692-3696.†
Sergli Yakunin et al., "Low-Threshold Amplified Spontaneous Emission and Lasing from Colloidal Nanocrystals of Caesium Lead Halide Perovskites", pp. 9, Publication Date: Aug. 20, 2015, Publisher: Macmillian Publishers Limited, Journal: Nature Communications, vol. 6, pp. 1-8, 1 errata.†

\* cited by examiner
† cited by third party

QUANTUM DOT COMPOSITE MATERIAL AND MANUFACTURING METHOD AND APPLICATION THEREOF

This application claims the benefit of U.S. provisional application Ser. No. 62/260,657, filed Nov. 30, 2015; U.S. provisional application Ser. No. 62/291,552, filed Feb. 5, 2016; U.S. provisional application Ser. No. 62/334,502, filed May 11, 2016; Taiwan application Serial No. 105132612, filed Oct. 7, 2016, the subject matters of which are incorporated herein by reference.

BACKGROUND OF THE INVENTION

Field of the Invention

The invention relates in general to a quantum dot composite material and a manufacturing method and an application thereof, and particularly relates to a quantum dot composite material comprising a modification protection and a manufacturing method and an application thereof.

Description of the Related Art

Currently, a common light emitting material often uses a phosphor powder and a quantum dot. However, market for the phosphor powder is almost close to a saturation condition. A full width at half maximum (FWHM) of an emission spectrum of the phosphor powder is wide mostly, and is difficult to improve dramatically. This results in technical limits in an application for a device. Therefore, the research trend is towards the quantum dot field.

Nano materials have a particle size of 1 nm to 100 nm, and can be further classified according to the size. Semiconductor nano crystals (NCs) are referred to as quantum dots (QDs), and a particle size of which is classified into a nano material of zero dimension. The nano material is widely used for an application of a light emitting diode, a solar cell, a biomarker, etc. Unique properties of its optical, electrical and magnetic characteristics make the nano material being an object researched for newly developed industry.

The quantum dot has an emission property having a narrow FWHM. Therefore, the quantum dot can be applied in a light emitting diode device to solve a problem of an insufficient wide color gamut of a conventional phosphor powder, attracting attention extraordinarily.

SUMMARY OF THE INVENTION

The present disclosure relates to a wavelength-converting material and an application thereof.

According to a concept of the present disclosure, a quantum dot composite material is provided. The quantum dot composite material comprises an all-inorganic perovskite quantum dot and a modification protection on a surface of the all-inorganic perovskite quantum dot. The all-inorganic perovskite quantum dot has a chemical formula of $CsPb(Cl_aBr_{1-a-b}I_b)_3$, wherein $0 \le a \le 1$, $0 \le b \le 1$.

According to another concept of the present disclosure, a wavelength converting film is provided. The wavelength converting film comprises a quantum dot composite material. The quantum dot composite material comprises an all-inorganic perovskite quantum dot and a modification protection on a surface of the all-inorganic perovskite quantum dot. The all-inorganic perovskite quantum dot has a chemical formula of $CsPb(Cl_aBr_{1-a-b}I_b)_3$, wherein $0 \le a \le 1$, $0 \le b \le 1$. The modification protection comprises a mesoporous particle, an inorganic-shell-layer encapsulation, a ligand exchange, a microcapsule, a polymer encapsulation, a silicon containing material encapsulation, an oxide or nitride dielectric encapsulation or a combination thereof.

According to yet another concept of the present disclosure, a manufacturing method for a quantum dot composite material is provided, comprising the following steps. An all-inorganic perovskite quantum dot having a chemical formula of $CsPb(Cl_aBr_{1-a-b}I_b)_3$ complying with $0 \le a \le 1$, $0 \le b \le 1$ is provided. A modification protection is formed on a surface of the all-inorganic perovskite quantum dot.

According to yet another concept of the present disclosure, a light emitting device is provided. The light emitting device comprises a light emitting diode chip and a wavelength-converting material. The wavelength-converting material is capable of being excited by a first light emitted from the light emitting diode chip to emit a second light having a wavelength different from a wavelength of the first light. The wavelength-converting material comprises a quantum dot composite material. The quantum dot composite material comprises an all-inorganic perovskite quantum dot and a modification protection on a surface of the all-inorganic perovskite quantum dot. The all-inorganic perovskite quantum dot has a chemical formula of $CsPb(Cl_aBr_{1-a-b}I_b)_3$, wherein $0 \le a \le 1$, $0 \le b \le 1$. The modification protection comprises a mesoporous particle, an inorganic-shell-layer encapsulation, a ligand exchange, a microcapsule, a polymer encapsulation, a silicon containing material encapsulation, an oxide or nitride dielectric encapsulation or a combination thereof.

According to a concept of the present disclosure, a quantum dot light emitting diode (QLED) is provided. The quantum dot light emitting diode comprises a light emitting layer. The light emitting layer comprises a quantum dot composite material. The quantum dot composite material comprises an all-inorganic perovskite quantum dot and a modification protection on a surface of the all-inorganic perovskite quantum dot. The all-inorganic perovskite quantum dot has a chemical formula of $CsPb(Cl_aBr_{1-a-b}I_b)_3$, wherein $0 \le a \le 1$, $0 \le b \le 1$. The modification protection comprises a mesoporous particle, an inorganic-shell-layer encapsulation, a ligand exchange, a microcapsule, a polymer encapsulation, a silicon containing material encapsulation, an oxide or nitride dielectric encapsulation or a combination thereof.

The above and other aspects of the invention will become better understood with regard to the following detailed description of the preferred but non-limiting embodiment (s). The following description is made with reference to the accompanying drawings.

BRIEF DESCRIPTION OF THE DRAWINGS

FIG. 66A shows a comparison of an emission spectrum of a red phosphor powder of a comparative example and an absorption spectrum of a chlorophyll a.

FIG. 66B shows a comparison of an emission spectrum of a red phosphor powder of a comparative example and an absorption spectrum of a chlorophyll a.

FIG. 66C shows a comparison of an emission spectrum of a red phosphor powder of a comparative example and an absorption spectrum of a chlorophyll a.

DETAILED DESCRIPTION OF THE INVENTION

Figure 1A:
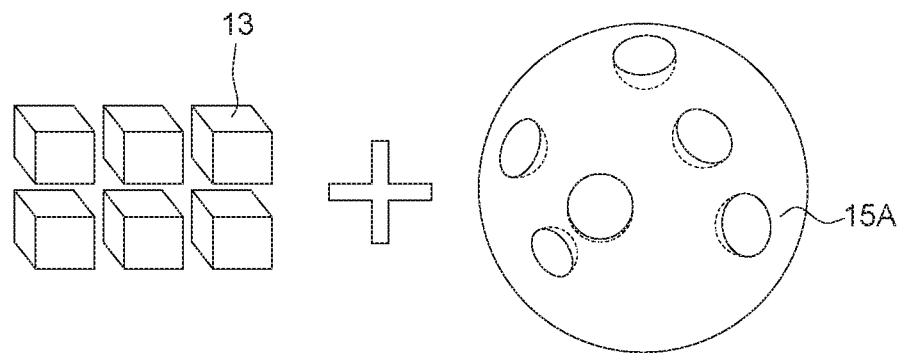
FIG. 1A illustrates a manufacturing method for a quantum dot composite material according to an embodiment.

Embodiment of the present disclosure relate to a quantum dot composite material and its applications. The quantum dot composite material comprises an all-inorganic perovskite quantum dot capable of exhibiting an emission spectrum having a narrow full width at half maximum (FWHM) and a good pure quality of color. In addition, the quantum dot composite material comprises a modification protection on a surface of the all-inorganic perovskite quantum dot, and thus has a good stability.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

In embodiments, the quantum dot composite material comprises the all-inorganic perovskite quantum dot and the modification protection on the surface of the all-inorganic perovskite quantum dot.

The all-inorganic perovskite quantum dot has a chemical formula of $CsPb(Cl_aBr_{1-a-b}I_b)_3$, wherein 0≤a≤1, 0≤b≤1. In embodiments, the all-inorganic perovskite quantum dot is capable of being excited by a first light to emit a second light having a wavelength different from a wavelength of the first light. The all-inorganic perovskite quantum dot has a good quantum efficiency, exhibiting an emission spectrum having a narrow full width at half maximum (FWHM) and a good pure quality of color. Therefore, the all-inorganic perovskite quantum dot has a good wavelength converting effect on a light, benefiting a light emitting effect of a light emitting device as being used in the light emitting device. In an embodiment, the first light is emitted from a blue light emitting diode or a UV light emitting diode.

The all-inorganic perovskite quantum dot may be adjusted in a composition and/or a size to modify a band gap to change a color of an emission light (a wavelength of the second light), such as blue, green, red color gamut, flexible in application.

The all-inorganic perovskite quantum dot has a nanometer size. For example, the all-inorganic perovskite quantum dot has a particle diameter in a range of about 1 nm to 100 nm, such as in a range of about 1 nm to 20 nm.

For example, the all-inorganic perovskite quantum dot has a chemical formula of $CsPb(Cl_aBr_{1-a})_3$, 0≤a≤1. Alternatively, the all-inorganic perovskite quantum dot has a chemical formula of $CsPb(Br_{1-b}I_b)_3$, 0≤b≤1.

In embodiments, the all-inorganic perovskite quantum dot may be a blue quantum dot (blue all-inorganic perovskite quantum dot). For example, in an example of the all-inorganic perovskite quantum dot having the chemical formula of $CsPb(Cl_aBr_{1-a})_3$, the all-inorganic perovskite quantum dot is the blue quantum dot when complying with 0≤a≤1, and/or having a particle diameter in a range of about 7 nm to 10 nm. In an embodiment, the (second) light emitted from the excited blue quantum dot has a wave peak at a position of about 400 nm to 500 nm, or/and a full width at half maximum (FWHM) of about 10 nm to 30 nm.

In embodiments, the all-inorganic perovskite quantum dot may be a red quantum dot (red all-inorganic perovskite quantum dot). For example, in an example of the all-inorganic perovskite quantum dot having the chemical formula of $CsPb(Br_{1-b}I_b)_3$, the all-inorganic perovskite quantum dot is the red quantum dot when complying with 0.5≤b≤1, and/or having a particle diameter in a range of about 10 nm to 14 nm. In an embodiment, the (second) light emitted from the excited red quantum dot has a wave peak at a position of about 570 nm to 700 nm, or/and a FWHM of about 20 nm to 60 nm.

In embodiments, the all-inorganic perovskite quantum dot may be a green quantum dot (green all-inorganic perovskite quantum dot). For example, in an example of the all-inorganic perovskite quantum dot having the chemical formula of $CsPb(Br_{1-b}I_b)_3$, the all-inorganic perovskite quantum dot is the green quantum dot when complying with 0≤b<0.5, and/or having a particle diameter in a range of about 8 nm to 12 nm. In an embodiment, the second light emitted from the excited green all-inorganic perovskite quantum dot has a wave peak at a position of about 500 nm to 570 nm, or/and a FWHM of about 15 nm to 40 nm.

The modification protection formed on the all-inorganic perovskite quantum dot can provide a protecting effect on the all-inorganic perovskite quantum dot, preventing the all-inorganic perovskite quantum dot being affected by other adjacent wavelength-converting materials in characteristics. For example, an ion exchange between the all-inorganic perovskite quantum dots having different compositions can be avoided. Thus the all-inorganic perovskite quantum dots would not be affected in their expected compositions and emission characteristics. Otherwise, undesirable influences to an all-inorganic perovskite quantum dot without protection may comprise a change in emission position, a broadening in a FWHM, etc. The modification protection also can prevent the all-inorganic perovskite quantum dot from environmental influences such as heat, light, moisture, oxygen gas, and avoid a property damage of the all-inorganic perovskite quantum dot. Thus, the quantum dot composite material can improve an environmental tolerance of the all-inorganic perovskite quantum dot. The all-inorganic perovskite quantum dot can be protected to keep desired compositions and emission characteristics, and thus can have a better stability and a longer lifespan. Reliability of a device product can be also improved by using the quantum dot composite material according to embodiments.

In embodiments, the modification protection may comprise a mesoporous particle, an inorganic-shell-layer encapsulation, a ligand exchange, a microcapsule, a polymer encapsulation, a silicon containing material encapsulation, an oxide or nitride dielectric encapsulation or a combination thereof. The modification protection can provide a protecting effect to the all-inorganic perovskite quantum dot with a physical modification property or a chemical modification property.

In embodiments, the mesoporous particle has pores on a surface of the mesoporous particle. The mesoporous particle may have a particle diameter in a range of about 200 nm to 1000 nm. A pore of the mesoporous particle has a size larger than or substantially equal to the particle diameter of the all-inorganic perovskite quantum dots so as to receive the all-inorganic perovskite quantum dots to embed into the pores. For example, the size of the pore may be about 1 nm to 100 nm, or may be about 2 nm to 20 nm. The mesoporous particle has a large specific surface area, and thus can have a strong adsorption to the all-inorganic perovskite quantum dot. The all-inorganic perovskite quantum dots can get into the pores of the mesoporous particle by a physical adsorption. In embodiments, the mesoporous particle may have a material comprising silicon dioxide (silica), etc., having a high transmittance to light, and not degrading a light emitting efficiency from the all-inorganic perovskite quantum dot.

The inorganic-shell-layer encapsulation may have a material comprising one or more of a binary compound or a ternary compound containing elements of a II group, a III group, a V group, a VI group, or a combination thereof, such as $CuInS_2$, PbS, PbSe, PbTe, PbSeS, PbSeTe, PbSTe, SnPbS, or a combination thereof, a binary compound or a ternary compound containing elements of a III-V group or a II-VI group, such as ZnS, ZnSe, ZnTe, CdS, CdTe, ZnCdS, InP, or a combination thereof.

In embodiments, the ligand exchange may be formed by a ligand exchange reaction to the surface of the all-inorganic perovskite quantum dot, with a compound for providing a ligand for example comprising tri-n-octyl phosphine oxide (TOPO), 9, 10-dihydro-9-oxa-10-phosphaphenanthrene 10-oxide (DOPO), an oleic acid, an oligomer, a sulfur containing compound or a combination thereof. A polymerization or an oligomerization may occur to among ligands.

In an embodiment, the ligand exchange is formed by a sulfuring treatment to the surface of the all-inorganic perovskite quantum dot. For example, the sulfuring treatment comprises a ligand exchanging reaction between the all-inorganic perovskite quantum dot and the sulfur containing compound. For example, the sulfur containing compound used for the sulfuring treatment may comprise a sulfur containing quaternary ammonium salt.

In an embodiment, for example, the sulfuring treatment for forming the ligand exchange may comprise a step of mixing the oleic acid with the all-inorganic perovskite quantum dot, and a step of mixing a sulfuring agent comprising the sulfur containing compound with the oleic acid and the all-inorganic perovskite quantum dot (with the mixture containing the oleic acid and the all-inorganic perovskite quantum dot). In an embodiment, the sulfuring agent may be manufactured by a method comprising mixing an organic solution dissolving a halogen containing quaternary ammonium salt with an aqueous solution dissolving an alkali metal sulfide (in a water solvent) to obtain the sulfuring agent. For example, the halogen containing quaternary ammonium salt used for the sulfuring treatment may have a formula of $R_4NX$, wherein R is an alkyl group, an alkoxyl group, a phenyl group or an alkyl phenyl group containing a carbon chain having 1-20 carbon atoms, X is chlorine (Cl), bromine (Br) or iodine (I). For example, the alkyl phenyl group may comprise a tolyl group, a p-xylyl group, etc., or a combination thereof. For example, the halogen containing quaternary ammonium salt may comprise didodecyldimethylammonium bromide (DDAB), cetyltrimethylammonium chloride, tetrabutyl ammonium bromide, etc., or a combination thereof. For example, the alkali metal sulfide may comprise sodium sulfide, etc.

For example, the sulfur containing quaternary ammonium salt may comprise didodecyl dimethylammonium sulfide (SDDA), hexadecyltrimethylammonium sulfide (SHTA), tetrabutylammonium sulfide (STBA), etc., or a combination thereof. Didodecyl dimethylammonium sulfide (SDDA) may be formed by a reaction of didodecyldimethylammonium bromide (DDAB) (cation) and a sulfide ion (anion). Hexadecyltrimethylammonium sulfide (SHTA) may be formed by a reaction of cetyltrimethylammonium chloride and a sulfide ion. Tetrabutylammonium sulfide (STBA) may be formed by a reaction of tetrabutyl ammonium bromide and a sulfide ion.

The microcapsule may cover the all-inorganic perovskite quantum dot and/or the mesoporous particle. In addition, the microcapsule may be a micelle formed by a microemulsion method to cover the all-inorganic perovskite quantum dot and/or the mesoporous particle.

The polymer encapsulation may cover the all-inorganic perovskite quantum dot. In some embodiments, the polymer encapsulation may cover the mesoporous particle with the all-inorganic perovskite quantum dot embedded in the pores of the mesoporous particle. For example, the polymer encapsulation may have a material comprising PMMA, PET, PEN, PS, PVDF, PVAC, PP, PA, PC, PI, epoxy, silicone, or a combination thereof, etc. In an embodiment, the polymer encapsulation may be formed by polymerization reaction of one or more kinds of the foregoing materials in a mixed state to cover the all-inorganic perovskite quantum dot/the mesoporous particle to form the quantum dot composite material. The polymer encapsulation may be a macromolecule encapsulation.

The silicon containing material encapsulation may comprise $SiO_2$ or $Si(OMe)_3C_3H_6S$, or a silicon titanium oxide containing encapsulation, or other silicon and oxide containing materials (silica), or a combination thereof. In some embodiments, the silicon containing material encapsulation may provide a chemical modification protection to the all-inorganic perovskite quantum dot.

The oxide or nitride dielectric encapsulation may comprise a metal/metalloid oxide or a metal/metalloid nitride, such as $Al_2O_3$, $Si_3N_3$, etc., or a combination thereof.

FIG. 1A to FIG. 4 illustrates structures of quantum dot composite materials according to embodiments.

Figure 1B:
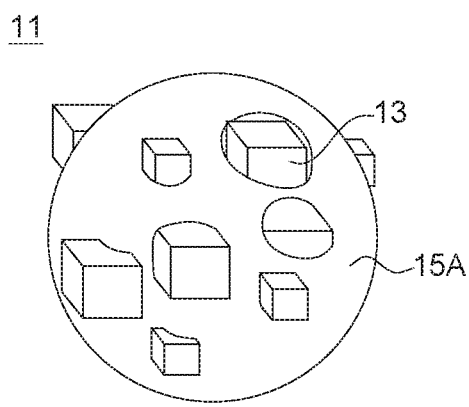
FIG. 1B illustrates a structure of a quantum dot composite material according to an embodiment.

Referring to FIG. 1A and FIG. 1B, a quantum dot composite material 11 comprises an all-inorganic perovskite quantum dot 13 and a modification protection on a surface of the all-inorganic perovskite quantum dot 13. In this example, the modification protection is a mesoporous particle 15A. The all-inorganic perovskite quantum dot 13 is embedded in a pore of the mesoporous particle 15A. For example, the menoporous particle 15A may be on a portion of a surface of the all-inorganic parovskite quantum dot 13, for example, on a lower surface of the all-inorganic perovskite quantum dot 13, a sidewall surface of the all-inorganic perovskite quantum dot 13, and/or an upper surface the all-inorganic perovskite quantum dot 13, as shown in FIG. 1B.

Figure 2:
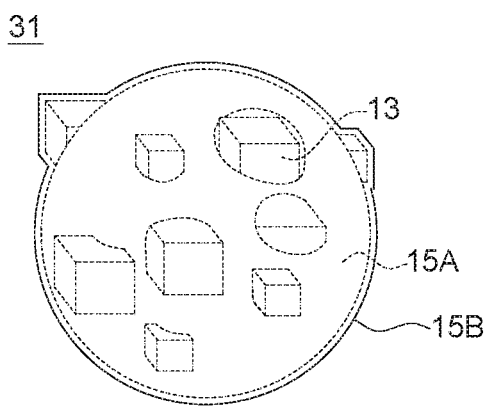
FIG. 2 illustrates a structure of a quantum dot composite material according to an embodiment.

FIG. 2 illustrates a quantum dot composite material 31. The quantum dot composite material 31 is different from the quantum dot composite material 11 as illustrated in FIG. 1 in that the modification protection further comprises an encapsulation 15B covering the mesoporous particle 15A and the all-inorganic perovskite quantum dot 13 embedded in the pore of the mesoporous particle 15A. For example, the encapsulation 15B comprises one or more of the polymer encapsulation (such as a macromolecule polymer), the silicon containing material encapsulation (such as $SiO_2$, etc.), the oxide or nitride dielectric encapsulation (such as $Al_2O_3$, $Si_3N_3$, etc.), the microcapsule or a combination thereof. In addition, the encapsulation 15B has a transparent material.

Figure 3A:
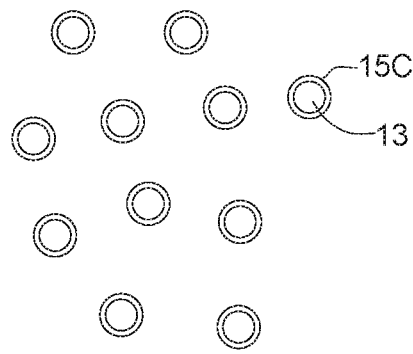
FIG. 3A illustrates a structure of a quantum dot composite material according to an embodiment.
Figure 3B:
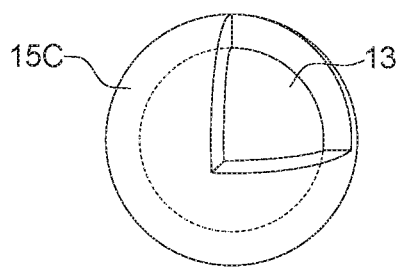
FIG. 3B illustrates a structure of a quantum dot composite material according to an embodiment.

Referring to FIG. 3A and FIG. 3B, a quantum dot composite material 41 comprises the all-inorganic perovskite quantum dot 13 and a modification protection 15C formed on the surface of the all-inorganic perovskite quantum dot 13. The modification protection 15C may be a kind of an inorganic-shell-layer encapsulation. As shown in the figure, the quantum dot composite material 41 has a core-shell structure with the all-inorganic perovskite quantum dot 13 as a core and the inorganic-shell-layer encapsulation as a shell covering the surface of the core (all-inorganic perovskite quantum dot 13). The inorganic-shell-layer encapsulation may has a material comprising one or more kinds of a binary compound or a temary compound containing elements of a II group, a III group, a V group, a VI group, or a combination thereof, such as $CuInS_2$, PbS, PbSe, PbTe, PbSeS, PbSeTe, PbSTe, SnPbS, or a combination thereof, a binary compound or a ternary compound containing elements of a III-V group or a II-VI group, such as ZnS, ZnSe, ZnTe, CdS, CdTe, ZnCdS, InP, or a combination thereof.

Figure 3C:
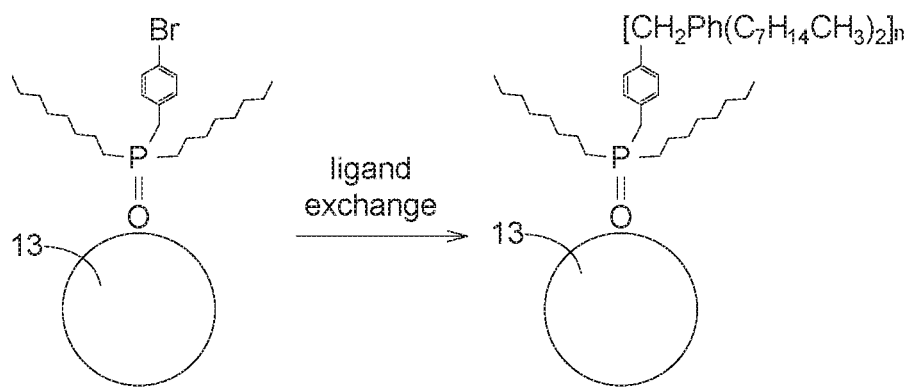
FIG. 3C illustrates a quantum dot composite material comprising a modification protection being a ligand exchange according to an embodiment.

In an embodiment, the modification protection 15C may comprise a ligand exchange. As shown in FIG. 3C, a ligand on the surface of the all-inorganic perovskite quantum dot 13 may be modified by a polymerization to a leaving group (such as Br, I, etc.) at an end of the ligand to form an oligomer or macromolecule structure at the end of the ligand.

Figure 3D:
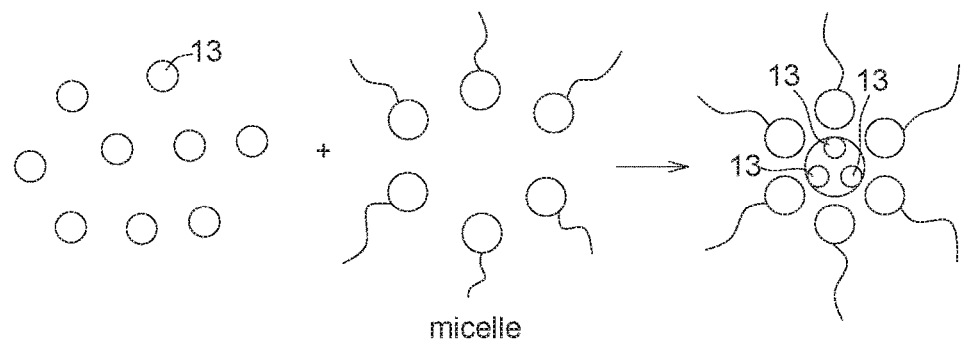
FIG. 3D illustrates a quantum dot composite material comprising a modification protection being a micelle formed by a microemulsion method according to an embodiment.

In an embodiment, the modification protection 15C may comprise the microcapsule. The microcapsule may be a micelle formed by a microemulsion method to cover the all-inorganic perovskite quantum dot 13, and make the surface of the all-inorganic perovskite quantum dot 13 having a hydrophilic property or hydrophobic property, as shown in FIG. 3D.

Figure 3E:
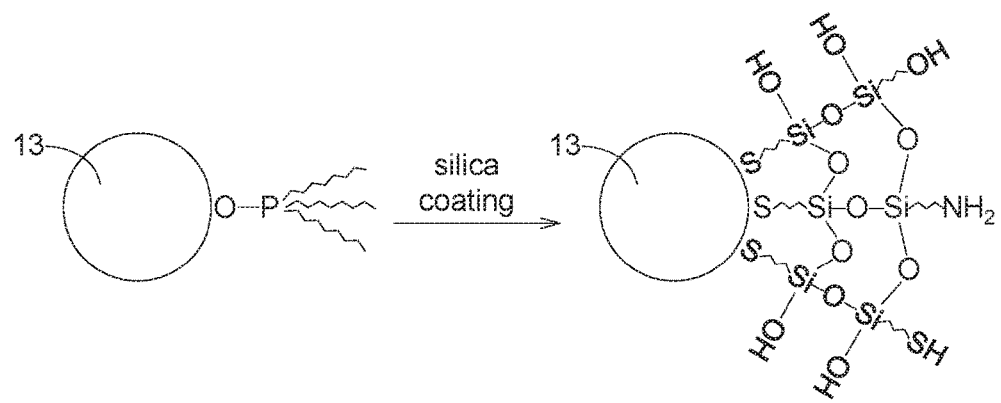
FIG. 3E illustrates a quantum dot composite material comprising a modification protection being a silicon containing material encapsulation according to an embodiment.

In an embodiment, the modification protection 15C may comprise a single-layer film (shell layer) or a multi-layer film structure formed by the silicon containing material encapsulation. The silicon containing material encapsulation may comprise $SiO_2$ or $Si(OMe)_3C_3H_6S$, or silicon titanium oxide containing encapsulation, or other silicon and oxide containing materials (silica), or a combination thereof. As shown in FIG. 3E, the all-inorganic perovskite quantum dot 13 is modified with a silicon and oxide containing material.

Figure 3F:
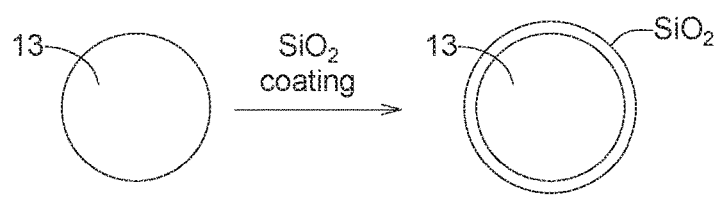
FIG. 3F illustrates a quantum dot composite material comprising a modification protection being a silicon containing material encapsulation according to an embodiment.

As shown in FIG. 3F, the all-inorganic perovskite quantum dot 13 is covered by a $SiO_2$ material.

Figure 4:
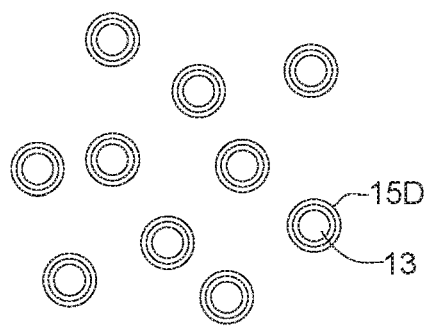
FIG. 4 illustrates a structure of a quantum dot composite material according to an embodiment.

FIG. 4 illustrates a quantum dot composite material 71. The quantum dot composite material 71 is different from the quantum dot composite material 41 as illustrated in FIG. 3 in that a modification protection 15D has a multi-layer film (shell layer) structure of two layers. Layers of the multi-layer film structure may respectively comprise the inorganic-shell-layer encapsulation, the ligand exchange, the microcapsule, the silicon containing material encapsulation, or a combination thereof. In other embodiments, the modification protection may have a multi-layer film (shell layer) structure of more layers such as three layers, four layers, and so on.

The quantum dot composite material of the present disclosure is not limited to the structures as illustrated in FIG. 1 to FIG. 4, and may be adjusted according to the concepts according to embodiments.

In embodiments, for example, a quantum dot composite material may be formed by forming a quantum dot composite material having the structure as illustrated in one of FIG. 3A to FIG. 3F or FIG. 4 or having a modification protection of more layers such as three layers, four layers, etc., and then embedding it into a pore of a mesoporous particle. For example, a quantum dot composite material may be formed by modifying a surface of an all-inorganic perovskite quantum dot with a ligand exchanging reaction or a sulfuring treatment, and then embedding the all-inorganic perovskite quantum dot having the ligand exchange on the surface thereof into a pore of a mesoporous particle.

In embodiments, for example, after a quantum dot composite material having the structure as illustrated in one of FIG. 3A to FIG. 3F or FIG. 4 or having a modification protection of more layers such as three layers, four layers, etc. is embedded into a pore of a mesoporous particle, an encapsulation (such as the polymer encapsulation, the silicon containing material encapsulation, the oxide or nitride dielectric encapsulation, or a combination thereof) may be formed to cover on the mesoporous particle to form a quantum dot composite material. For example, a quantum dot composite material may be formed by embedding an all-inorganic perovskite quantum dot having a ligand exchange on a surface thereof into a pore of a mesoporous particle, and then forming an encapsulation to cover the mesoporous particle.

The quantum dot composite material according to embodiments can be applied to various of applications of a wavelength converting element, a light emitting device, a photoelectric conversion device, such as a light emitting diode package, a quantum dot light emitting diode (QLED), a plant illumination, a display, a solar cell, a bioluminescence label (Bio Label), an image sensor, etc. The quantum dot composite material according to embodiments has good emission characteristics and stable property. Therefore, a product using the quantum dot composite material can be improved in efficiency stability and lifespan.

In embodiments, the light emitting device comprises a light emitting diode chip and a wavelength-converting material. The wavelength-converting material comprises the quantum dot composite material. The wavelength-converting material (or the quantum dot composite material) is capable of being excited by the first light emitted from the light emitting diode chip to emit the second light having a wavelength different from a wavelength of the first light.

The modification protection may be formed on the surface of at least one kind of the all-inorganic perovskite quantum dot $CsPb(Cl_aBr_{1-a-b}I_b)_3$ to form the quantum dot composite material of the wavelength-converting material so as to improve stability and lifespan of a device.

The wavelength-converting material (or a wavelength converting layer) of the light emitting device is not limited to use one kind of the quantum dot composite material/all-inorganic perovskite quantum dot. In other words, The wavelength-converting material (or the wavelength converting layer) of the light emitting device may use two or more kinds (i.e. two kinds, three kinds, four kinds, or more kinds of the quantum dot composite materials having different types of the modification protections and/or the all-inorganic perovskite quantum dot having different characteristics. The characteristic of the all-inorganic perovskite quantum dot may be adjusted according to a material chemical formula and/or a size.

For example, the all-inorganic perovskite quantum dot may comprise a first all-inorganic perovskite quantum dot and a second all-inorganic perovskite quantum dot having different characteristics from each other and mixed together. In other embodiments, the all-inorganic perovskite quantum dot may further comprise a third all-inorganic perovskite quantum dot, a fourth all-inorganic perovskite quantum dot, etc., each having a characteristic different from the characteristics of the first all-inorganic perovskite quantum dot and the second all-inorganic perovskite quantum dot, and mixed together.

For example, the first all-inorganic perovskite quantum dot and the second all-inorganic perovskite quantum dot may have different particle diameters. In other embodiments, the all-inorganic perovskite quantum dot may further comprise the third all-inorganic perovskite quantum dot, the fourth all-inorganic perovskite quantum dot, etc., having a particle diameter different from the article diameters of the first all-inorganic perovskite quantum dot and the second all-inorganic perovskite quantum dot.

In some embodiments, the first all-inorganic perovskite quantum dot and the second all-inorganic perovskite quantum dot both have the chemical formula of $CsPb(Cl_aBr_{1-a-b}I_b)_3$, $0 \le a \le 1$, $0 \le b \le 1$. The first all-inorganic perovskite quantum dot and the second all-inorganic perovskite quantum dot have different a, and/or have different b. This concept may be also applied for examples using the all-inorganic perovskite quantum dots of three kinds, four kinds, or more kinds.

For example, the first all-inorganic perovskite quantum dot and the second all-inorganic perovskite quantum dot may be selected from the group consisting of the red (all-inorganic perovskite) quantum dot having the chemical formula of $CsPb(Br_{1-b}I_b)_3$ with $0.5 \le b \le 1$, the green (all-inorganic perovskite) quantum dot having the chemical formula of $CsPb(Br_{1-b}I_b)_3$ with $0 \le b < 0.5$, and the blue (all-inorganic perovskite) quantum dot having the chemical formula of $CsPb(Cl_aBr_{1-a})_3$ with $0 < a \le 1$. Optionally, the first all-inorganic perovskite quantum dot and the second all-inorganic perovskite quantum dot may be selected from the group consisting of the red all-inorganic perovskite quantum dot having the particle diameter in a range of about 10 nm to 14 nm, the green all-inorganic perovskite quantum dot having the particle diameter in a range of about 8 nm to 12 nm, and the blue all-inorganic perovskite quantum dot having the particle diameter in a range of about 7 nm to 10 nm.

The wavelength-converting material (or the wavelength converting layer) may further comprise other kinds of phosphor material, comprising an inorganic phosphor material and/or an organic phosphor material used together with the all-inorganic perovskite quantum dot. Herein, the inorganic phosphor material/the organic phosphor material may comprise a phosphor material of a quantum dot structure and/or non-quantum dot structure distinct from the all-inorganic perovskite quantum dot of $CsPb(Cl_aBr_{1-a-b}I_b)_3$.

For example, the inorganic phosphor material may comprise an aluminate phosphor powder (such as LuYAG, GaYAG, YAG, etc.), a silicate phosphor powder, a sulfide phosphor powder, a nitride phosphor powder, a fluoride phosphor powder, etc. The organic phosphor material may comprise a single molecule structure, a polymolecule structure, an oligomer, or a polymer. A compound of the organic phosphor material may comprise a group of perylene, a group of benzimidazole, a group of naphthalene, a group of anthracene, a group of phenanthrene, a group of fluorene, a group of 9-fluorenone, a group of carbazole, a group of glutarimide, a group of 1, 3-diphenylbenzene, a group of benzopyrene, a group of pyrene, a group of pyridine, a group of thiophene, a group of 2, 3-dihydro-1H-benzo[de]isoquinoline-1, 3-dione, a group of benzimidazole, or a combination thereof. For example, a yellow phosphor material such as YAG:Ce, and/or an inorganic yellow phosphor powder comprising a component of a oxynitride, a silicate or a nitride, and/or an organic yellow phosphor powder. For example, the red phosphor powder may comprise the fluoride comprising $A_2[MF_6]:Mn^{4+}$, wherein A is selected from the group consisting of Li, Na, K, Rb, Cs, $NH_4$, and a combination thereof, M is selected from the group consisting of Ge, Si, Sn, Ti, Zr and a combination thereof. Optionally, the red phosphor powder may comprise (Sr, Ca)S:Eu, $(Ca, Sr)_2Si_5N_8:Eu$, $CaAlSiN_3:Eu$, $(Sr, Ba)_3SiO_5:Eu$.

In an embodiment, for example, the light emitting device uses the blue light emitting diode chip, and the wavelength-converting material uses a mixture of the quantum dot composite material having the green quantum dot having the chemical formula $CsPb(Br_{1-b}I_b)_3$ with $0 \le b < 0.5$ (such as $CsPbBr_3$) and/or the particle diameter in a range of about 8 nm to 12 nm, and a red phosphor powder $K_2SiF_6:Mn^{4+}$.

The quantum dot composite material may be used in various applications of light emitting devices, such as a lighting lamp or a light emitting module (front light module, back light module) of a display for a display screen of a smart phone, a television screen, etc., a pixel or a sub pixel for a display panel. In addition, when more kinds of the all-inorganic perovskite quantum dots with different compositions (i.e. more different emission wavelengths) are used, the light emitting device can achieve a wider emission spectrum, even achieve a full spectrum for demands. Therefore, using the quantum dot composite material comprising the all-inorganic perovskite quantum dot according to the present disclosure in the display device can improve a color gamut, a color purity, a color trueness, NTSC, etc.

For example, the light emitting device may be applied in a light emitting diode package structure. In an example for a white light emitting diode package structure, the wavelength-converting material may comprise the green all-inorganic perovskite quantum dot and the red all-inorganic perovskite quantum dot, which are excited by a blue light emitting diode; or the wavelength-converting material may comprise the red all-inorganic perovskite quantum dot and a yellow phosphor powder, which are excited by the blue light emitting diode; or the wavelength-converting material may comprise the green all-inorganic perovskite quantum dot and a red phosphor powder, which are excited by the blue light emitting diode; or the wavelength-converting material comprise the red all-inorganic perovskite quantum dot, the green all-inorganic perovskite quantum dot and the blue all-inorganic perovskite quantum dot, which are excited by a UV light emitting diode.

Figure 5:
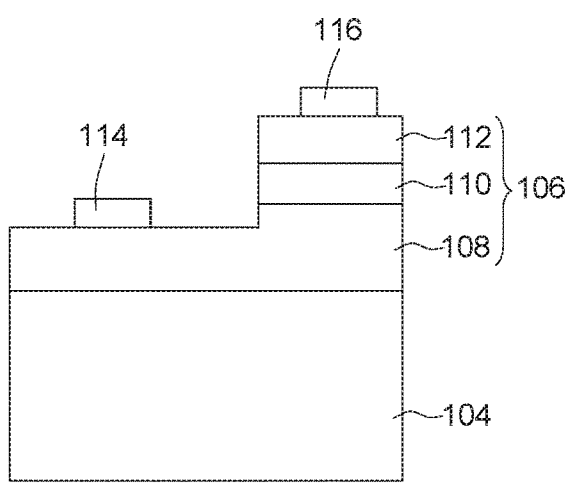
FIG. 5 illustrates a light emitting diode chip according to an embodiment.

FIG. 5 illustrates a light emitting diode chip 102 according to an embodiment. The light emitting diode chip 102 comprises a substrate 104, an epitaxial structure 106, a first electrode 114 and a second electrode 116. The epitaxial structure 106 comprises a first type semiconductor layer 108, an active layer 110 and a second type semiconductor layer 112 stacked from the substrate 104 in order. The first electrode 114 and the second electrode 116 are connected to the first type semiconductor layer 108 and the second type semiconductor layer 112 respectively. The substrate 104 may comprise an insulating material (such as a sapphire material) or a semiconductor material. The first type semiconductor layer 108 and the second type semiconductor layer 112 have opposing conductivity types. For example, the first type semiconductor layer 108 has an N-type semiconductor layer, while the second type semiconductor layer 112 has a P-type semiconductor layer, wherein the first electrode 114 is an N electrode, and the second electrode 116 is a P electrode. For example, the first type semiconductor layer 108 has a P-type semiconductor layer, while the second type semiconductor layer 112 has an N-type semiconductor layer, wherein the first electrode 114 is a P electrode, and the second electrode 116 is an N electrode. The light emitting diode chip 102 may be disposed in a face-up manner or a flip-chip manner. In an example relating to the flip-chip manner, the light emitting diode chip 102 is placed upside down so that the first electrode 114 and the second electrode 116 face a base plate such as a circuit board and are bonded to contact pads through solders.

Figure 6:
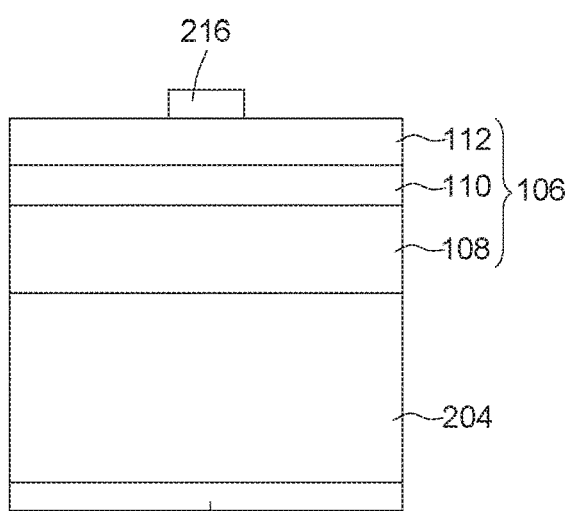
FIG. 6 illustrates a light emitting diode chip according to an embodiment.

FIG. 6 illustrates a light emitting diode chip 202 according to another embodiment. The light emitting diode chip 202 is a vertical light emitting diode chip. The light emitting diode chip 202 comprises a substrate 204 and the epitaxial structure 106. The epitaxial structure 106 comprises the first type semiconductor layer 108, the active layer 110 and the second type semiconductor layer 112 stacked from the substrate 204 in order. A first electrode 214 and a second electrode 216 are connected to the substrate 204 and the second type semiconductor layer 112 respectively. The material of substrate 204 comprises a metal, an alloy, a conductive, a semiconductor, or a combination thereof. The substrate 204 may comprise a semiconductor material having a conductivity type same with a conductivity type of the first type semiconductor layer 108; or a conductive material capable of forming an Ohmi contact to the first type semiconductor layer 108, such as a metal, etc. For example, the first type semiconductor layer 108 has an N-type semiconductor layer, while the second type semiconductor layer 112 has a P-type semiconductor layer, wherein the first electrode 214 is an N electrode, and the second electrode 216 is a P electrode. For example, the first type semiconductor layer 108 has a P-type semiconductor layer, while the second type semiconductor layer 112 has an N-type semiconductor layer, wherein the first electrode 214 is a P electrode, and the second electrode 216 is an N electrode.

In an embodiment, the P-type semiconductor layer may be a P-type GaN material, and the N-type semiconductor layer may be an N-type GaN material. In an embodiment, the P-type semiconductor layer may be a P-type AlGaN material, and the N-type semiconductor layer may be an N-type AlGaN material. The active layer 110 has a multiple quantum well structure.

In an embodiment, the first light emitted from the light emitting diode chip 102, 202 has a wavelength of about 220 nm to 480 nm. In an embodiment, the light emitting diode chip 102, 202 may be the UV light emitting diode chip capable of emitting the first light having a wavelength of about 200 nm to 400 nm. In an embodiment, the light emitting diode chip 102, 202 may be the blue light emitting diode chip capable of emitting the first light having a wavelength of about 430 nm to 480 nm.

In embodiments, the wavelength-converting material of the light emitting device may be contained by the wavelength converting layer, and/or doped in a transparent material. In some embodiments, the wavelength-converting material may be coated on a light emitting side of the light emitting diode chip. Examples of the light emitting devices using the wavelength-converting material are disclosed as below.

Figure 7:
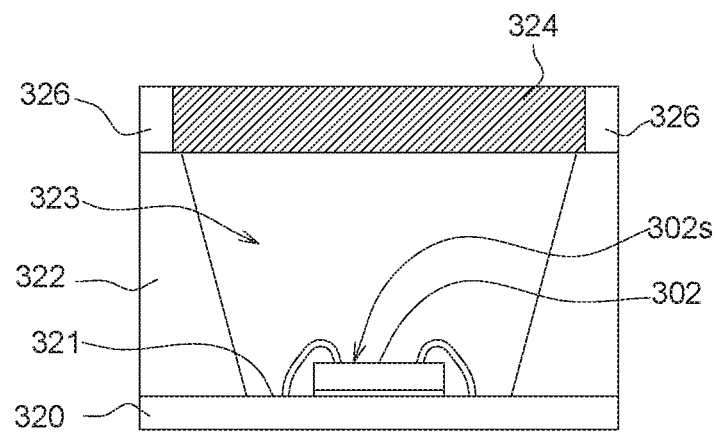
FIG. 7 illustrates a light emitting diode package structure according to an embodiment.

FIG. 7 illustrates a light emitting diode package structure 318 according to an embodiment. The light emitting diode package structure 318 comprises a light emitting diode chip 302, a base 320, a wavelength converting layer 324 and a reflective wall 326. The base 320 has a die bonding region 321 and a wall 322 surrounding the die bonding region 321 and defining a receiving space 323. The light emitting diode chip 302 is disposed in the receiving space 323, and may be attached on the die bonding region 321 of the base 320 through an adhesive. The wavelength converting layer 324 is on a light emitting side of the light emitting diode chip 302. In particular, the wavelength converting layer 324 is disposed over the receiving space 323 corresponding to a light emitting surface 302s of the light emitting diode chip 302, and disposed on a top surface of the wall 322. The reflective wall 326 may be disposed to surround an outer side wall of the wavelength converting layer 324 and on the top surface of the wall 322. The reflective wall 326 may comprise a material having a light-reflective characteristic and a low light leakage, such as a reflective glass, a quartz, a light-reflection attaching sheet, a polymer plastic material or other suitable materials. The polymer plastic material may comprise polymethyl methacrylate (PMMA), polyethylene terephthalate (PET), polystyrene (PS), polypropylene (PP), polyamide (PA), polycarbonate (PC), epoxy, silicone, etc., or a combination thereof. The light reflectivity of the reflective wall 326 may be adjusted by adding an additional filler particle. The filler particle may be a composite material formed by materials having different particle diameters or different materials. For example, the material for the filler particle may comprise $TiO_2$, $SiO_2$, $Al_2O_3$, BN, ZnO, etc. This concept may be applied for other embodiments, and will not be explained again. In the embodiment, the light emitting diode chip 302 is spaced apart from the wavelength converting layer 324 by an air gap in the receiving space 323 defined by the wall 322. For example, no substance of liquid or solid state is filled into the receiving space 323 to contact the light emitting diode chip 302.

In embodiments, the wavelength converting layer 324 comprises one kind of the wavelength-converting material or more kinds of the wavelength-converting materials. Therefore, an emission property of the light emitting diode package structure 318 may be adjusted through the wavelength converting layer 324. In some embodiments, the wavelength converting layer 324 may comprise the transparent material with the wavelength-converting material doped therein. For example, the wavelength converting layer 324 comprise at least one kind of the all-inorganic perovskite quantum dot $CsPb(Cl_aBr_{1-a-b}I_b)_3$ doped in the transparent material. In embodiments, the transparent material comprises a transparent gel. The transparent gel may comprise a material comprising polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, silicone, or a combination thereof, etc. In embodiments, the transparent material may comprise a glass material or a ceramic material. A glass thin film of quantum dot may be formed by a method comprising mixing the all-inorganic perovskite quantum dot and the glass material. Alternatively, a ceramic thin film of quantum dot may be formed by a method comprising mixing the all-inorganic perovskite quantum dot and the ceramic material.

In some embodiments, the wavelength converting layer 324 and the light emitting diode chip 302 are separated from each other (by the receiving space 323 in this example), preventing the wavelength converting layer 324 from being close to the light emitting diode chip 302. Therefore, the wavelength converting layer 324 can have desired heat stability and chemical stability that would be affected by the light emitting diode chip 302. In addition, lifespan of the wavelength converting layer 324 can be prolonged. Product reliability of a light emitting diode package structure can be increased. The similar concept will not be repeated hereafter.

In other transformable embodiments, the air gap of the receiving space 323 defined by the wall 322 may be filled with a transparent encapsulating compound (not shown). The transparent encapsulating compound may comprise polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), an epoxy, silicone, etc., or a combination thereof, or other suitable materials. In some embodiments, the transparent encapsulating compound may be doped with one or more kinds of the wavelength-converting materials. In other transformable embodiments, one or more kinds of the wavelength-converting materials may be coated on a light emitting surface of the light emitting diode chip 302. Therefore, in addition to the wavelength converting layer 324, an emission characteristic of a light emitting diode package structure may also be adjusted by the (transparent) encapsulating compound with the wavelength-converting material doped in the (transparent) encapsulating compound and/or be adjusted by a coating layer comprising the wavelength-converting material on the light emitting surface of the light emitting diode chip 302. Kinds of the wavelength-converting materials of the wavelength converting layer 324, and/or the encapsulating compound and/or the coating layer may be adjusted properly according actual demands for products. The similar concept can be applied to other embodiments and will not be repeated hereafter.

Figure 8:
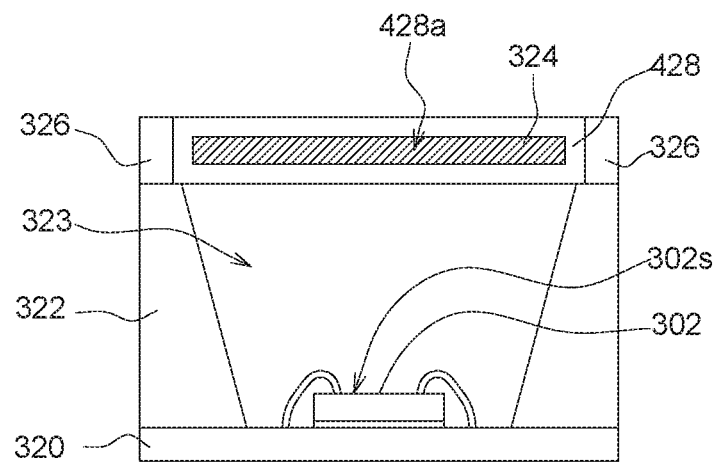
FIG. 8 illustrates a light emitting diode package structure according to an embodiment.

FIG. 8 illustrates a light emitting diode package structure 418 according to an embodiment. Differences between the light emitting diode package structure 418 and the light emitting diode package structure 318 shown in FIG. 7 are disclosed as below. The light emitting diode package structure 418 may further comprise a structural element 428 for supporting, packaging or protecting the wavelength converting layer 324. As shown in the figure, the structural element 428 has a receiving region 428a for receiving the wavelength converting layer 324 therein and covering upper, lower surfaces of the wavelength converting layer 324. The structural element 428 is disposed the top surface of the wall 322 so as to support the wavelength converting layer 324 to be above the receiving space 323 corresponding to the light emitting surface 302s of the light emitting diode chip 302. The structural element 428 may be formed by a transparent material or a light transmissive material, to avoid blocking light emitting from the wavelength converting layer 324. The structural element 428 may have a characteristic as an encapsulating material. For example, the structural element 428 may comprise a quartz, a glass, a polymer plastic material, etc. Otherwise, the structural element 428 may be used for protecting the wavelength converting layer 324 from a foreign substance that would disadvantageously affect a property of the wavelength converting layer 324, such as moisture, oxygen gas, etc. In embodiments, the structural element 428 may a barrier film and/or a silicon titanium oxide disposed on a surface of the wavelength converting layer 324 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting layer 324 by a coating method or a sticking method as a film. The barrier film may comprise an inorganic material, such as a metal/metalloid oxide (such as $SiO_2$, $Al_2O_3$, etc.) or a metal/metalloid nitride (such as $Si_3N_3$, etc.). The barrier film may be a multi-layer barrier film disposed on the surface of the wavelength converting layer 324 by a coating method or a sticking method as a film. The similar concept can be applied to other embodiments and will not be repeated hereafter. The reflective wall 326 may be disposed to surround an outer side wall of the structural element 428 and on the top surface of the wall 322.

Figure 9:
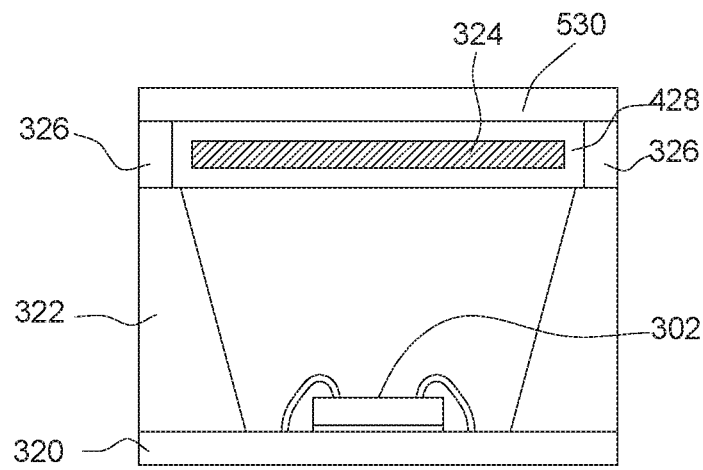
FIG. 9 illustrates a light emitting diode package structure according to an embodiment.

FIG. 9 illustrates a light emitting diode package structure 518 according to an embodiment. Differences between the light emitting diode package structure 518 and the light emitting diode package structure 418 shown in FIG. 8 are disclosed as below. The light emitting diode package structure 518 further comprises an optical layer 530 disposed on the reflective wall 326 and the structural element 428. The optical layer 530 may be used for adjusting a path of an emitting light. For example, the optical layer 530 may be a transparent gel with diffusion particles therein. The transparent gel comprise one or more of polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), an epoxy, silicone, etc., and a combination thereof, etc. The diffusion particles may comprise $TiO_2$, $SiO_2$, $Al_2O_3$, BN, ZnO, etc. The diffusion particles may have uniform or various diameters. The similar concept can be applied to other embodiments and will not be repeated hereafter. For example, the optical layer 530 may be disposed on the wavelength converting layer 324 for adjusting a path of an emitting light for an application of the light emitting diode package structure 318 in FIG. 7, the light emitting diode package structure 618 in FIG. 10, the light emitting diode package structure 1018 in FIG. 14, or other structures, etc.

Figure 10:
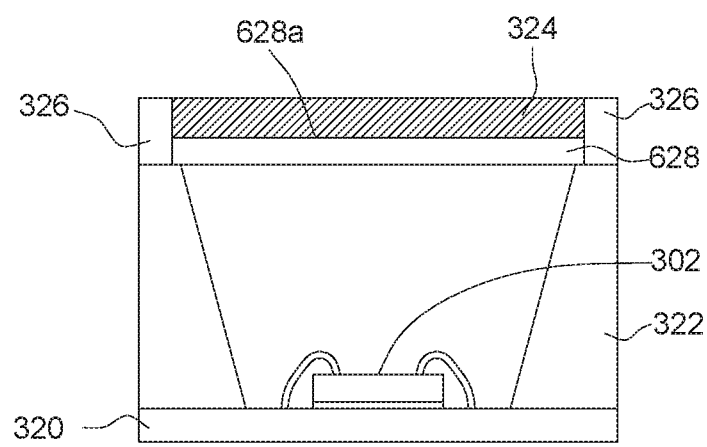
FIG. 10 illustrates a light emitting diode package structure according to an embodiment.

FIG. 10 illustrates a light emitting diode package structure 618 according to an embodiment. Differences between the light emitting diode package structure 618 and the light emitting diode package structure 318 shown in FIG. 7 are disclosed as below. The light emitting diode package structure 618 further comprises a structural element 628 having a receiving region 628a for receiving and supporting the wavelength converting layer 324 across the light emitting diode chip 302 and disposed on the wall 322. The structural element 628 on the lower surface of the wavelength converting layer 324 may be formed by a transparent material or a light transmissive material, to avoid blocking light emitting from the wavelength converting layer 324. For example, the structural element 628 may comprise a quartz, a glass, a polymer plastic material, or other suitable materials. The similar concept can be applied to other embodiments and will not be repeated hereafter.

Figure 11:
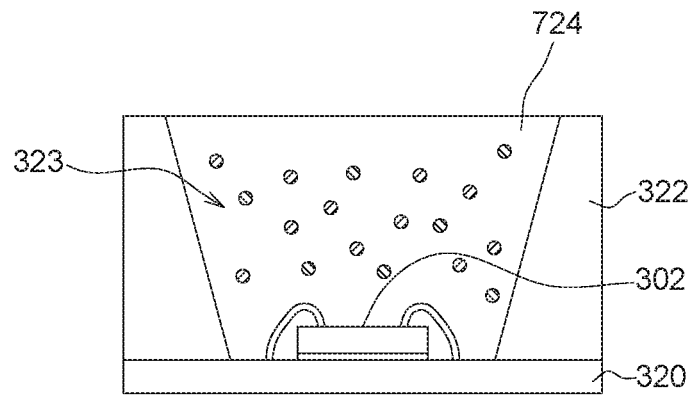
FIG. 11 illustrates a light emitting diode package structure according to an embodiment.

FIG. 11 illustrates a light emitting diode package structure 718 according to an embodiment. Differences between the light emitting diode package structure 718 and the light emitting diode package structure 318 shown in FIG. 7 are disclosed as below. The light emitting diode package structure 718 omits the wavelength converting layer 324 and the reflective wall 326 in FIG. 7. In addition, the light emitting diode package structure 718 comprises a wavelength converting layer 724 filling in the receiving space 323. The wavelength converting layer 724 may comprise a transparent gel and the wavelength-converting material. The transparent gel may be used as an encapsulating compound, and the wavelength-converting material may be doped in the transparent gel. The wavelength converting layer 724 may cover on the light emitting diode chip 302, or may further cover on the base 320. The transparent gel of the wavelength converting layer 724 may comprise one or more of polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), an epoxy, silicone, etc., and a combination thereof, etc.

Figure 12:
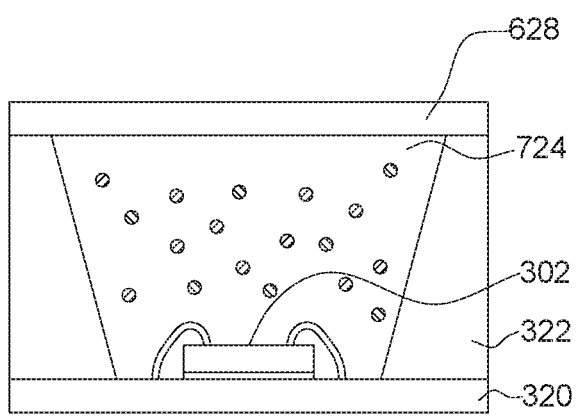
FIG. 12 illustrates a light emitting diode package structure according to an embodiment.

FIG. 12 illustrates a light emitting diode package structure 818 according to an embodiment. Differences between the light emitting diode package structure 818 and the light emitting diode package structure 718 shown in FIG. 11 are disclosed as below. The light emitting diode package structure 818 further comprises the structural element 628 across the wavelength converting layer 724 to be disposed on the wall 322. The structural element 628 may be used for protecting the wavelength-converting material of the wavelength converting layer 724 from a foreign substance that would cause a damage effect, such as moisture, oxygen gas, etc. In embodiments, the structural element 628 may a barrier film and/or a silicon titanium oxide disposed on a surface of the wavelength converting layer 724 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting layer 724 by a coating method or a sticking method as a film. The barrier film may comprise an inorganic material, such as a metal/metalloid oxide (such as $SiO_2$, $Al_2O_3$, etc.) or a metal nitride (such as $Si_3N_3$, etc.). The barrier film may be a multi-layer barrier film disposed on the surface of the wavelength converting layer 724 by a coating method or a sticking method as a film.

Figure 13:
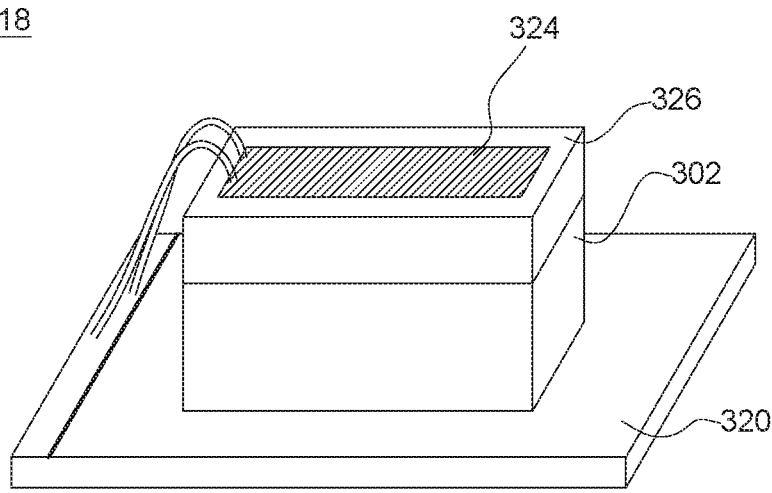
FIG. 13 illustrates a light emitting diode package structure according to an embodiment.

FIG. 13 illustrates a light emitting diode package structure 918 according to an embodiment. The light emitting diode package structure 918 comprises the base 320, the light emitting diode chip 302, the wavelength converting layer 324 and the reflective wall 326. The light emitting diode chip 302 is disposed on the die bonding region of the base 320. The wavelength converting layer 324 is disposed on the light emitting surface of the light emitting diode chip 302. The reflective wall 326 is disposed on a side wall of the wavelength converting layer 324. The light emitting diode chip 302 may be electrically connected to the base 320 by a wire bonding passing through an opening (not shown) of the wavelength converting layer 324.

Figure 14:
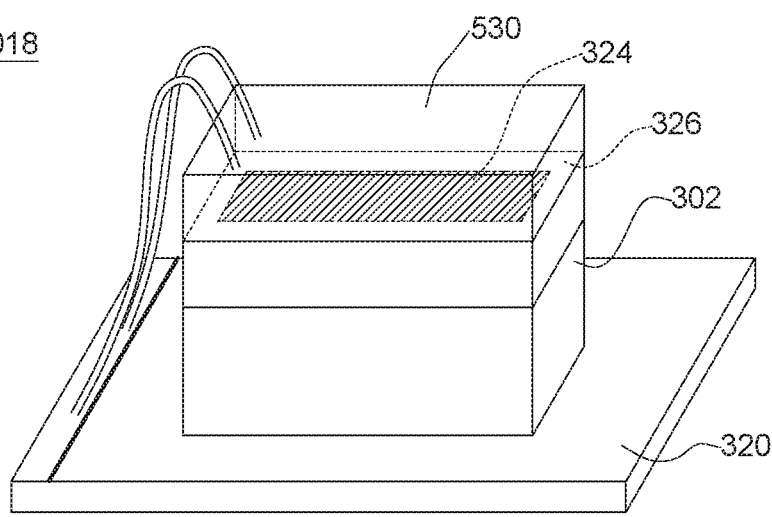
FIG. 14 illustrates a light emitting diode package structure according to an embodiment.

FIG. 14 illustrates a light emitting diode package structure 1018 according to an embodiment. Differences between the light emitting diode package structure 1018 and the light emitting diode package structure 918 shown in FIG. 13 are disclosed as below. The light emitting diode package structure 1018 further comprises the optical layer 530 disposed on the wavelength converting layer 324 and the reflective wall 326. The light emitting diode chip 302 may be electrically connected to the base 320 by a wire bonding passing through an opening (not shown) of the wavelength converting layer 324 and the optical layer 530. The wire bonding may be pulled out through an upper surface or a side surface of the optical layer 530.

Figure 15:
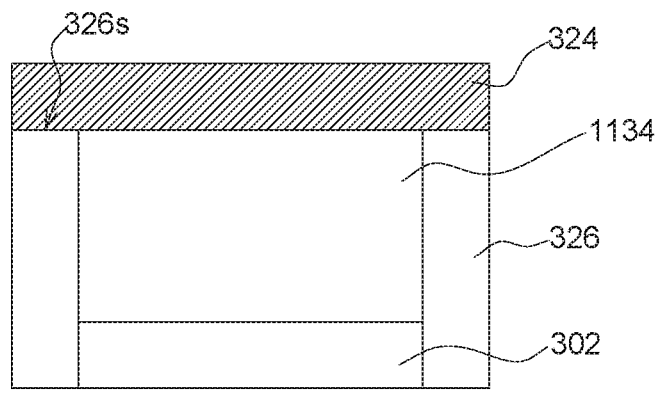
FIG. 15 illustrates a light emitting diode package structure according to an embodiment.

FIG. 15 illustrates a light emitting diode package structure 1118 according to an embodiment. The light emitting diode package structure 1118 comprises the light emitting diode chip 302, the wavelength converting layer 324 and the reflective wall 326. The reflective wall 326 surrounds the side wall of the light emitting diode chip 302 and defines a spaced vacancy 1134. The reflective wall 326 is higher than the light emitting diode chip 302. The wavelength converting layer 324 is disposed on a top surface 326s of the reflective wall 326. The wavelength converting layer 324 and the light emitting diode chip 302 are separated from each other by the spaced vacancy 1134 with a gap distance, preventing the wavelength converting layer 324 from being close to the light emitting diode chip 302. Therefore, the wavelength converting layer 324 can have desired heat stability and chemical stability that would be affected by the light emitting diode chip 302. In addition, lifespan of the wavelength converting layer 324 can be prolonged. Product reliability of a light emitting diode package structure can be increased. The similar concept will not be repeated hereafter.

Figure 16:
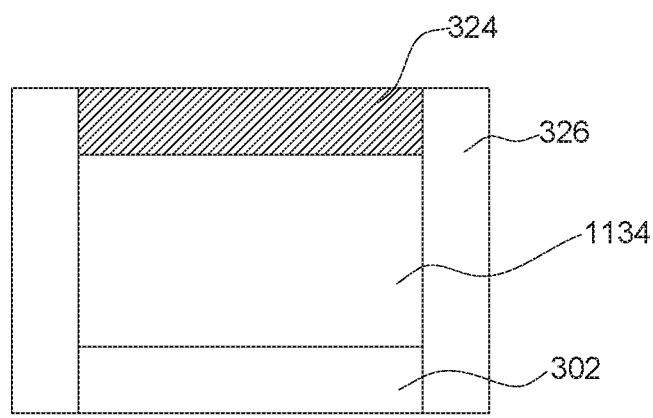
FIG. 16 illustrates a light emitting diode package structure according to an embodiment.

FIG. 16 illustrates a light emitting diode package structure 1218 according to an embodiment. The light emitting diode package structure 1218 is different from the light emitting diode package structure 1118 shown in FIG. 15 in that the wavelength converting layer 324 is disposed on an inner side wall of the reflective wall 326.

Figure 17:
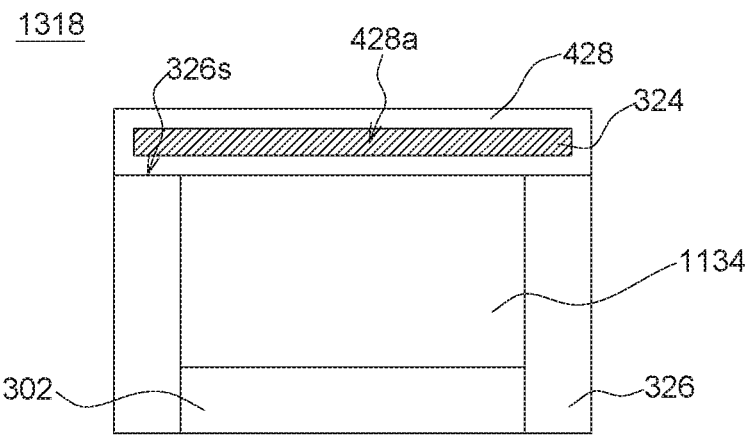
FIG. 17 illustrates a light emitting diode package structure according to an embodiment.

FIG. 17 illustrates a light emitting diode package structure 1318 according to an embodiment. Differences between the light emitting diode package structure 1318 and the light emitting diode package structure 1118 shown in FIG. 15 are disclosed as below. The light emitting diode package structure 1318 further comprises the structural element 428 with the wavelength converting layer 324 disposed in the receiving region 428a defined by the structural element 428, for supporting, packaging or protecting the wavelength converting layer 324. The structural element 428 covering the wavelength converting layer 324 is disposed on the top surface 326s of the reflective wall 326 to space apart from the light emitting diode chip 302 with the spaced vacancy 1134. The structural element 428 may be formed by a transparent material or a light transmissive material, to avoid blocking light emitting from the wavelength converting layer 324. The structural element 428 may have a characteristic as an encapsulating material. For example, the structural element 428 may comprise a quartz, a glass, a polymer plastic material, etc. Otherwise, the structural element 428 may be used for protecting the wavelength converting layer 324 from a foreign substance that would disadvantageously affect a property of the wavelength converting layer 324, such as moisture, oxygen gas, etc. In embodiments, the structural element 428 may a barrier film and/or a silicon titanium oxide disposed on the surface of the wavelength converting layer 324 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting layer 324 by a coating method or a sticking method as a film. The barrier film may comprise an inorganic material, such as a metal/metalloid oxide (such as $SiO_2$, $Al_2O_3$, etc.) or a metal nitride (such as $Si_3N_4$, etc.). The barrier film may be a multi-layer barrier film disposed on the surface of the wavelength converting layer 324 by a coating method or a sticking method as a film.

In an embodiment, the spaced vacancy 1134 may be an empty space not filled with a substance of liquid or solid state. The spaced vacancy 1134 may be formed by a transparent material or a light transmissive material, to avoid blocking light emitting from the wavelength converting layer 324. For example, the spaced vacancy 1134 may comprise a quartz, a glass, a polymer plastic material, or other suitable materials.

In embodiments, the light emitting diode package structure 318, 418, 518, 618, 718, 818, 918, 1018, 1118, 1218 or 1318 is for emitting a white light. In an example, the light emitting diode chip 302 may be a blue light emitting diode chip. The wavelength converting layer 324/the wavelength converting layer 724 may comprise the yellow phosphor powder YAG:Ce and the red all-inorganic perovskite quantum dot $CsPb(Br_{1-b}I_b)_3$. The red all-inorganic perovskite quantum dot complies with $0.5 \leq b \leq 1$; and/or has the particle diameter in a range of about 10 nm to 14 nm. The red all-inorganic perovskite quantum dot $CsPb(Br_{1-b}I_b)_3$ may have the modification protection formed thereon. In other words, the wavelength converting layer 324/the wavelength converting layer 724 comprises a red quantum dot composite material.

In embodiments, the light emitting diode package structure 318, 418, 518, 618, 718, 818, 918, 1018, 1118, 1218 or 1318 is for emitting a white light. In an example, the light emitting diode chip 302 may be a blue light emitting diode chip. The wavelength converting layer 324/the wavelength converting layer 724 may comprise the green all-inorganic perovskite quantum dot $CsPb(Br_{1-b}I_b)_3$ and the red all-inorganic perovskite quantum dot $CsPb(Br_{1-b}I_b)_3$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot $CsPb(Br_{1-b}I_b)_3$ and the red all-inorganic perovskite quantum dot $CsPb(Br_{1-b}I_b)_3$.

In embodiments, the light emitting diode package structure 318, 418, 518, 618, 718, 818, 918, 1018, 1118, 1218 or 1318 is for emitting a white light. In an example, the light emitting diode chip 302 may be a UV light emitting diode chip. The wavelength converting layer 324/the wavelength converting layer 724 may comprise the blue all-inorganic perovskite quantum dot $CsPb(Cl_aBr_{1-a})_3$, the green all-inorganic perovskite quantum dot $CsPb(Br_{1-b}I_b)_3$, the red all-inorganic perovskite quantum dot $CsPb(Br_{1-b}I_b)_3$. Additionally/optionally, the blue all-inorganic perovskite quantum dot complies with $0 < a \leq 1$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the blue all-inorganic perovskite quantum dot has the particle diameter in a range of about 7 nm to 10 nm. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$.

Figure 18:
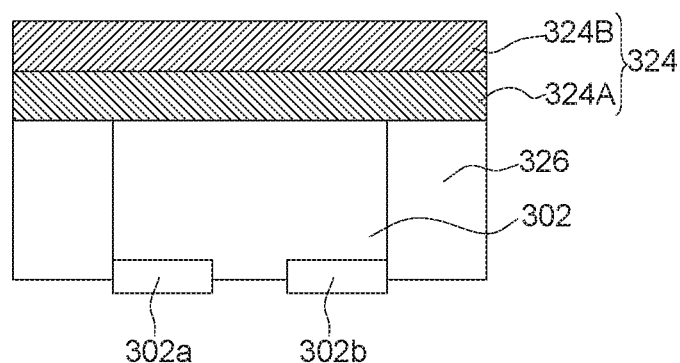
FIG. 18 illustrates a light emitting diode package structure according to an embodiment.

FIG. 18 illustrates a light emitting diode package structure 1418 according to an embodiment. The light emitting diode package structure 1418 comprises the light emitting diode chip 302, the reflective wall 326 and the wavelength converting layer 324. The reflective wall 326 is disposed on the side surface of the light emitting diode chip 302. The wavelength converting layer 324 is disposed on the upper surface (light emitting surface) of the light emitting diode chip 302. The wavelength converting layer 324 may comprise a first wavelength converting layer 324A and a second wavelength converting layer 324B having different characteristics from each other. In an embodiment, for example, the first wavelength converting layer 324A comprises the red all-inorganic perovskite quantum dot $CsPb(Br_{1-b}I_b)_3$, for emitting a light having a wave peak at a wavelength position of about 570 nm to 700 nm. The second wavelength converting layer 324B comprises the green all-inorganic perovskite quantum dot $CsPb(Br_{1-b}I_b)_3$, for emitting a light having a wave peak at a wavelength position of about 500 nm to 570 nm. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. However, the present disclosure is not limited thereto. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot $CsPb(Br_{1-b}I_b)_3$ and the red all-inorganic perovskite quantum dot $CsPb(Br_{1-b}I_b)_3$. The light emitting diode chip 302 may be electrically connected to a base or a circuit board (not shown) with a first electrode 302a and a second electrode 302b by a flip chip method.

Figure 19:
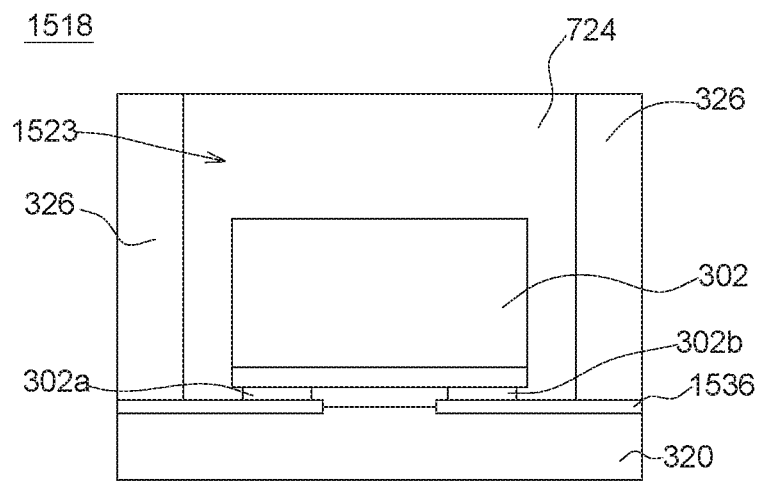
FIG. 19 illustrates a light emitting diode package structure according to an embodiment.

FIG. 19 illustrates a light emitting diode package structure 1518 according to an embodiment. The light emitting diode package structure 1518 comprises the base 320, the light emitting diode chip 302, the wavelength converting layer 724 and the reflective wall 326. The reflective wall 326 is disposed on the base 320 and defines a receiving space 1523. The light emitting diode chip 302 is disposed in the receiving space 1523, and electrically connected to a conductive element 1536 on the base 320 with a flip chip method. The wavelength converting layer 724 is filled in the receiving space 1523, and contact with the light emitting diode chip 302.

Figure 20:
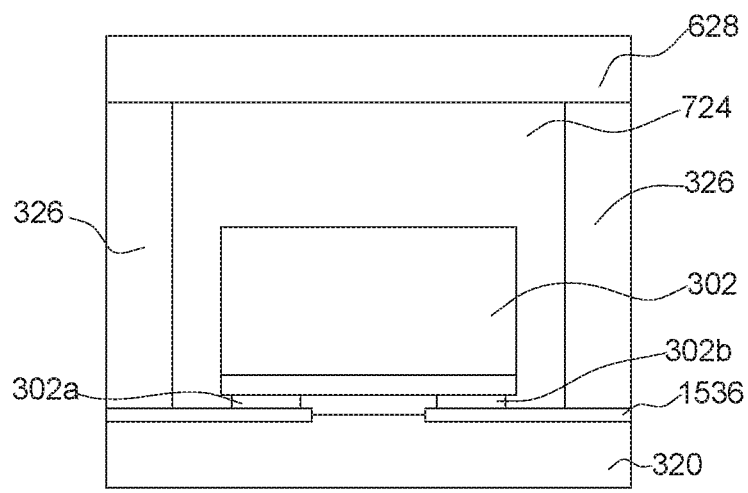
FIG. 20 illustrates a light emitting diode package structure according to an embodiment.

FIG. 20 illustrates a light emitting diode package structure 1618 according to an embodiment. Differences between the light emitting diode package structure 1618 and the light emitting diode package structure 1518 shown in FIG. 19 are disclosed as below. The light emitting diode package structure 1618 further comprises the structural element 628 disposed on the wavelength converting layer 724 and the reflective wall 326, for packaging or protecting the wavelength converting layer 724 from a foreign substance that would cause a damage effect, such as moisture, oxygen gas, etc. In embodiments, the structural element 628 may a barrier film and/or a silicon titanium oxide disposed on the surface of the wavelength converting layer 724 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting layer 724 and a surface of the reflective wall 326 by a coating method or a sticking method as a film. The barrier film may comprise an inorganic material, such as a metal metalloid oxide (such as $SiO_2$, $Al_2O_3$, etc.) or a metal/metalloid nitride (such as $Si_3N_3$, etc.). The barrier film may be a multi-layer barrier film disposed on the surface of the wavelength converting layer 724 by a coating method or a sticking method as a film.

In embodiments, the light emitting diode package structure 1518 or 1618 is for emitting a white light. In this example, the light emitting diode chip 302 may be a blue light emitting diode chip. The wavelength converting layer 724 may comprise the red all-inorganic perovskite quantum dot $CsPb(Br_{1-b}I_b)_3$ and the yellow phosphor powder YAG:Ce. The red all-inorganic perovskite quantum dot complies with $0.5 \leq b \leq 1$; and/or has the particle diameter in a range of about 10 nm to 14 nm. In embodiments, the red all-inorganic perovskite quantum dot $CsPb(Br_{1-b}I_b)_3$ is comprised by the quantum dot composite material. In other words, the modification protection is formed on the surface of the red all-inorganic perovskite quantum dot $CsPb(Br_{1-b}I_b)_3$.

In embodiments, the light emitting diode package structure 1518 or 1618 is for emitting a white light. In this example, the light emitting diode chip 302 may be a blue light emitting diode chip. The wavelength converting layer 724 may comprise the green all-inorganic perovskite quantum dot $CsPb(Br_{1-b}I_b)_3$ and the red all-inorganic perovskite quantum dot $CsPb(Br_{1-b}I_b)_3$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot $CsPb(Br_{1-b}I_b)_3$ and the red all-inorganic perovskite quantum dot $CsPb(Br_{1-b}I_b)_3$.

In embodiments, the light emitting diode package structure 1518 or 1618 is for emitting a white light. In this example, the light emitting diode chip 302 may be a UV light emitting diode chip. The wavelength converting layer 724 may comprise the blue all-inorganic perovskite quantum dot $CsPb(Cl_aBr_{1-a})_3$, the green all-inorganic perovskite quantum dot $CsPb(Br_{1-b}I_b)_3$, the red all-inorganic perovskite quantum dot $CsPb(Br_{1-b}I_b)_3$. Additionally/optionally, the blue all-inorganic perovskite quantum dot complies with $0 < a \leq 1$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the blue all-inorganic perovskite quantum dot has the particle diameter in a range of about 7 nm to 10 nm. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$.

Figure 21:
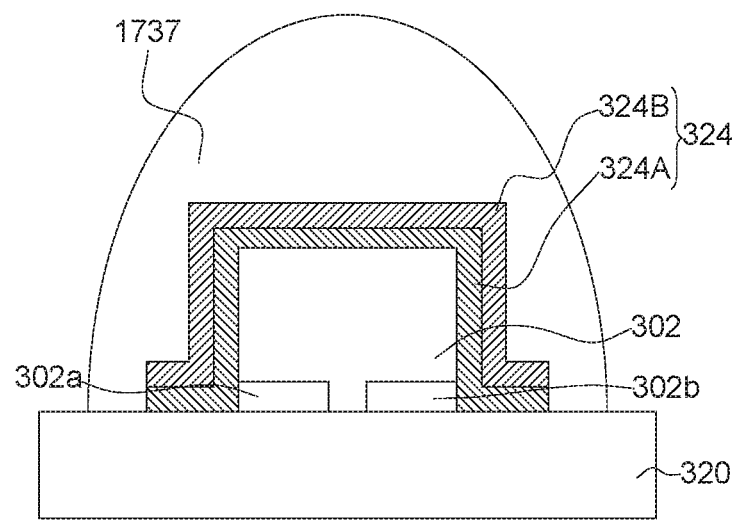
FIG. 21 illustrates a light emitting diode package structure according to an embodiment.

FIG. 21 illustrates a light emitting diode package structure 1718 according to an embodiment. The light emitting diode package structure 1718 comprises the base 320, the light emitting diode chip 302, the wavelength converting layer 324 and a transparent gel 1737. The light emitting diode chip 302 is electrically connected to the base 320 by a flip chip method. The wavelength converting layer 324 is disposed on the upper surface and the side surface of the light emitting diode chip 302, and may be extended onto the upper surface of the base 320. In an embodiment, for example, the first wavelength converting layer 324A comprises the red all-inorganic perovskite quantum dot $CsPb(Br_{1-b}I_b)_3$, for emitting a light having a wave peak at a wavelength position of about 570 nm to 700 nm. The second wavelength converting layer 324B comprises the green all-inorganic perovskite quantum dot $CsPb(Br_{1-b}I_b)_3$, for emitting a light having a wave peak at a wavelength position of about 500 nm to 570 nm. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. However, the present disclosure is not limited thereto. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot $CsPb(Br_{1-b}I_b)_3$ and the red all-inorganic perovskite quantum dot $CsPb(Br_{1-b}I_b)_3$. The transparent gel 1737 may be used as an encapsulating compound to cover the wavelength converting layer 324 and the base 320.

Figure 22:
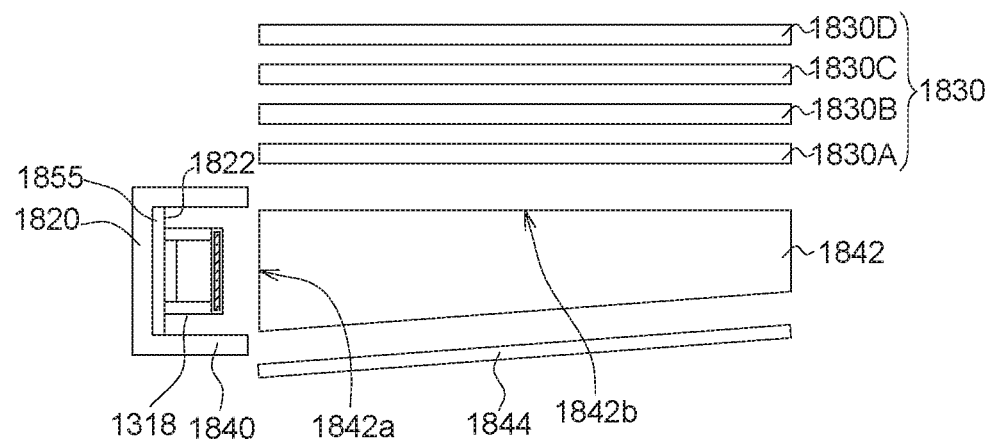
FIG. 22 illustrates a display module according to an embodiment.

FIG. 22 illustrates a side type back light module 1838 according to an embodiment. The side type back light module 1838 comprises a frame 1820, a light source 1822, a light guide plate 1842. The light source 1822 comprises a circuit board 1855 on the frame 1820, and a plurality of the light emitting diode package structures 1318 as illustrated with FIG. 17 on the circuit board 1855. The light emitting surface of the light emitting diode package structure 1318 faces toward a light incident surface 1842a of the light guide plate 1842. The frame 1820 comprises a reflective sheet 1840. The reflective sheet 1840 can help focusing a light emitted from the light emitting diode package structure 1318 toward the light guide plate 1842. The light emitted from a light emitting surface 1842b of the light guide plate 1842 goes upward an optical layer 1830 (or a display panel). For example, the optical layer 1830 may comprise an optical layer 1830A, an optical layer 1830B, an optical layer 1830C, and an optical layer 1830D. For example, the optical layer 1830A and the optical layer 1830D may be diffusion sheets. The optical layer 1830B and the optical layer 1830C may be brightness-enhancement sheets. A reflective sheet 1844 may be disposed under the light guide plate 1842 to direct a light upward to the optical layer 1830A, the optical layer 1830B, the optical layer 1830C, the optical layer 1830D (or a display panel, not shown). In embodiments, the side type back light module is not limited to using the light emitting diode package structure 1318 in FIG. 17. The light emitting diode package structure disclosed in other embodiments may be used.

Figure 23:
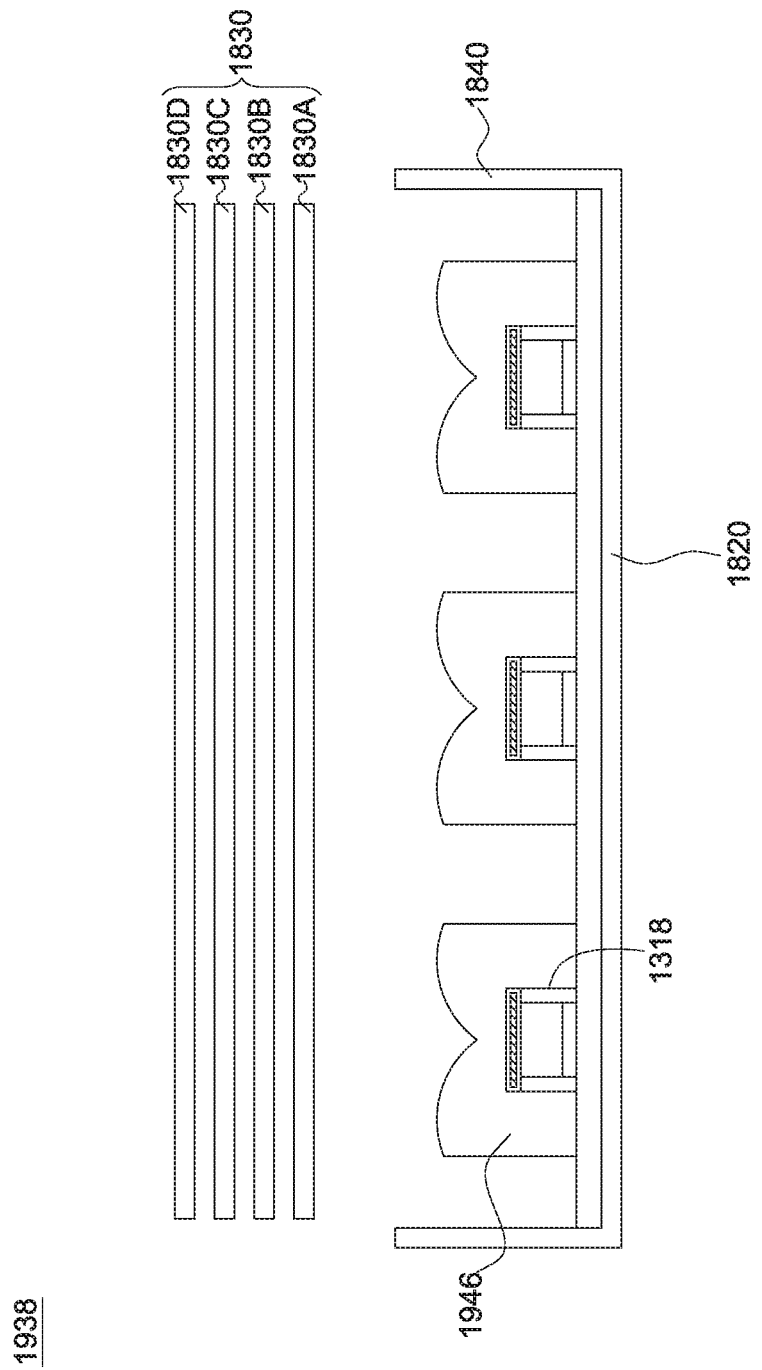
FIG. 23 illustrates a display module according to an embodiment.

FIG. 23 illustrates a direct type back light module 1938 according to an embodiment. The direct type back light module 1938 comprises a secondary optical element 1946 on the light emitting diode package structure 1318. The light emitting surface of the light emitting diode package structure 1318 faces toward the optical layer 1830. The reflective sheet 1840 can help focusing a light emitted from the light emitting diode package structure 1318 toward the optical layer 1830 (or a display panel). In embodiments, the direct type back light module is not limited to using the light emitting diode package structure 1318 shown in FIG. 17. The light emitting diode package structure disclosed in other embodiments may be used.

Figure 24:
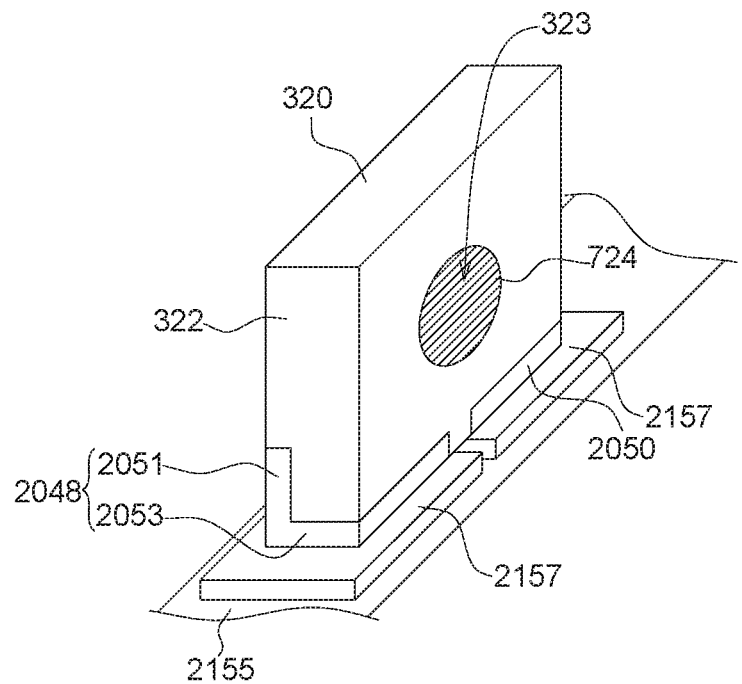
FIG. 24 illustrates a three dimensional view of a light emitting diode package structure according to an embodiment.
Figure 25:
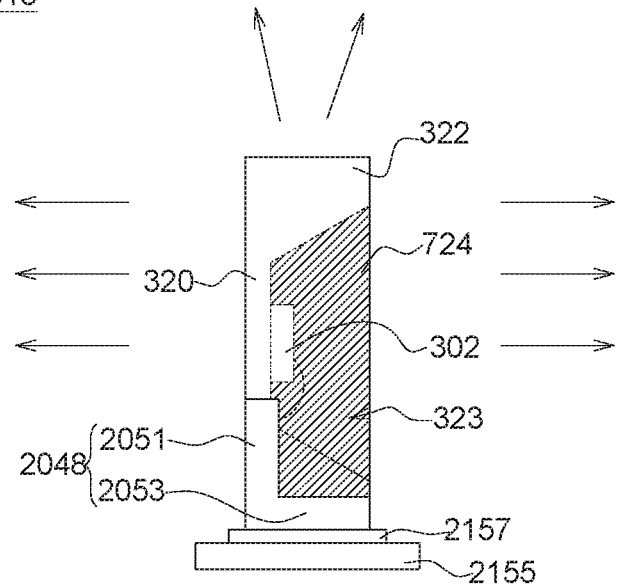
FIG. 25 illustrates a perspective view of a light emitting diode package structure according to an embodiment.

FIG. 24 and FIG. 25 illustrate a three dimensional view and a perspective view of a light emitting diode package structure 2018 according to an embodiment respectively. The light emitting diode package structure 2018 comprises a first electrode 2048 and a second electrode 2050 for electrically connecting to an external component, such as being connected to a connecting pad 2157 of a circuit board 2155. As shown in the figure, the first electrode 2048 and the second electrode 2050 have L shape. A standing portion 2051 of the first electrode 2048 and the second electrode 2050 is on a bottom of the base 320 and exposed by the base 320. A lateral portion 2053 connecting with the standing portion 2051 is embedded in the wall 322 and exposed by the wall 322. A positive electrode and a negative electrode of the light emitting diode chip 302 may be electrically connected to the standing portions 2051 of the first electrode 2048 and the second electrode 2050 through a wire bonding. The wavelength converting layer 724 is filled into the receiving space 323 defined by the base 320 and the wall 322.

Figure 26:
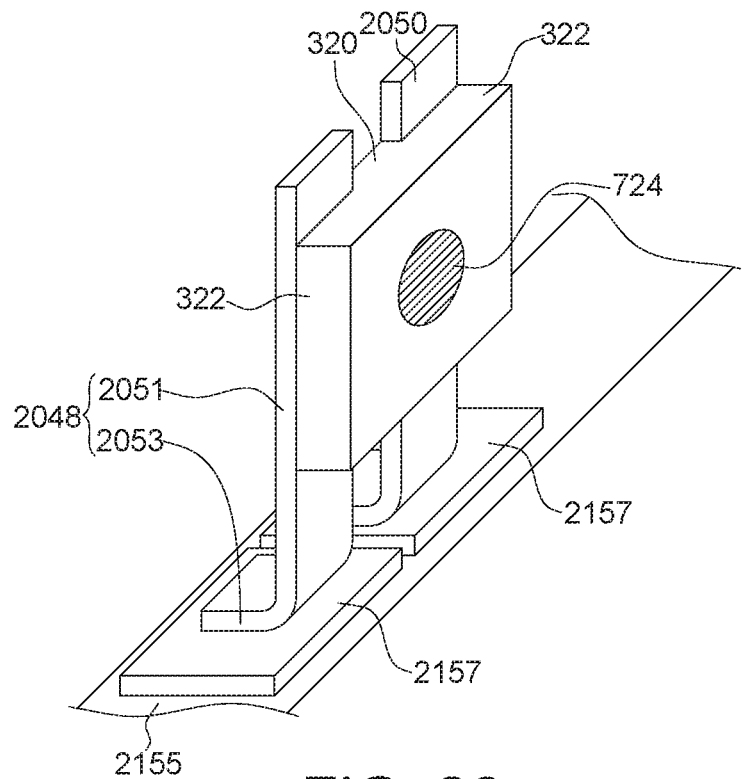
FIG. 26 illustrates a three dimensional view of a light emitting diode package structure according to an embodiment.

FIG. 26 illustrates a three dimensional view of a light emitting diode package structure 2218 according to an embodiment. The light emitting diode package structure 2218 is different from the light emitting diode package structure 2018 shown in FIG. 24, FIG. 25 in that the standing portion 2051 of the first electrode 2048 and the second electrode 2050 having L shape is extended beyond the base 320 and the wall 322. In addition, the lateral portion 2053 connecting with the standing portion 2051 is extended toward a direction back to the wall 322 and electrically connected to the connecting pad 2157 of the circuit board 2155.

In some embodiments, the base 320 and the wall 322 of the light emitting diode package structure 2018 shown in FIG. 24 and FIG. 25, the light emitting diode package structure 2218 of FIG. 26, is formed by the transparent material. Therefore, a light emitted from the light emitting diode chip 302 can goes out the light emitting diode package structure 2018, 2218 though a light emitting surface directly (without being blocked by an opaque material or reflected by a reflective material). For example, the light may be emitted along a direction perpendicular to the base 320 and out from a upper surface and a lower surface of the light emitting diode package structure 2018, 2218 with a wide angle (of larger than 180 degrees for example).

FIG. 27 to FIG. 30 illustrate a manufacturing method for a light emitting device according to an embodiment.

Figure 27:
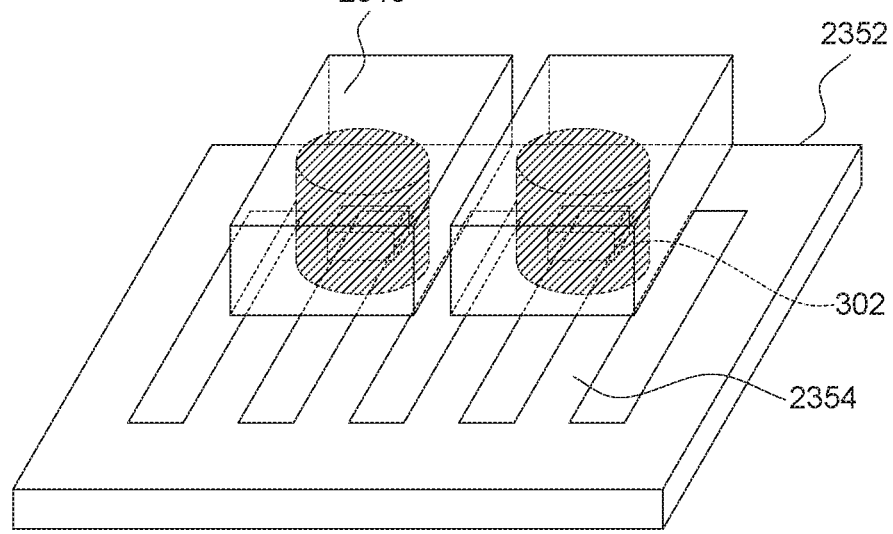
FIG. 27 to FIG. 30 illustrate a manufacturing method for a light emitting device according to an embodiment.
Figure 28:
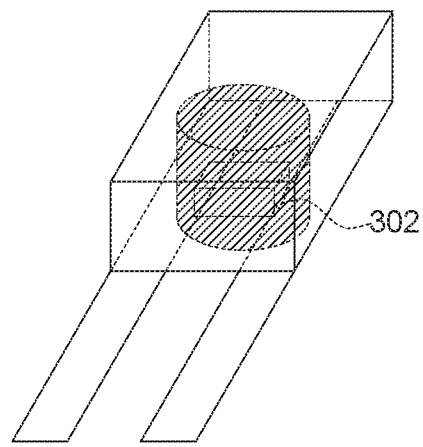

Referring to FIG. 27, a conductive plate 2352 is patterned to form conductive strips 2354 separated from each other. The conductive plate 2352 may be patterned by a method comprising an etching method. Next, a light emitting diode package structure 2318 is disposed on the conductive plate 2352, with a first electrode and a second electrode (not shown) of the light emitting diode package structure 2318 corresponding to the conductive strips 2354 thereby electrically connecting the light emitting diode package structure 2318 to the conductive plate 2352. In an embodiment, the first electrode and the second electrode may be connected to the different conductive strips 2354 spaced apart from each other by a reflow process. Then, the conductive plate 2352 is cut to form a plug-in light emitting unit 2456 as show in FIG. 28. In an embodiment, the cutting step may comprise a punch method.

Figure 29:
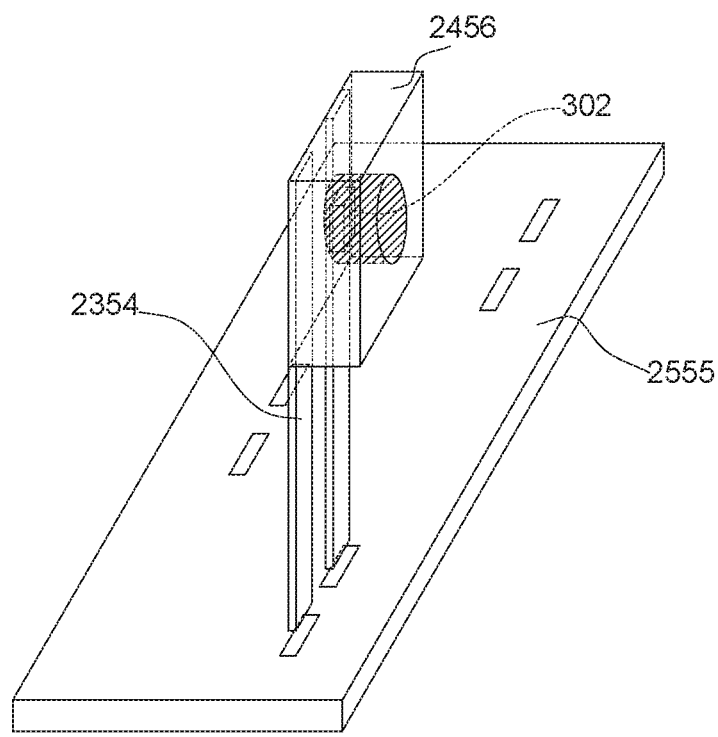

Referring to FIG. 29, then the plug-in light emitting unit 2456 is inserted on the circuit board 2555 to form a light emitting device 2538 having a light bar structure. The plug-in light emitting unit 2456 may be electrically connected to the circuit board 2555 through the conductive strips 2354 used as the first electrode and the second electrode. In an embodiment, the circuit board 2555 comprises a driving circuit for providing an electric power required by the plug-in light emitting unit 2456 to work.

Figure 30:
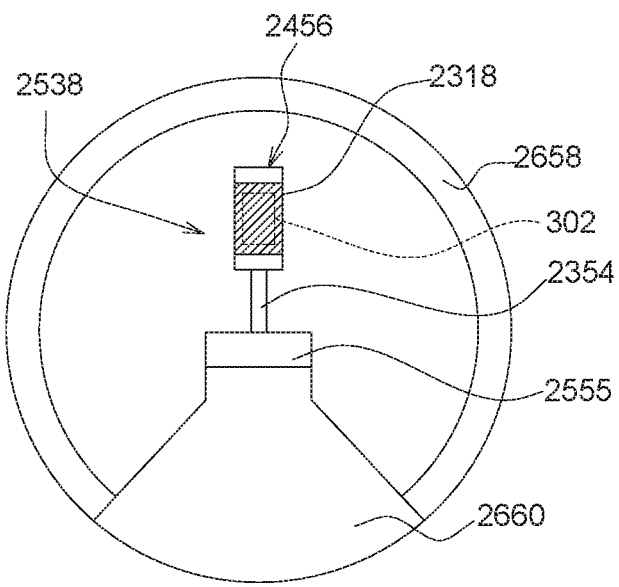

Referring to FIG. 30, the light emitting device 2538 having a light bar structure is disposed on a heat dispersion 2660, and a lamp casing 2658 is disposed to cover the light emitting device 2538, to form a light emitting device 2638 having a tube lamp structure.

In embodiments, for example, the light emitting diode package structure 318, 418, 518, 618, 718, 818, 918, 1018, 1118, 1218, 1318, 1418, 1518, 1618, 1718 as illustrated with FIG. 7 to FIG. 21 may be applied for the light emitting diode package structure 2318. In some embodiments, the light emitting diode package structure 2318 uses the light emitting diode package structure 318, 418, 518, 618, 718, 818 in FIG. 7 to FIG. 12, with the base 320 and the wall 322 formed by the transparent material. Therefore, a light emitted from the light emitting diode chip 302 can goes out the light emitting diode package structure 318, 418, 518, 618, 718, 818, 2318 though a light emitting surface directly (without being blocked by an opaque material or reflected by a reflective material). For example, the light may be emitted along a direction perpendicular to the base 320 and out from a upper surface and a lower surface of the light emitting diode package structure 318, 418, 518, 618, 718, 818, 2318 with a wide angle (of larger than 180 degrees for example).

In embodiments, the light emitting diode package structure 2318/plug-in light emitting unit 2456 is for emitting a white light. In this example, the light emitting diode chip 302 may be a blue light emitting diode chip. The wavelength-converting material may comprise the red all-inorganic perovskite quantum dot $CsPb(Br_{1-b}I_b)_3$ and the yellow phosphor powder YAG:Ce. The red all-inorganic perovskite quantum dot complies with $0.5 \leq b \leq 1$; and/or has the particle diameter in a range of about 10 nm to 14 nm. In embodiments, the red all-inorganic perovskite quantum dot $CsPb(Br_{1-b}I_b)_3$ is comprised by the quantum dot composite material. In other words, the modification protection is formed on the surface of the red all-inorganic perovskite quantum dot $CsPb(Br_{1-b}I_b)_3$.

In embodiments, the light emitting diode package structure 2318/plug-in light emitting unit 2456 is for emitting a white light. In this example, the light emitting diode chip 302 may be a blue light emitting diode chip. The wavelength-converting material may comprise the green all-inorganic perovskite quantum dot $CsPb(Br_{1-b}I_b)_3$ and the red all-inorganic perovskite quantum dot $CsPb(Br_{1-b}I_b)_3$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot $CsPb(Br_{1-b}I_b)_3$ and the red all-inorganic perovskite quantum dot $CsPb(Br_{1-b}I_b)_3$.

In embodiments, the light emitting diode package structure 2318/plug-in light emitting unit 2456 is for emitting a white light. In this example, the light emitting diode chip 302 may be a UV light emitting diode chip. The wavelength-converting material may comprise the blue all-inorganic perovskite quantum dot $CsPb(Cl_aBr_{1-a})_3$, the green all-inorganic perovskite quantum dot $CsPb(Br_{1-b}I_b)_3$, the red all-inorganic perovskite quantum dot $CsPb(Br_{1-b}I_b)_3$. Additionally/optionally, the blue all-inorganic perovskite quantum dot complies with $0 < a \leq 1$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the blue all-inorganic perovskite quantum dot has the particle diameter in a range of about 7 nm to 10 nm. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$.

Figure 31:
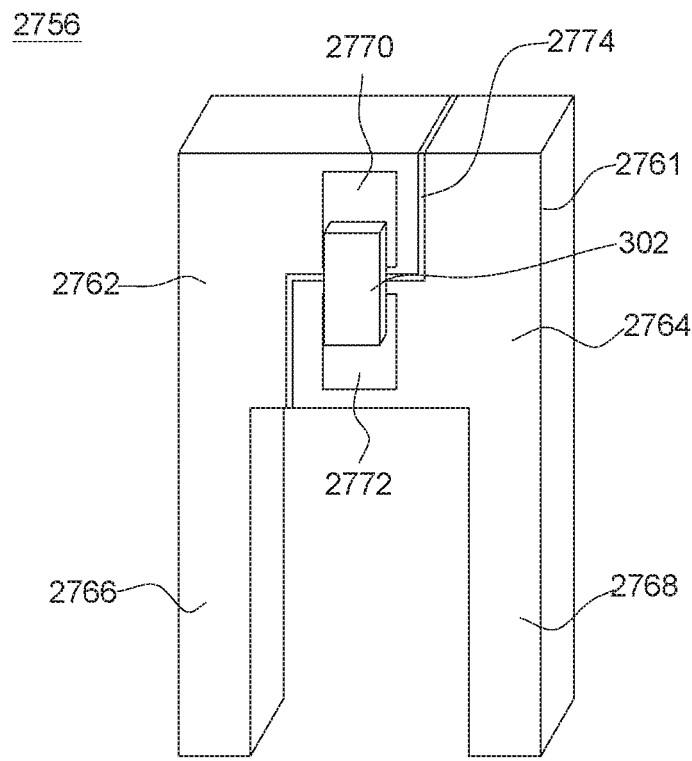
FIG. 31 illustrates a plug-in light emitting unit according to an embodiment.

FIG. 31 illustrates a plug-in light emitting unit 2756 according to an embodiment. The plug-in light emitting unit 2756 comprises the light emitting diode chip 302, a base 2761, a first electrode inserting foot 2766 and a second electrode inserting foot 2768. The base 2761 comprises a first base plate 2762, a second base plate 2764 and an insulating layer 2774. The insulating layer 2774 is disposed between the first base plate 2762 and the second base plate 2764 to electrically insulate the first base plate 2762 from the second base plate 2764. The light emitting diode chip 302 is disposed on a die bonding region contained in the base 2761 used as a die bonding plate. The light emitting diode chip 302 crossing the insulating layer 2774 is disposed on the first base plate 2762 and the second base plate 2764 by a flip chip method. A positive electrode and a negative electrode of the light emitting diode chip 302 is electrically connected to a first contact pad 2770 and a second contact pad 2772 of the first base plate 2762 and the second base plate 2764 so as to electrically connect to the first electrode inserting foot 2766 and the second electrode inserting foot 2768 extended from the first base plate 2762 and the second base plate 2764 respectively. The light emitting diode chip 302 may be electrically connected to the first contact pad 2770 and the second contact pad 2772 through a solder (not shown).

Figure 32:
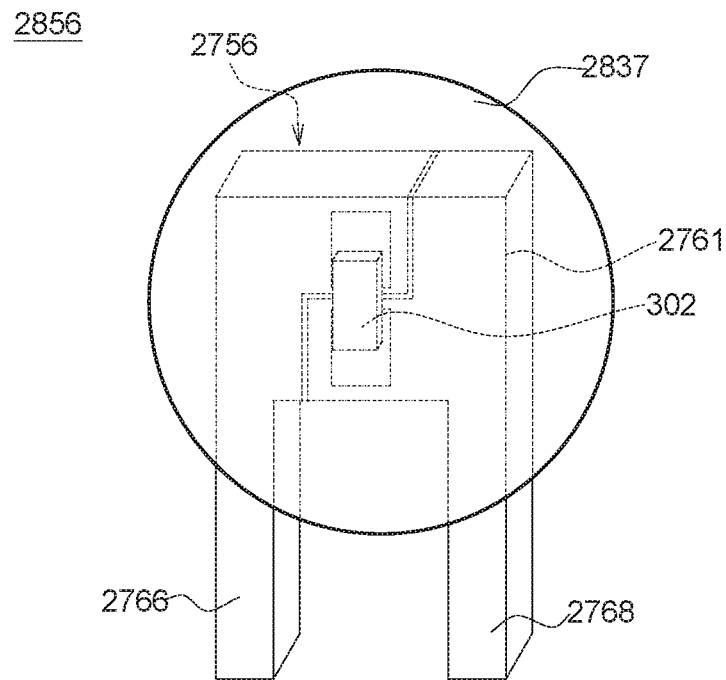
FIG. 32 illustrates a plug-in light emitting unit according to an embodiment.

FIG. 32 illustrates a plug-in light emitting unit 2856 according to another embodiment. The plug-in light emitting unit 2856 comprises a transparent gel 2837 and the plug-in light emitting unit 2756 as illustrated with FIG. 31. The transparent gel 2837 covers the whole of the light emitting diode chip 302 and the base 2761, and covers a portion of the first electrode inserting foot 2766 and the second electrode inserting foot 2768.

Figure 33:
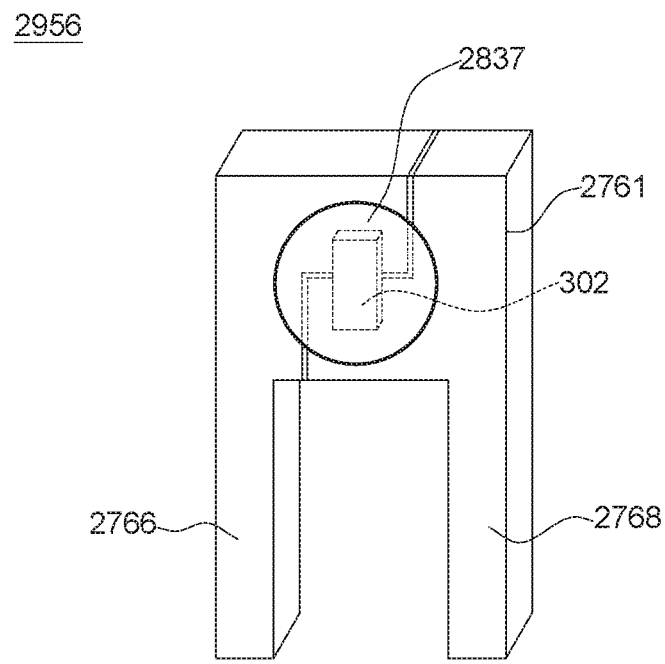
FIG. 33 illustrates a plug-in light emitting unit according to an embodiment.

FIG. 33 illustrates a plug-in light emitting unit 2956 according to another embodiment. The plug-in light emitting unit 2956 is different from the plug-in light emitting unit 2856 shown in FIG. 32 in that the transparent gel 2837 covers the whole of the light emitting diode chip 302, covers a portion of a surface of the base 2761 having the light emitting diode chip 302 thereon, but not covers the first electrode inserting foot 2766 and the second electrode inserting foot 2768.

In embodiments, the plug-in light emitting unit 2856 or 2956 may comprise the wavelength-converting material doped in the transparent gel 2837, or may comprise the wavelength converting layer comprising the wavelength-converting material and disposed on the surface of the light emitting diode chip 302. In embodiments, the transparent gel 2837 may comprise any suitable transparent polymer material, such as, PMMA, PET, PEN, PS, PP, PA, PC, PI, PDMS, Epoxy, silicone or other suitable materials, or a combination thereof. The transparent gel 2837 may be doped with other substances to vary an emitting light property according to actual demands. For example, the diffusion particles may be doped into the transparent gel 2837 to change a path of an emitting light. The diffusion particles may comprise $TiO_2$, $SiO_2$, $Al_2O_3$, BN, ZnO, etc., and/or have the same particle diameter or different particle diameters.

Figure 34:
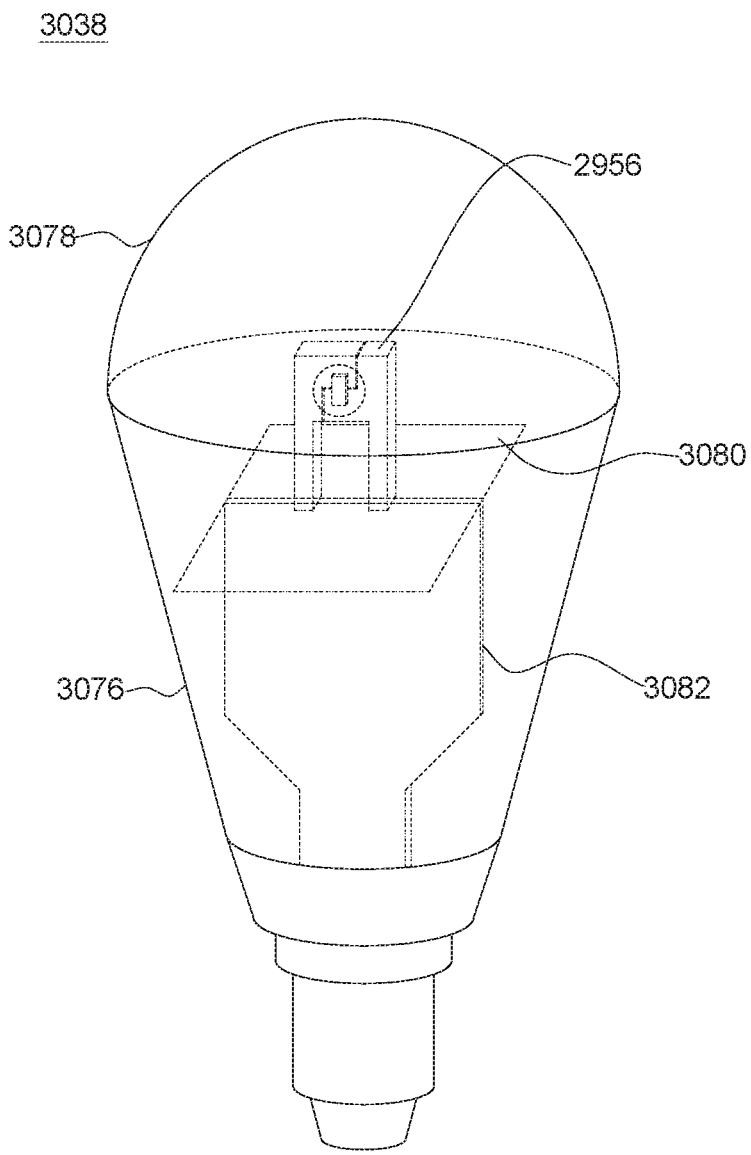
FIG. 34 illustrates a light emitting device according to an embodiment.

FIG. 34 illustrates a light emitting device 3038 according to an embodiment. The light emitting device 3038 having a bulb lamp structure comprises the plug-in light emitting unit 2956 as shown in FIG. 33, a casing body 3076, a transparent lamp cover 3078 and a circuit board 3080. The plug-in light emitting unit 2956 is inserted into the circuit board 3080 and electrically connected to the circuit board 3080 so as to electrically connect to a driving circuit 3082 of the circuit board 3080. The plug-in light emitting unit 2956 is disposed together with the circuit board 3080 in a receiving space defined by the casing body 3076 and the transparent lamp cover 3078 connecting with the casing body 3076.

The transparent gel illustrated in the present disclosure may comprise any suitable transparent polymer material, such as, PMMA, PET, PEN, PS, PP, PA, PC, PI, PDMS, Epoxy, silicone or other suitable materials, or a combination thereof.

The transparent gel may be doped with other substances to vary an emitting light property according to actual demands. For example, the diffusion particles may be doped into the transparent gel to change a path of an emitting light. The diffusion particles may comprise $TiO_2$, $SiO_2$, $Al_2O_3$, BN, ZnO, etc., and/or have the same particle diameter or different particle diameters.

The light emitting device in the present disclosure is not limited to the foregoing embodiments, and may comprise other kinds of the light emitting diode package structures, may be applied for a light emitting module of the display device such as a back light module or a front light module, or a lighting device such as a tube lamp, a bulb lamp, or may have other types of structures.

The light emitting diode package structure of a single unit is not limited to only the light emitting diode chip of a single, and may use the light emitting diode chips of two or more units for emitting lights of the same color/wavelength or different colors/wavelengths.

In embodiments, the light emitting diode package structure 2018, 2218 and the plug-in light emitting unit 2856, 2956 are for emitting a white light. In this example, the light emitting diode chip 302 may be a blue light emitting diode chip. The wavelength-converting material may comprise the red all-inorganic perovskite quantum dot $CsPb(Br_{1-b}I_b)_3$ and the yellow phosphor powder YAG:Ce. The red all-inorganic perovskite quantum dot complies with $0.5 \leq b \leq 1$; and/or has the particle diameter in a range of about 10 nm to 14 nm. In embodiments, the red all-inorganic perovskite quantum dot $CsPb(Br_{1-b}I_b)_3$ is comprised by the quantum dot composite material. In other words, the modification protection is formed on the surface of the red all-inorganic perovskite quantum dot $CsPb(Br_{1-b}I_b)_3$.

In embodiments, the light emitting diode package structure 2018, 2218 and the plug-in light emitting unit 2856, 2956 are for emitting a white light. In this example, the light emitting diode chip 302 may be a blue light emitting diode chip. The wavelength-converting material may comprise the green all-inorganic perovskite quantum dot $CsPb(Br_{1-b}I_b)_3$ and the red all-inorganic perovskite quantum dot $CsPb(Br_{1-b}I_b)_3$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the green all-inorganic perovskite quantum dot CsPb $(Br_{1-b} I_b)_3$ and the red all-inorganic perovskite quantum dot $CsPb(Br_{1-b}I_b)_3$.

In embodiments, the light emitting diode package structure 2018, 2218 and the plug-in light emitting unit 2856, 2956 are for emitting a white light. In this example, the light emitting diode chip 302 may be a UV light emitting diode chip. The wavelength-converting material may comprise the blue all-inorganic perovskite quantum dot $CsPb(Cl_aBr_{1-a})_3$, the green all-inorganic perovskite quantum dot $CsPb(Br_{1-b} I_b)_3$, the red all-inorganic perovskite quantum dot CsPb $(Br_{1-b} I_b)_3$. Additionally/optionally, the blue all-inorganic perovskite quantum dot complies with $0 \leq a \leq 1$. Additionally/optionally, the green all-inorganic perovskite quantum dot complies with $0 \leq b < 0.5$. Additionally/optionally, the red all-inorganic perovskite quantum dot complies with $0.5 \leq b \leq 1$. Additionally/optionally, the blue all-inorganic perovskite quantum dot has the particle diameter in a range of about 7 nm to 10 nm. Additionally/optionally, the green all-inorganic perovskite quantum dot has the particle diameter in a range of about 8 nm to 12 nm. Additionally/optionally, the red all-inorganic perovskite quantum dot has the particle diameter in a range of about 10 nm to 14 nm. In embodiments, at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$ is comprised by the quantum dot composite material. In other words, the modification protection is formed on the surface of the at least one of the blue all-inorganic perovskite quantum dot $CsPb(Cl_aBr_{1-a})_3$, the green all-inorganic perovskite quantum dot $CsPb(Br_{1-b}I_b)_3$ and the red all-inorganic perovskite quantum dot $CsPb(Br_{1-b}I_b)_3$.

The quantum dot composite material according to embodiments can be applied in use of a wavelength converting film.

Figure 35:
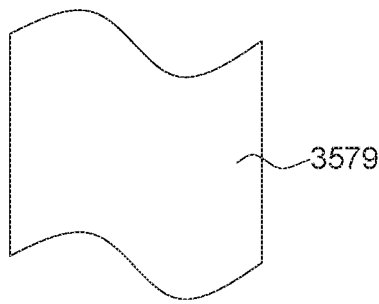
FIG. 35 illustrates a wavelength converting film according to an embodiment.

FIG. 35 illustrates a wavelength converting film 3577 according to an embodiment. The wavelength converting film 3577 comprises a quantum dot composite material (such as the quantum dot composite material 11, 31, 41, 71 as illustrated in FIG. 1 to FIG. 4, or the quantum dot composite material of another type) and a transparent base body 3579. The quantum dot composite material is mixed in the transparent base body 3579. The transparent base body 3579 may have a material comprising one or more of polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, and silicone, or a combination thereof, etc. In embodiments, the transparent base body 3579 may comprise a glass material or a ceramic material. The quantum dot composite material may be mixed with the glass material or the ceramic material to form a glass quantum dot thin film or a ceramic quantum dot thin film. The transparent base body 3579 may be a flexible or an inflexible material.

Figure 36:
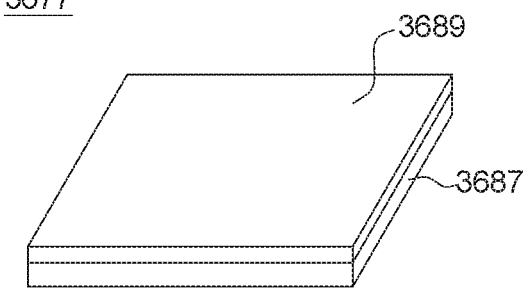
FIG. 36 illustrates a wavelength converting film according to an embodiment.

FIG. 36 illustrates a wavelength converting film 3677 according to another embodiment. The wavelength converting film 3677 comprises a quantum dot composite material (such as the quantum dot composite material 11, 31, 41, 71 as illustrated in FIG. 1 to FIG. 4, or the quantum dot composite material of another type) and a transparent base plate 3687. For example, the quantum dot composite material may be disposed on the transparent base plate 3687 by a coating method to form a quantum dot thin layer 3689 on the transparent base plate 3687. The wavelength converting film 3677 may be a flexible base plate or an inflexible base plate. The transparent base plate 3687 may have a material comprising one or more of polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, and silicone, or a combination thereof, etc. In embodiments, the transparent base plate 3687 may comprise a glass material or a ceramic material.

In embodiments, the wavelength converting film 3577 in FIG. 35 and the wavelength converting film 3677 in FIG. 36 may be designed to be capable of absorbing a sun light to convert a portion light having a (original) wavelength of the sun light having no benefit to growth of a plant into a light having a (converted) wavelength suitable for being absorbed by the plant and benefiting the growth of the plant, and emitting the light having the (converted) wavelength. For example, a red light having a wavelength in a range of about 600 nm-700 nm can be absorbed by a chlorophyll, and can improve growth or flower of a plant, and prolong flowering duration. For example, the quantum dot composite material of the wavelength converting film uses the red all-inorganic perovskite quantum dot $CsPb(Br_{1-b}I_b)_3$, complying with $0.5 \leq b \leq 1$ and/or having the particle diameter in a range of about 10 nm to 14 nm, for emitting a red light having a wavelength in a range of about 620 nm to 680 nm. The quantum dot composite material comprises the modification protection on the all-inorganic perovskite quantum dot, so that the all-inorganic perovskite quantum dot has an improved tolerance to a sun light, and stability and lifespan of a product is improved.

In embodiments, the wavelength-converting material comprising the quantum dot composite material may be applied to a device of a micro-size. The following description takes a quantum dot light emitting diode and a pixel structure as examples to illustrate embodiments.

Figure 37:
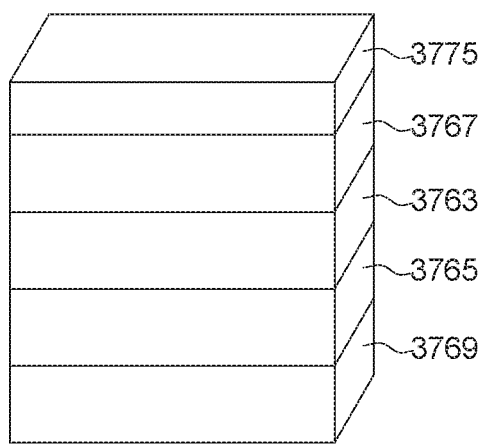
FIG. 37 illustrates a three dimensional view of a quantum dot light emitting diode according to an embodiment.

FIG. 37 illustrates a three dimensional view of a quantum dot light emitting diode (QLED) according to an embodiment. The quantum dot light emitting diode comprises a light emitting layer 3763. The light emitting layer 3763 comprises the quantum dot composite material comprising the all-inorganic perovskite quantum dot, such as a red quantum dot composite material comprising the red all-inorganic perovskite quantum dot, a green quantum dot composite material comprising the green all-inorganic perovskite quantum dot, a blue quantum dot composite material comprising the blue all-inorganic perovskite quantum dot, or a combination thereof. The light emitting layer 3763 may be disposed between a hole injecting layer 3765 and an electron injecting layer 3767. An anode 3769, such as a transparent anode, may be disposed on the hole injecting layer 3765. A cathode 3775 may be disposed on the electron injecting layer 3767. The red quantum dot composite material comprises the red all-inorganic perovskite quantum dot $CsPb(Br_{1-b}I_b)_3$, complying with $0.5 \leq b \leq 1$, and/or having the particle diameter in a range of about 10 nm to 14 nm, and the modification protection is on the surface of the red all-inorganic perovskite quantum dot. The green quantum dot composite material comprises the green all-inorganic perovskite quantum dot $CsPb(Br_{1-b}I_b)_3$, complying with $0 \leq b < 0.5$, and/or having the particle diameter in a range of about 8 nm to 12 nm, and the modification protection is on the surface of the green all-inorganic perovskite quantum dot. The blue quantum dot composite material comprises the blue all-inorganic perovskite quantum dot $CsPb(Cl_aBr_{1-a})_3$, complying with $0 < a \leq 1$, and/or having the particle diameter in a range of about 7 nm to 10 nm, and the modification protection is on the surface of the blue all-inorganic perovskite quantum dot.

In embodiments, the wavelength-converting material comprising the quantum dot composite material may be applied to a light emitting device of a micro-size, such as a micro-light emitting diode (Micro LED) smaller than a conventional light emitting diode in size.

Figure 38:
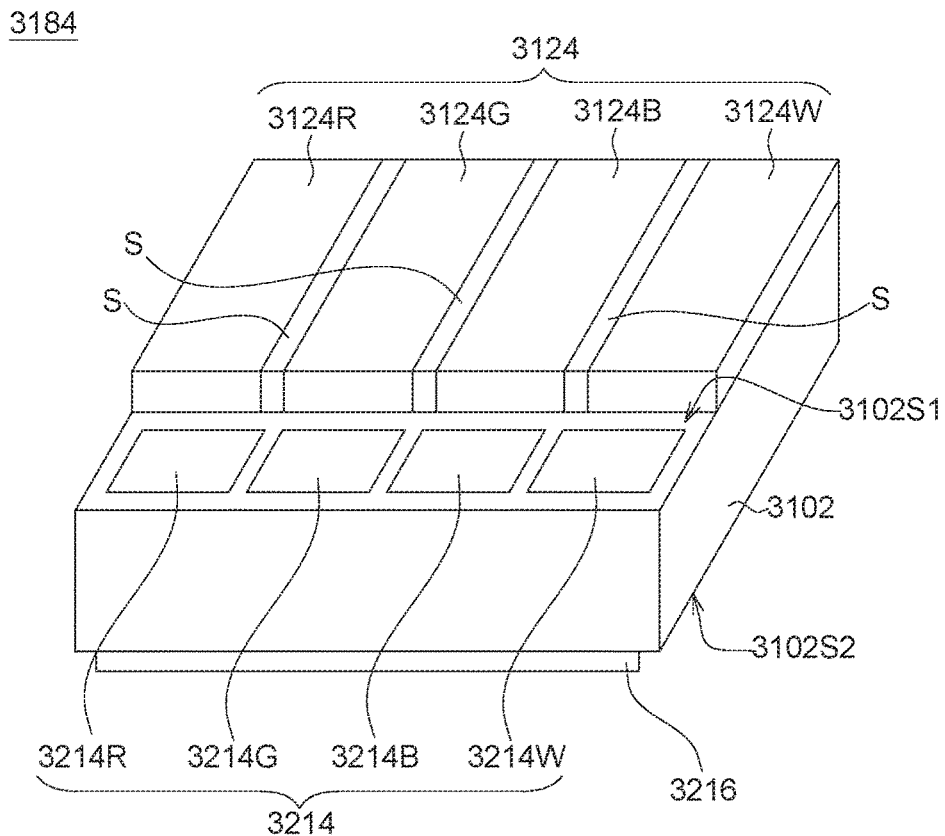
FIG. 38 illustrates a three dimensional view of a portion of a light emitting device corresponding to one pixel according to an embodiment.
Figure 39:
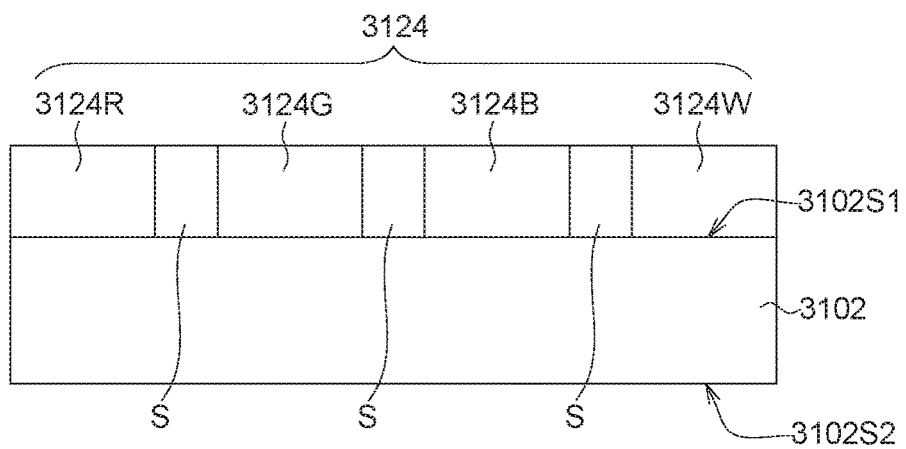
FIG. 39 illustrates a cross-section view of a portion of a light emitting device corresponding to one pixel according to an embodiment.

For example, FIG. 38 and FIG. 39 illustrate a three dimensional view and a cross-section view of a light emitting device 3184 according to an embodiment respectively. In embodiments, the light emitting device 3184 may be a micro-light emitting diode device, comprising a light emitting diode chip 3102, wavelength converting layers 3124 and spacing layers S. The light emitting diode chip 3102 comprises opposing surface 3102S1 and surface 3102S2. The surface 3102S1 is a light emitting surface of the light emitting diode chip 3102. The wavelength converting layers 3124 is on a light emitting side of the light emitting diode chip 3102. The wavelength converting layers 3124 is spaced apart from each other and disposed on the surface 3102S1 of the light emitting diode chip 3102. The spacing layers S on the surface 3102S1 of the light emitting diode chip 3102 is disposed between the wavelength converting layers 3124 separately.

In an embodiment, the light emitting diode chip 3102 may be a vertical light emitting diode chip, comprising a first electrode 3214 and a second electrode 3216 on the surface 3102S1 and the surface 3102S2, respectively. The light emitting side of the light emitting diode chip 3102 and the first electrode 3214 are on the same side of the light emitting device 3184.

In an embodiment, the wavelength converting layers 3124 comprise at least a wavelength converting layer 3124R, a wavelength converting layer 3124G, a wavelength converting layer 3124B. The wavelength converting layer 3124R can be excited by the light emitting diode chip 3102 to emit a red light. The wavelength converting layer 3124G can be excited by the light emitting diode chip 3102 to emit a green light. The wavelength converting layer 3124B can be excited by the light emitting diode chip 3102 to emit a blue light. This configuration may be used as a pixel for application in a display, with the distinct wavelength converting layers 3124 as distinct sub pixels. In other words, the wavelength converting layer 3124R corresponds to a red sub pixel. The wavelength converting layer 3124G corresponds to a green sub pixel. In addition, the wavelength converting layer 3124B corresponds to a blue sub pixel.

In embodiments, the wavelength converting layers 3124 may further comprise a wavelength converting layer 3124W corresponding to a white sub pixel. The wavelength converting layer 3124W may be separated from the wavelength converting layers 3124R, 3124G, 3124B by the spacing layers S and disposed on the surface 3102S1 of the light emitting diode chip 3102.

The pixel comprises at least the red sub pixel, the green sub pixel and the blue sub pixel. The pixel may further comprise the white sub pixel according to designs. A plurality of the pixels or the sub pixels may be arranged in an array design. In embodiments, spacing layers S may comprise a material comprising a light absorbing material or/and a reflective material, avoiding affection between lights of the sub pixels of different colors to improve display effect of a display. For example, the light absorbing material may comprise a black gel, etc., or a combination thereof. For example, the reflective material may comprise a white gel, etc., or a combination thereof.

Moreover, the first electrode 3214 may comprise a first electrode 3214R, a first electrode 3214G, a first electrode 3214B, and a first electrode 3214W, corresponding to the red sub pixel, the green sub pixel, the blue sub pixel and the white sub pixel, respectively. The second electrode 3216 may be a common electrode of the red sub pixel, the green sub pixel, the blue sub pixel and the white sub pixel. In other embodiments, electrodes separated from each other corresponding to the sub pixels of different colors, similar with the first electrodes 3214, may be used. The sub pixels of different colors may be independently controlled by the distinct corresponding electrodes to be addressed or derived to emit a light.

In embodiments, for example, the light emitting diode chip 3102 may be a UV light emitting diode chip for emitting the first light having a wavelength of about 200 nm to 400 nm. Otherwise, the light emitting diode chip 3102 may be a blue light emitting diode chip for emitting the first light having a wavelength of about 430 nm to 480 nm.

In embodiments, the wavelength-converting material of the wavelength converting layer 3124R corresponding to the red sub pixel may comprise the red quantum dot composite material comprising the red all-inorganic perovskite quantum dot $CsPb(Br_{1-b}I_b)_3$, complying with 0.5≤b≤1, and/or having the particle diameter in a range of about 10 nm to 14 nm, and the modification protection on the surface of the red all-inorganic perovskite quantum dot. The wavelength-converting material of the wavelength converting layer 3124G corresponding to the green sub pixel may comprise the green quantum dot composite material comprising the green all-inorganic perovskite quantum dot $CsPb(Br_{1-b}I_b)_3$, complying with 0≤b<0.5, and/or having the particle diameter in a range of about 8 nm to 12 nm, and the modification protection on the surface of the green all-inorganic perovskite quantum dot. The wavelength-converting material of the wavelength converting layer 3124B corresponding to the blue sub pixel may comprise the blue quantum dot composite material comprising the blue all-inorganic perovskite quantum dot $CsPb(Cl_aBr_{1-a})_3$, complying with 0<a≤1, and/or having the particle diameter in a range of about 7 nm to 10 nm, and the modification protection on the surface of the blue all-inorganic perovskite quantum dot, and/or a blue phosphor powder. The wavelength-converting material may be doped in the transparent material.

In an example of the light emitting diode chip 3102 being the blue light emitting diode chip, the wavelength converting layer 3124B corresponding to the blue sub pixel may be a transparent material, so that a blue light emitted from the blue sub pixel is directly provided by the light emitting diode chip 3102. The wavelength converting layer 3124W corresponding to the white sub pixel may comprise the yellow phosphor powder, such as YAG:Ce, capable of emitting a yellow light by being excited by a portion of the first light (blue light having a wavelength of about 430 nm to 480 nm) emitted from the light emitting diode chip 3102, and the yellow light is mixed with the remained blue light to form an emitting white light.

In embodiments, the micro light emitting diode as shown in FIG. 38 and FIG. 39 may be applied to a micro-light emitting diode display (Micro LED display). Comparing to a conventional light emitting diode technique, the micro light emitting diode has a smaller size, and a gap distance between adjacent two pixels can be reduced from a size grade of millimeter to a size grade of micrometer. Therefore, it is possible to form an array of light emitting diodes of high density and small feature on a single integrated circuit chip. It is easier to control a color precisely. A device can have advantages of a longer lifespan, a higher brightness, a stable material stability or lifespan, a less image sticking, etc., with using advantages of the light emitting diode such as high efficiency, high brightness, high reliability and fast response time, etc. A self-light emitting device without using a back light source can have advantages of saving energy, simple construction, small volume, thin module, etc. In addition, using a micro light emitting diode technique can achieve a high resolution.

The present disclosure may be better understood by reference to the following embodiments.

【Manufacturing all-Inorganic Perovskite Quantum】

$Cs_2CO_3$ of 0.814 g, octadecene (ODE) of 40 mL and oleic acid (OA) of 2.5 mL were put in a three-necked bottle of 100 mL, and a dewatering step was performed thereto in a condition of vacuum and 120° C. for one hour. Then, the three-necked bottle was heated to 150° C. in a nitrogen gas system until the $Cs_2CO_3$ and the oleic acid reacted completely so as to obtain a Cs precursor (Cs-Oleate precursor).

Next, ODE of 5 mL and $PbX_2$ of 0.188 mmol (with X=Cl, Br or I, or a combination thereof, decided according to a halogen element contained in the all-inorganic perovskite quantum dot) were put in a three-necked bottle of 25 mL, and a dewatering step was performed thereto in a condition of vacuum and 120° C. for one hour. Then oleylamine of 0.5 mL and OA of 0.5 mL were injected into the three-necked bottle. After the solution became limpid, a heating temperature was increased to 140-200° C. (decided to adjust a particle size of the all-inorganic perovskite quantum dot). Then the Cs-Oleate precursor of 0.4 mL was rapidly injected into the three-necked bottle. After waiting 5 seconds, the reaction system was cooled in a chilled-water bath. Then a centrifugal purification was performed so as to get the all-inorganic perovskite quantum dot $CsPb(Cl_aBr_{1-a-b}I_b)_3$.

【Red/Green all-Inorganic Perovskite Quantum Dot $CsPb(Br_{1-b}I_b)_3$】

Figure 40:
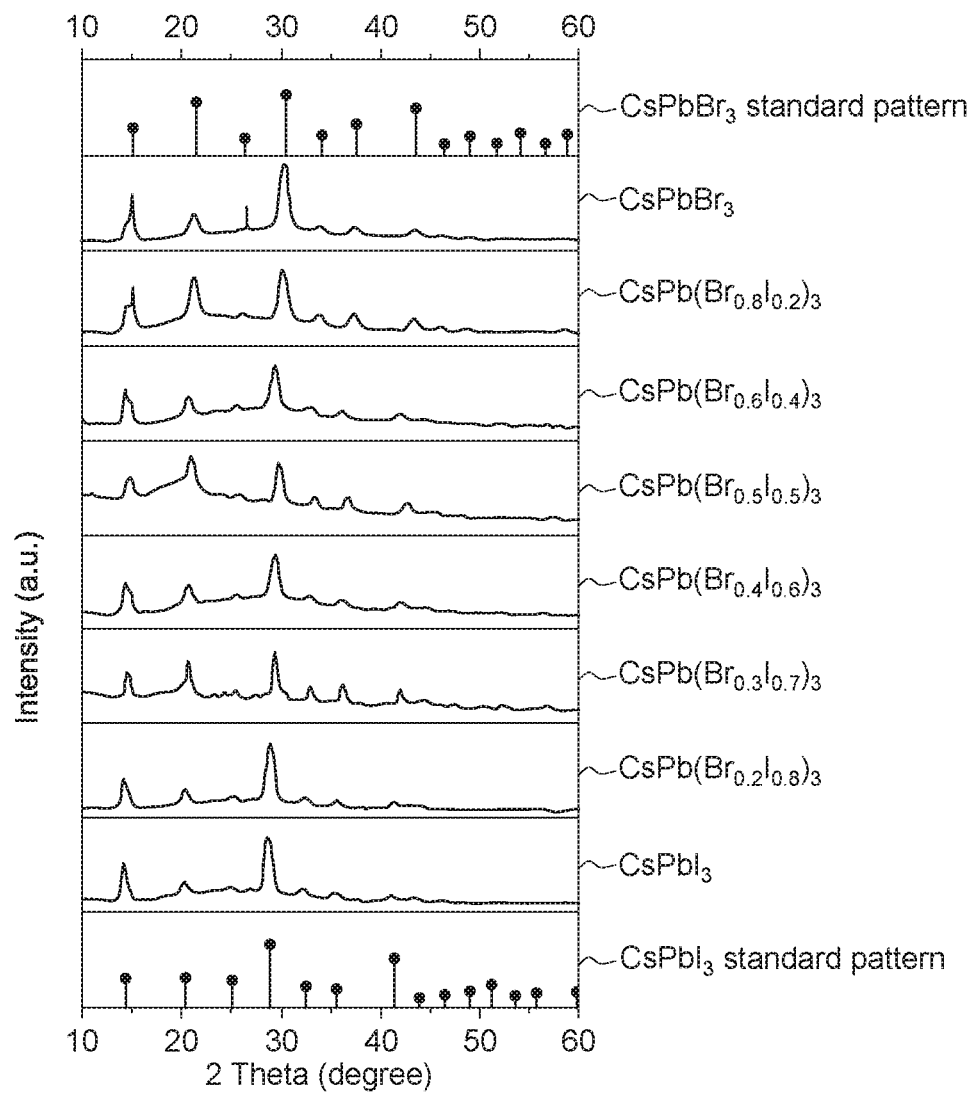
FIG. 40 shows X-ray diffraction patterns of all-inorganic perovskite quantum dots according to embodiments.

FIG. 40 shows X-ray diffraction patterns of the all-inorganic perovskite quantum dots of $CsPb(Br_{1-b}I_b)_3$ according to embodiments. The XRD patterns from the bottom to the top in FIG. 40 in order correspond to $CsPbI_3$, $CsPb(Br_{0.2}I_{0.8})_3$, $CsPb(Br_{0.3}I_{0.7})_3$, $CsPb(Br_{0.4}I_{0.6})_3$, $CsPb(Br_{0.5}I_{0.5})_3$, $CsPb(Br_{0.6}I_{0.4})_3$, nucleation temperatures of which are all 180° C. From comparison of the XRD patterns of the synthesized perovskite quantum dots with the various Br and I ratios and the standard XRD patterns of $CsPbI_3$ and $CsPbBr_3$ of cubic phase, it could be found that all of the peak positions of the synthesized all-inorganic perovskite quantum dot $CsPb(Br_{1-b}I_b)_3$ are identical to the standard patterns of cubic phase, indicating that the synthesized all-inorganic perovskite quantum dot $CsPb(Br_{1-b}I_b)_3$ all have a cubic phase.

Figure 41:
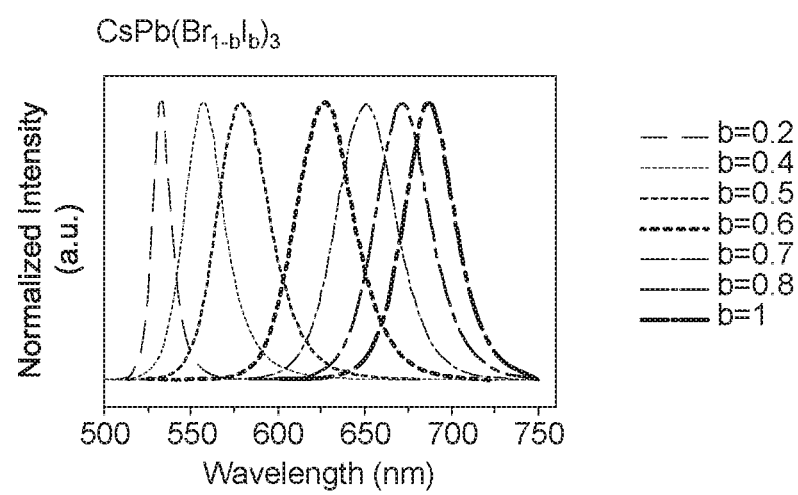
FIG. 41 shows photoluminescence (PL) spectrums of all-inorganic perovskite quantum dot according to embodiments.
Figure 42:
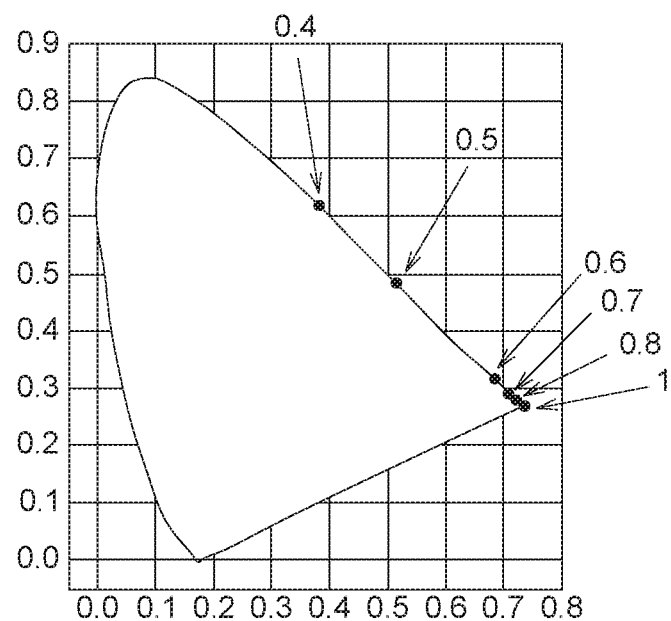
FIG. 42 shows positions of all-inorganic perovskite quantum dots in a CIE diagram according to embodiments.

FIG. 41 shows normalized photoluminescence (PL) spectrums of the all-inorganic perovskite quantum dots $CsPb(Br_{1-b}I_b)_3$, excited by an emitting light of about 460 nm. Data of peak position (position of the strongest intensity) and full width at half maximum (FWHM) are listed in Table 1. FIG. 42 shows positions of the all-inorganic perovskite quantum dots $CsPb(Br_{1-b}I_b)_3$ in a CIE diagram.

TABLE 1

| All-inorganic perovskite quantum dot $CsPb(Br_{1-b}I_b)_3$ | | |
| --- | --- | --- |
| b | peak position (nm) | FWHM (nm) |
| 0.4 | 557 | 27 |
| 0.5 | 578 | 35 |
| 0.6 | 625 | 37 |
| 0.7 | 650 | 40 |
| 0.8 | 670 | 37 |
| 1 | 687 | 35 |

From the results of FIG. 41, FIG. 42 and Table 1, it is found that the all-inorganic perovskite quantum dots $CsPb(Br_{1-b}I_b)_3$ have a red shift effect (i.e. shifting of peak position from about 557 nm to about 687 nm gradually) with a change of increasing the I element content and decreasing the Br element content, i.e. b increased from 0.4 to 1. The phenomenon could be explained with a quantum confinement effect. In other words, the red shift of the emission spectrum of the all-inorganic perovskite quantum dots $CsPb(Br_{1-b}I_b)_3$ are resulted from an enlarging material size as the I element content is increased since a diameter of a I ion is bigger than a diameter of a Br ion.

The all-inorganic perovskite quantum dots $CsPb(Br_{1-b}I_b)_3$ complying with b=0.5-1 are red quantum dots. The red all-inorganic perovskite quantum dot $CsPb(Br_{0.4}I_{0.6})_3$ has the strongest emission position at about 625 nm, complying with the red emission wavelength range in the common market condition. The red all-inorganic perovskite quantum dot $CsPb(Br_{0.4}I_{0.6})_3$ has the FWHM of 35 nm, narrower than a common commercial red phosphor powder, indicating having a better pure quality of color. Therefore, as the all-inorganic perovskite quantum dot is applied to a light emitting device, an emission efficiency of a product can be increased. Otherwise, when the all-inorganic perovskite quantum dot together with a phosphor material of another kind is applied to a light emitting device, a color rendering of a product can be increased.

Among the all-inorganic perovskite quantum dots $CsPb(Br_{1-b}I_b)_3$, the all-inorganic perovskite quantum dot complying with b=0.4 ($CsPb(Br_{0.6}I_{0.4})_3$) is a green quantum dot. The green all-inorganic perovskite quantum dot $CsPb(Br_{0.6}I_{0.4})_3$ has the strongest emission position at 557 nm, complying with the green emission wavelength range in the common market condition. The green all-inorganic perovskite quantum dot $CsPb(Br_{0.6}I_{0.4})_3$ has the FWHM of 27 nm, narrower than a common commercial green phosphor powder, indicating having a better pure quality of color. Therefore, as the all-inorganic perovskite quantum dot is applied to a light emitting device, an emission efficiency of a product can be increased. Otherwise, when the all-inorganic perovskite quantum dot together with a phosphor material of another kind is applied to a light emitting device, a color rendering of a product can be increased.

【All-Inorganic Perovskite Quantum Dot $CsPb(Cl_aBr_{1-a})_3$】

Figure 43:
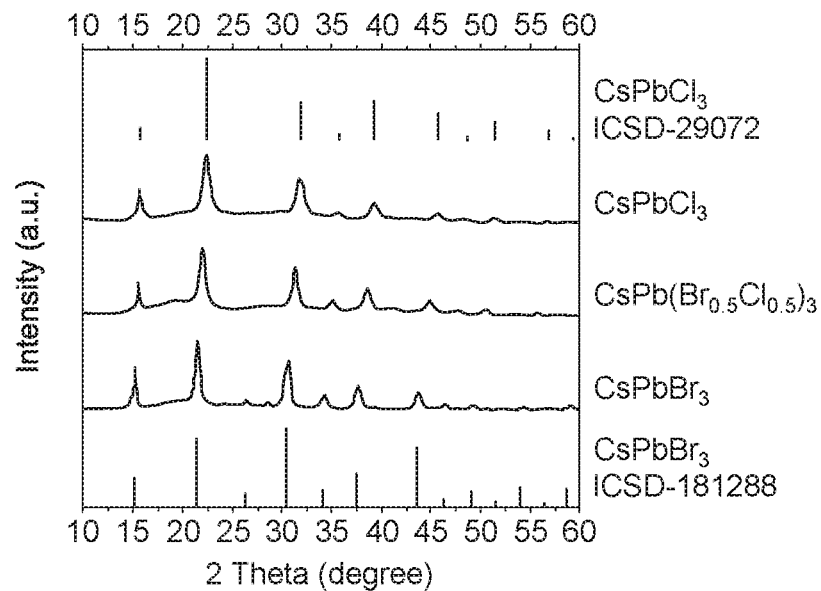
FIG. 43 shows X-ray diffraction patterns of all-inorganic perovskite quantum dots according to embodiments.

FIG. 43 shows X-ray diffraction patterns of the all-inorganic perovskite quantum dots of $CsPb(Cl_aBr_{1-a})_3$ with a=0, 0.5, 1 according to embodiments. From comparison of the XRD patterns of the synthesized perovskite quantum dots $CsPb(Cl_aBr_{1-a})_3$ and the standard XRD patterns of $CsPBr_3$ and $CsPbCl_3$ of cubic phase, it could be found that all of the peak positions of the synthesized all-inorganic perovskite quantum dot $CsPb(Cl_aBr_{1-a})_3$ are identical to the standard patterns of cubic phase, indicating that the synthesized all-inorganic perovskite quantum dot $CsPb(Cl_aBr_{1-a})_3$ all have a cubic phase. Nucleation temperatures of the all-inorganic perovskite quantum dots $CsPb(Cl_aBr_{1-a})_3$ are all 180° C.

Figure 44:
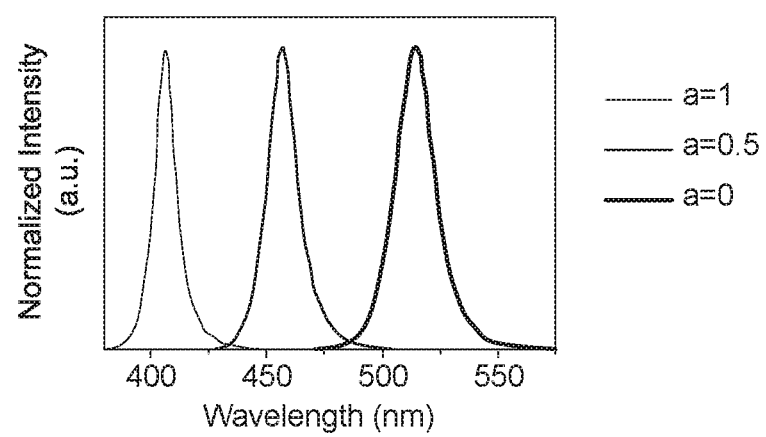
FIG. 44 shows PL spectrums of all-inorganic perovskite quantum dots according to embodiments.
Figure 45:
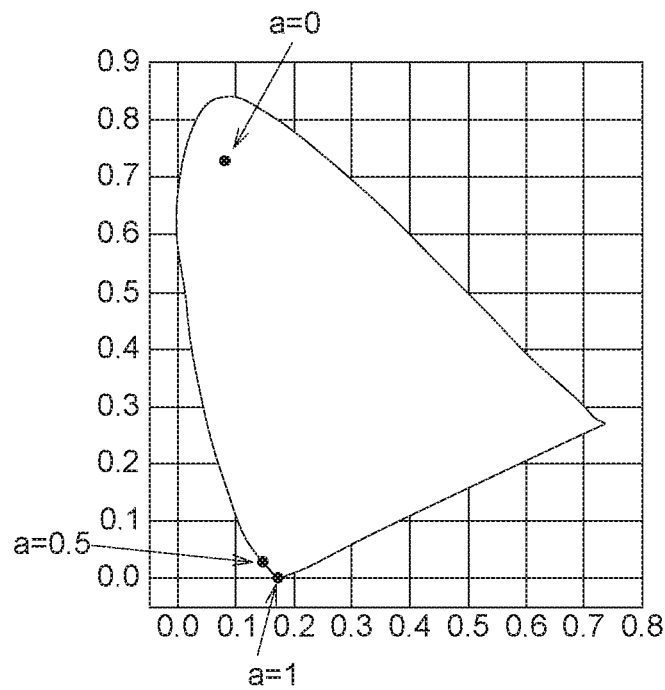
FIG. 45 shows positions of all-inorganic perovskite quantum dots in a CIE diagram according to embodiments.

FIG. 44 shows normalized PL spectrums of the all-inorganic perovskite quantum dots of $CsPb(Cl_aBr_{1-a})_3$ (a=0, 0.5, 1) according to embodiments, excited by a light of a wavelength 380 nm. Data of peak position (position of the strongest intensity) and full width at half maximum (FWHM) are listed in Table 2. FIG. 45 shows positions of the all-inorganic perovskite quantum dots $CsPb(Cl_aBr_{1-a})_3$ in a CIE diagram.

TABLE 2

| all-inorganic perovskite quantum dot $CsPb(Cl_aBr_{1-a})_3$ | | |
| --- | --- | --- |
| a | peak position (nm) | FWHM (nm) |
| 0 | 514 | 19 |
| 0.5 | 457 | 15 |
| 1 | 406 | 11 |

From the results of FIG. 44, FIG. 45 and Table 2, it is found that the all-inorganic perovskite quantum dots CsPb $(Cl_aBr_{1-a})_3$ have a red shift effect (i.e. shifting of peak position from about 406 nm to about 514 nm gradually) with a change of decreasing the Cl element content and increasing the Br element content, i.e. b decreased from 1 to 0. The phenomenon could by explained with a quantum confinement effect. In other words, the red shift of the emission spectrum of the all-inorganic perovskite quantum dots CsPb $(Cl_aBr_{1-a})_3$ are resulted from an enlarging material size as the Cl element content is decreased since a diameter of a Cl ion is smaller than a diameter of a Br ion. Among the all-inorganic perovskite quantum dots $CsPb(Cl_aBr_{1-a})_3$, the all-inorganic perovskite quantum dot complying with a=0 ($CsPbBr_3$, equivalent to the chemical formula $CsPb(Br_{1-b}I_b)_3$ complying with b=1) is a green quantum dot, the all-inorganic perovskite quantum dots complying with a=0.5, 1 ($CsPb(Cl_{0.5}Br_{0.5})_3$, $CsPbCl_3$) are blue quantum dots.

Figure 46:
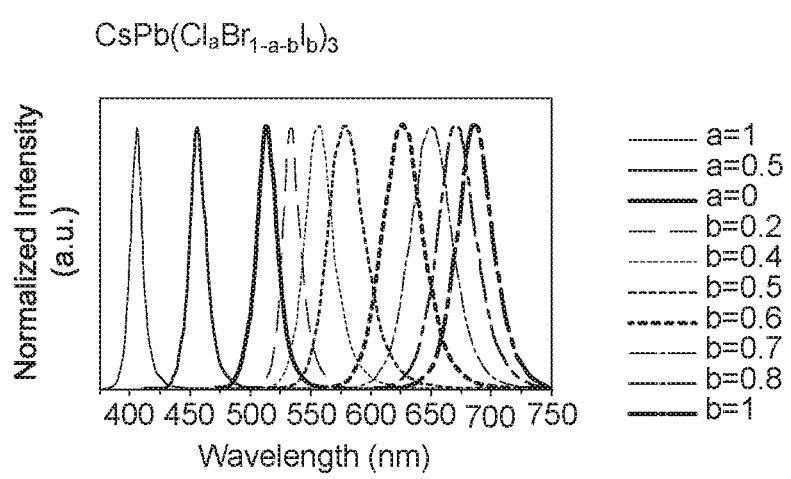
FIG. 46 shows PL spectrums of all-inorganic perovskite quantum dot according to embodiments.

FIG. 46 shows normalized PL spectrums combining the normalized PL spectrums of FIG. 41 and FIG. 44. It is shown that the all-inorganic perovskite quantum dots CsPb $(Cl_aBr_{1-a-b}I_b)_3$ have various light emitting characteristics with different Cl, Br, I contents. The emitting lights contain ranges of red, green and blue, and the FWHM of each is narrow. Therefore, the composition of the all-inorganic perovskite quantum dot can be adjusted accordingly to obtain an emitting light of an expected peak position. A light emitting device using the all-inorganic perovskite quantum dot can exhibit a good optoelectronic property.

【Quantum Dot Composite Material-Modification Protection of Mesoporous Particle】

The quantum dot composite material was formed by the following steps. The synthesized all-inorganic perovskite quantum dots (having the particle diameter in a range of about 10 nm, and the crystal plane spacing of about 5.78 Å) were mixed in the nonpolar hexane solvent (10 mg/ml) to form the all-inorganic perovskite quantum dot solution. Then the silicon dioxide mesoporous particles (having the pore having the size of about 12 nm-14 nm) were mixed into the all-inorganic perovskite quantum dot solution with the ratio of the all-inorganic perovskite quantum dots to the silicon dioxide mesoporous particles being about 1:10. After the mixture was stirred for about 1 hour, the centrifugal treatment of 3000 rpm was performed to the mixture for 10 minutes to obtain powders of the quantum dot composite material.

Figure 47:
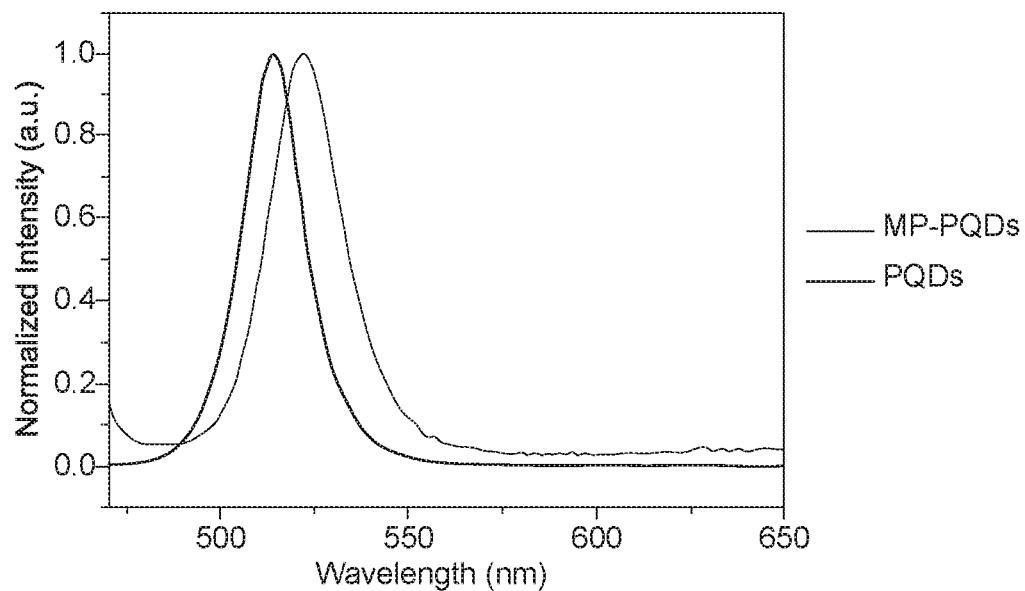
FIG. 47 shows PL spectrums of an all-inorganic perovskite quantum dot without a modification protection of a comparative example (PQDs) and a quantum dot composite material of an embodiment (MP-PQDs).

FIG. 47 shows the PL spectrums of the all-inorganic perovskite quantum dot without a modification protection of a comparative example (PQDs) and the quantum dot composite material of an embodiment (MP-PQDs). Comparing to the comparative example, the spectrum of the embodiment shows a red shift of about 10 nm. The red shift may be resulted from a slight aggregation of the all-inorganic perovskite quantum dots got into the same one of the pores of the mesoporous particle. A difference of FWHM of the emission wave peaks of embodiment and comparative example is very small.

Figure 48:
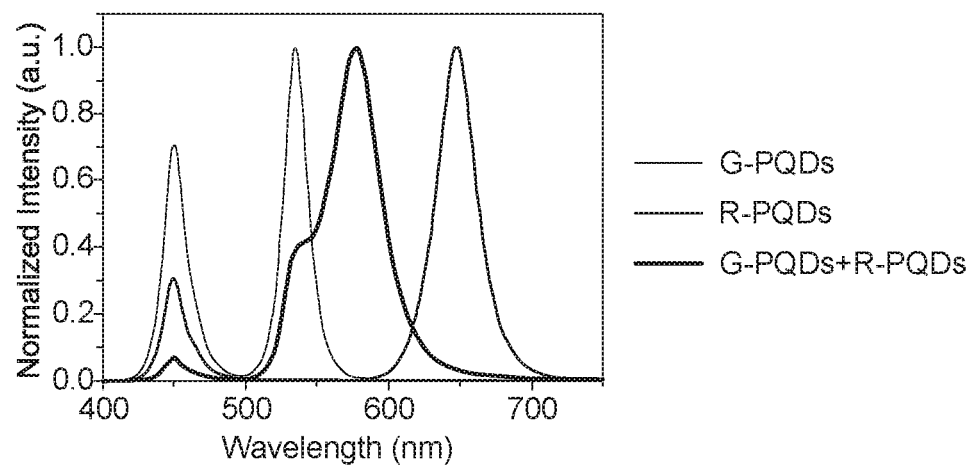
FIG. 48 shows PL spectrums of light emitting diode package structures.
Figure 49:
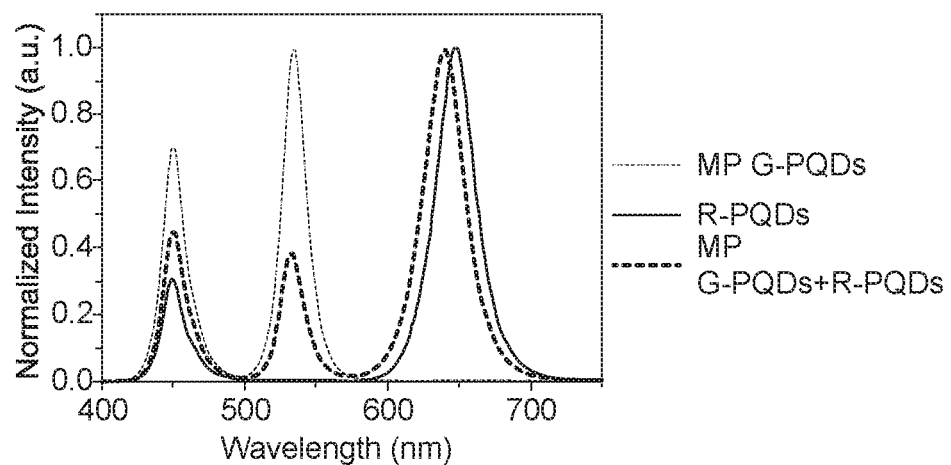
FIG. 49 shows PL spectrums of light emitting diode package structures.

FIG. 48 and FIG. 49 show the PL spectrums of the light emitting diode package structures of various examples. The light emitting diode package structures were formed by dispensing the glue formed by mixing the all-inorganic perovskite quantum dots or the quantum dot composite materials with the transparent encapsulating compound (silicone/silicone resin) onto the blue light emitting diode chip (for emitting a light having a wavelength of 450 nm), and then curing the glue.

In the results of the comparative examples as shown in FIG. 48, the curve of G-PQDs indicates using the green all-inorganic perovskite quantum dot $CsPbBr_3$. The curve of R-PQDs indicates using the red all-inorganic perovskite quantum dot $CsPb(Br_{0.4}I_{0.6})_3$. The curve of G-PQDs+R-PQDs indicates using the mixture of the green all-inorganic perovskite quantum dot $CsPbBr_3$ and the red all-inorganic perovskite quantum dot $CsPb(Br_{0.4}I_{0.6})_3$. In the all comparative examples in FIG. 48, there is no modification protection formed on the all-inorganic perovskite quantum dot. From the results shown in FIG. 48, it is found that there are differences between the positions of the wave peaks of the curve G-PQDs+R-PQDs and the curves of G-PQDs and R-PQDs. In addition, the FWHMs of the curve G-PQDs+R-PQDs are wider that the FWHMs of the curves of G-PQDs and R-PQDs. The results are supposed to be due to an ion exchange phenomenon between the green all-inorganic perovskite quantum dot and the red all-inorganic perovskite quantum dot. The instability property of the mixture is not suitable for product applications.

In FIG. 49, the curve of R-PQDs (comparative example) indicates using the red all-inorganic perovskite quantum dot $CsPb(Br_{0.4}I_{0.6})_3$. The curve of MP G-PQDs (embodiment) indicates using the quantum dot composite material formed by the silicon dioxide mesoporous particle as the modification protection and the green all-inorganic perovskite quantum dot $CsPbBr_3$. The curve of MP G-PQDs+R-PQDs (embodiment) indicates using the mixture of the quantum dot composite material comprising the green all-inorganic perovskite quantum dot (MP G-PQDs) and the red all-inorganic perovskite quantum dot (R-PQDs). From the results as shown in FIG. 49, it is found using the quantum dot composite material comprising the modification protection can avoid a miscible phenomenon of an ion exchange between the all-inorganic perovskite quantum dots having different compositions. Therefore, each of the all-inorganic perovskite quantum dots having different compositions can still exhibit the expected intrinsic emission properties, i.e. narrow FWHMs and strong emission intensities.

Figure 50:
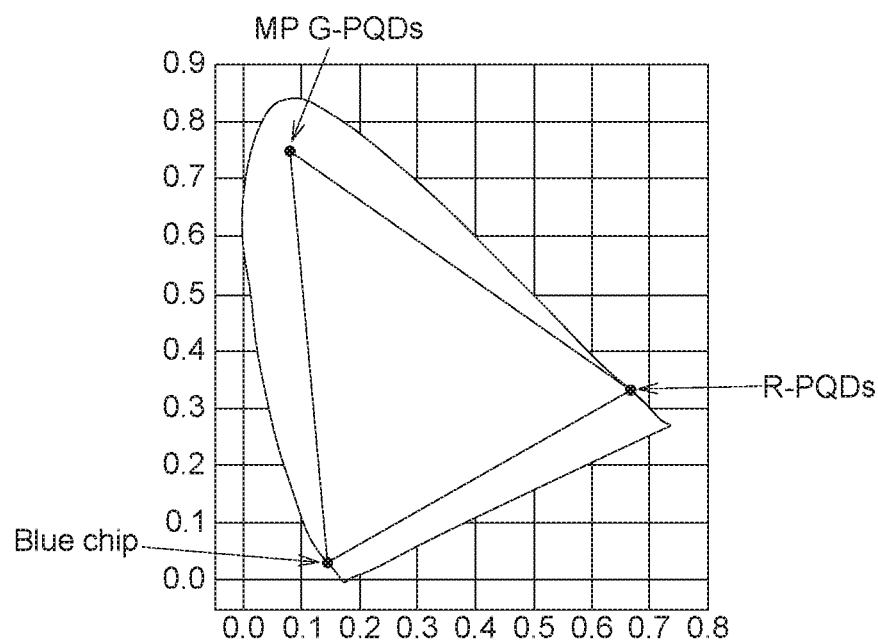
FIG. 50 shows positions of a light emitting diode package structure in a CIE diagram.

FIG. 50 shows positions of the light emitting diode package structure in a CIE diagram. The light emitting diode package comprises the blue light emitting diode chip (blue chip) and the mixture of quantum dot composite material formed by the green all-inorganic perovskite quantum dot and the mesoporous particle (MP G-PQDs) and the red all-inorganic perovskite quantum dot (R-PQDs). The blue light emitting diode chip is for providing a blue light to excite the mixture. The display using the quantum dot composite material comprising the modification protection according to embodiments can have a NTSC reaching 104%, higher than a NTSC (86%) of a display using a conventional phosphor powder. The display using the quantum dot composite material comprising the modification protection according to embodiments has excellent display effect.

【Quantum Dot Composite Material—Modification Protection of Ligand Exchange, Mesoporous Particle, Polymer Encapsulation】

The all-inorganic perovskite quantum dot $CsPbBr_3$ discussed herein can be manufactured according to the method disclosed in the section of 【MANUFACTURING All-INORGANIC PEROVSKITE QUANTUM】.

The quantum dot composite material (indicated by $CsPbBr_3$/SDDA) was formed by performing the sulfuring treatment to the surface of the all-inorganic perovskite quantum dot $CsPbBr_3$. The sulfuring agent (SDDA) used for the sulfuring treatment was manufactured by dissolving didodecyldimethylammonium bromide (DDAB) into an organic toluene solvent to form an organic solution, dissolving sodium sulfide into a water solvent to form an aqueous solution respectively, and then mixing the organic solution and the aqueous solution to obtain the sulfuring agent. During the mixing of the organic solution and the aqueous solution, a sulfide ion (anion) in the aqueous solution tends to connect to didodecyldimethylammonium bromide (DDAB) (cation), and transfer from the aqueous solution toward the organic solution (organic toluene phase). The sulfuring treatment method was uniformly mixing the 1.5 mL of the all-inorganic perovskite quantum dot ($CsPbBr_3$) solution (10 mg/mL) and 10 µL of oleic acid for 10 minutes, and then adding 1.5 mL of the sulfuring agent SDDA therein. The mixture obtained by the sulfuring treatment was subjected to the centrifugal treatment of 9000 rpm and then dispersed in a hexane to obtain the $CsPbBr_3$/SDDA solution. The $CsPbBr_3$/SDDA solution was dried to obtain the quantum dot composite material $CsPbBr_3$/SDDA.

The quantum dot composite material (indicated by MP-$CsPbBr_3$/SDDA) was formed by the following steps. The quantum dot composite material $CsPbBr_3$/SDDA was mixed in the nonpolar hexane solvent (10 mg/ml) to form the mixture solution. Then the silicon dioxide mesoporous particle was mixed into the mixture solution with the ratio of the all-inorganic perovskite quantum dot to the silicon dioxide mesoporous particle being about 1:10. After the mixture was stirred for about 1 hour, the centrifugal treatment of 4000 rpm was performed to the mixture for 30 minutes to obtain powders of the quantum dot composite material MP-$CsPbBr_3$/SDDA.

The quantum dot composite material (indicated by MP-$CsPbBr_3$/SDDA@PMMA) was formed by mixing 20 mg of the quantum dot composite material MP-$CsPbBr_3$/SDDA, 3 mL of methylmethacrylate and 10 mg of BASF catalyst to obtain the mixture, stirring the mixture for 10 minutes, and then drying the mixture put in the mold by the oven with 50° C. for 10 minutes. In the present disclosure, the term "@PMMA" at an end of a symbol for the quantum dot composite material means that the quantum dot composite material has a polymethyl methacrylate (PMMA) polymer encapsulation as the outermost layer.

Figure 51:
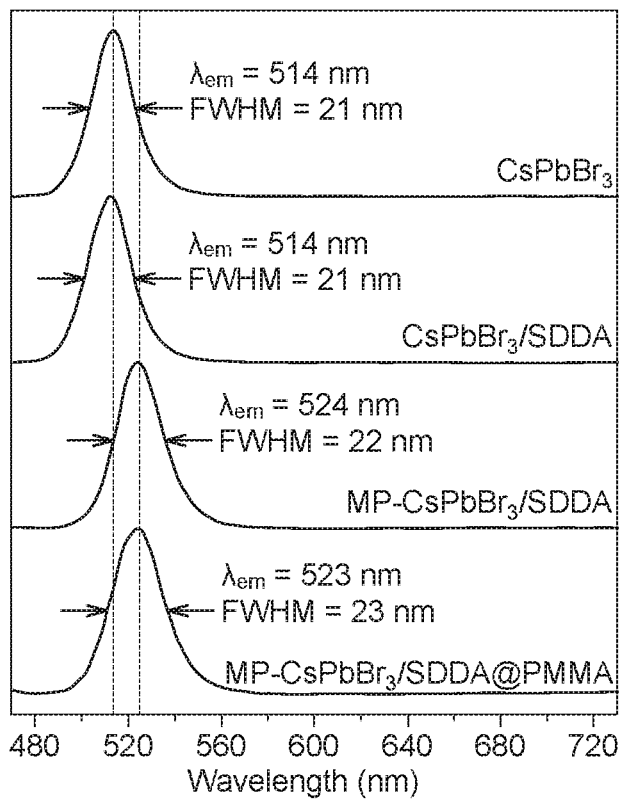
FIG. 51 shows PL spectrums of all-inorganic perovskite quantum dots and quantum dot composite materials.

FIG. 51 shows the PL spectrums of the all-inorganic perovskite quantum dots and the quantum dot composite materials. The curve of the green all-inorganic perovskite quantum dot $CsPbBr_3$ (comparative example) has an emission position of 515 nm and a FWHM of about 21 nm. The curve of the green all-inorganic perovskite quantum dot $CsPbBr_3$ with the surface modified by the sulfuring treatment of an embodiment indicated by a symbol $CsPbBr_3$/SDDA has an emission position of 515 nm and a FWHM of about 21 nm. The curve of the quantum dot composite material $CsPbBr_3$/SDDA with the silicon dioxide mesoporous particle having a physical adsorption reaction therebetween of an embodiment indicated by a symbol MP-$CsPbBr_3$/SDDA has a red shift emission position of 524 nm and a FWHM of about 22 nm, which would be due to an aggregation phenomenon of the all-inorganic perovskite quantum dot. The curve of the quantum dot composite material MP-$CsPbBr_3$/SDDA with the methylmethacrylate (PMMA) polymer encapsulation covering the silicon dioxide mesoporous particle of the quantum dot composite material MP-$CsPbBr_3$/SDDA of an embodiment indicated by a symbol MP-$CsPbBr_3$/SDDA@PMMA has a red shift emission position of 523 nm and a FWHM of about 22 nm.

Figure 52:
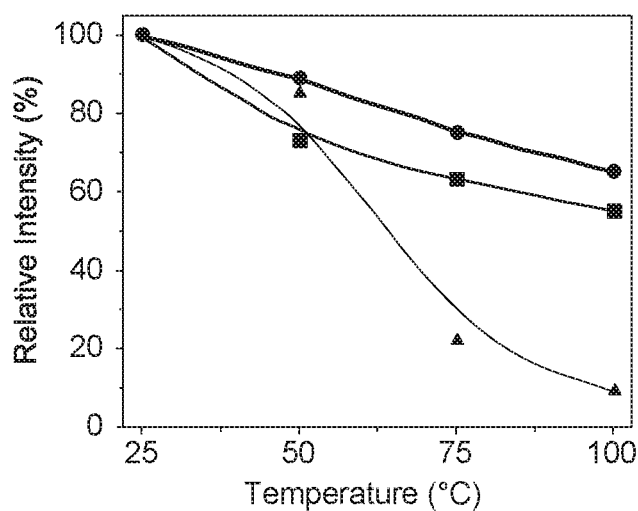
FIG. 52 shows test results of heat stability of an all-inorganic perovskite quantum dot and quantum dot composite materials.

FIG. 52 shows the test results of heat stability of the all-inorganic perovskite quantum dot and the quantum dot composite materials. The quantum dot composite material MP-CsPbBr$_3$/SDDA@PMMA has the emission intensity reaching 70% at 100° C., having better heat stability than the other materials.

Figure 53:
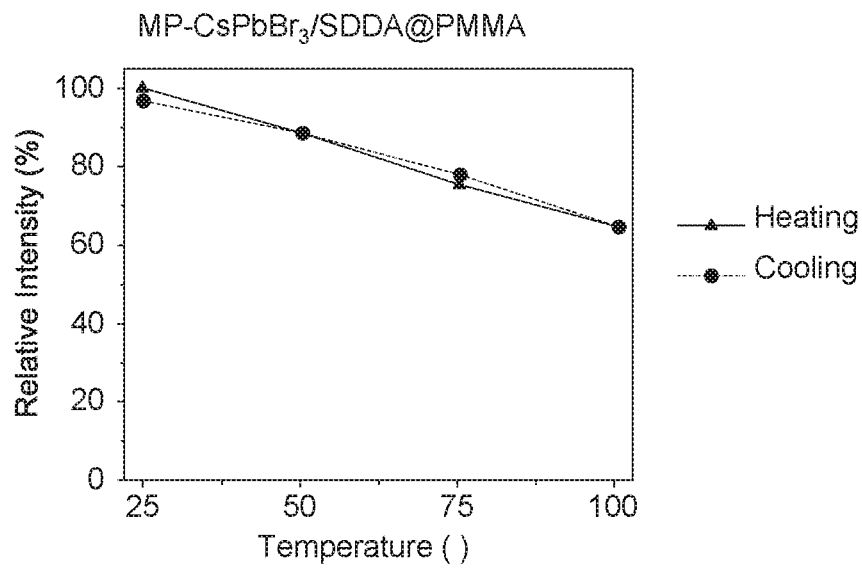
FIG. 53 shows test result of thermal recovery of quantum dot composite material.

FIG. 53 shows the test result of thermal recovery of the quantum dot composite material. The quantum dot composite material MP-CsPbBr$_3$/SDDA@PMMA has the emission intensity of 95% at the room temperature even after being heated to the high temperature, exhibiting stable characteristics.

【Light Emitting Diode Package Structure】

Figure 54:
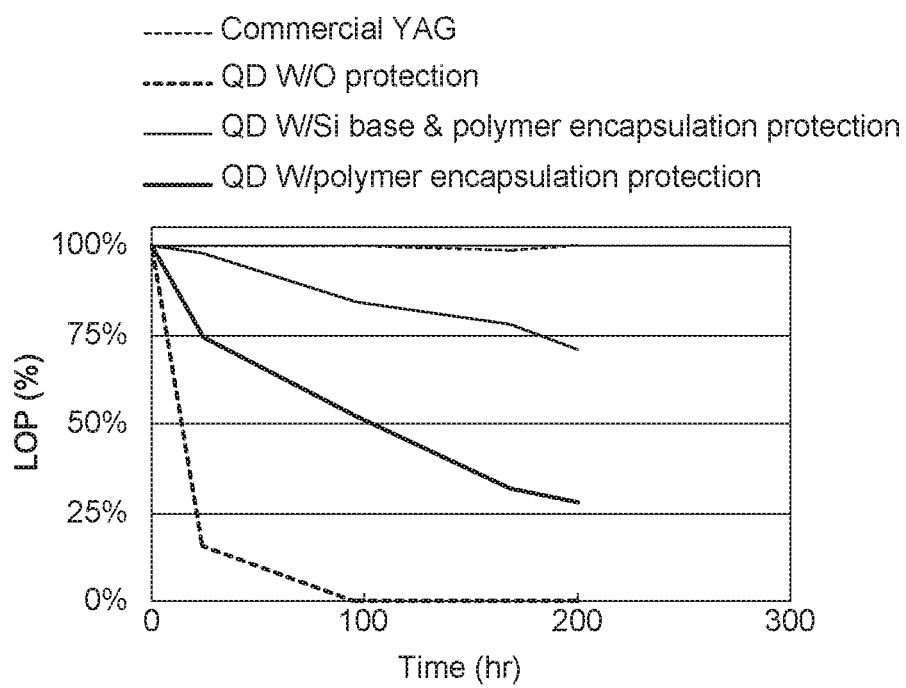
FIG. 54 shows light output power curves of light emitting diode package structures during a period of time.

FIG. 54 shows the light output power (LOP) curves of the light emitting diode package structures using different wavelength-converting materials during a period of time. The wavelength-converting materials respectively are the commercial YAG phosphor powder (Commercial YAG) as a reference; the all-inorganic perovskite quantum dot without a modification protection formed thereon of the comparative example (QD W/O protection); the quantum dot composite material having the polymer encapsulation as the modification protection formed on the all-inorganic perovskite quantum dot of the embodiment (QD W/polymer encapsulation protection); the quantum dot composite material having the modification protection of two-layer structure on the all-inorganic perovskite quantum dot of the embodiment (QD W/Si base & polymer encapsulation protection), wherein the inner layer of the modification protection of two-layer structure is the silicon containing material encapsulation, and the outer layer of the modification protection of two-layer structure is the polymer encapsulation. In the present disclosure, the symbol "W/O" means "without", and the symbol "W/" means "with". From the results shown in FIG. 54, it is found that the light emitting diode package structures using the quantum dot composite materials according to embodiments have less decrease in the light output power during a period of time than the comparative example without a modification protection on the all-inorganic perovskite quantum dot. Therefore, the embodiments have better product reliability.

【White Light Emitting Diode Package Structure】

The white light emitting diode package structure was formed by the following steps. The green phosphor material (the green all-inorganic perovskite quantum dot CsPbBr$_3$/ the green phosphor powder β-SiAlON:Eu$^{2+}$) and the red phosphor material (K$_2$SiF$_6$:Mn$^{4+}$) were uniformly mixed in the silicone glue (Dow Corning OE6631; A glue:B glue=1:2) to obtain the glue mixture. Then the glue mixture was defoamed in the vacuum defoaming machine to obtain the phosphor paste. The phosphor paste was dropped onto the blue light emitting diode chip, and then was cured in the oven by 150° C. for 2 hours so as to obtain the white light emitting diode package structure.

Figure 55:
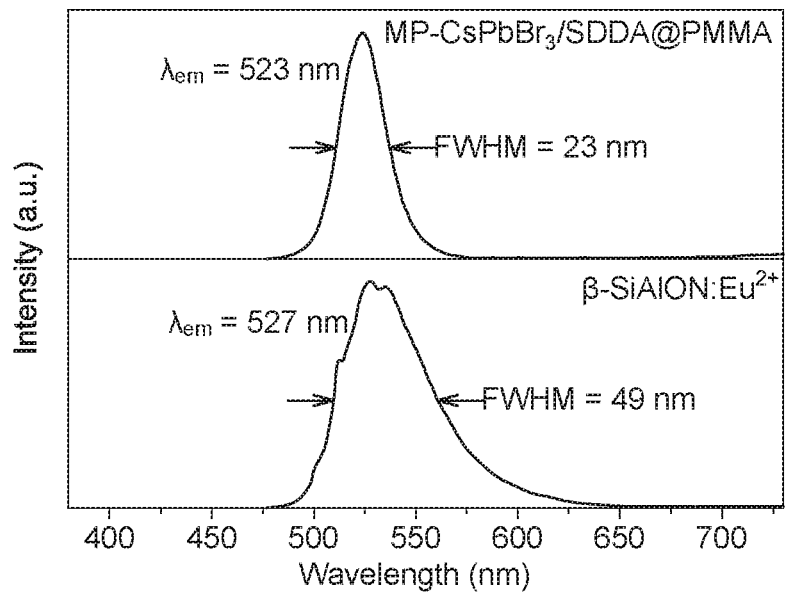
FIG. 55 shows a comparison between emission spectrums of a quantum dot composite material and a conventional green phosphor powder.

FIG. 55 shows a comparison between the emission spectrums of the quantum dot composite material comprising the green all-inorganic perovskite quantum dot CsPbBr$_3$ (MP-CsPbBr$_3$/SDDA@PMMA) and the conventional green phosphor powder β-SiAlON:Eu$^{2+}$ used for the white light emitting diode package structures. The quantum dot composite material MP-CsPbBr$_3$/SDDA@PMMA of the embodiment has a FWHM of about 23 nm, narrower than the comparative example, and the position of the wave peak of the embodiment is 523 nm.

Figure 56:
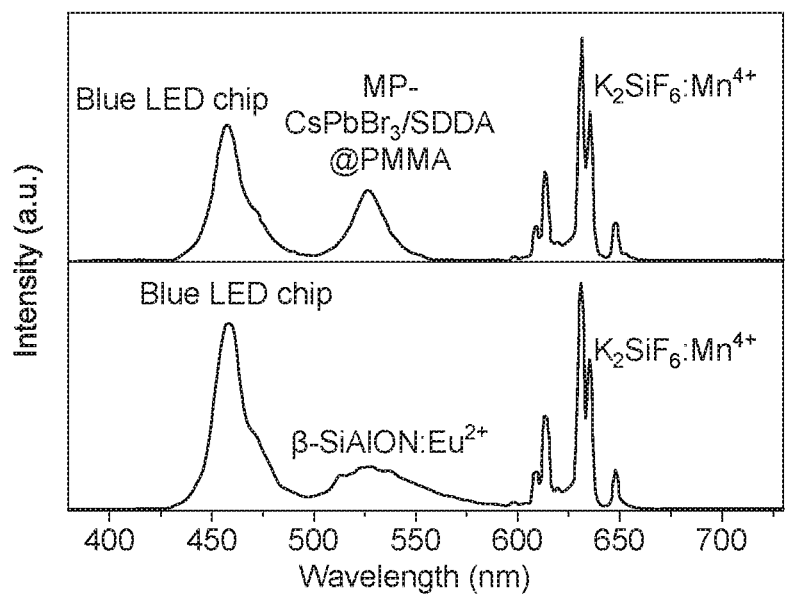
FIG. 56 shows a comparison between electroluminescent spectrums of white light emitting diode package structures of an embodiment and a comparative example.

FIG. 56 shows a comparison between the electroluminescent spectrums of the white light emitting diode package structure of the embodiment (upper figure, using MP-CsPbBr$_3$/SDDA@PMMA) and the conventional white light emitting diode package structure of the comparative example (lower figure, using β-SiAlON:Eu$^{2+}$). The FWHM of the light wave in the green range of the white light emitting diode package structure of the embodiment is narrower than the comparative example.

Figure 57:
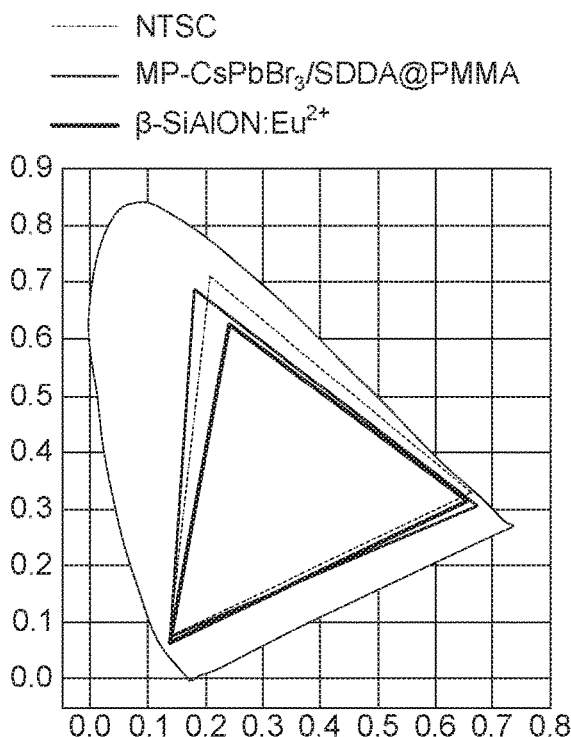
FIG. 57 shows a NTSC comparison between white light emitting diode package structures of an embodiment and a comparative example.

FIG. 57 shows a NTSC comparison of the white light emitting diode package structure of the embodiment (indicated with MP-CsPbBr$_3$/SDDA@PMMA) and the conventional white light emitting diode package structure of the comparative example (indicated with β-SiAlON:Eu$^{2+}$). The white light emitting diode package structure of the embodiment has the NTSC of wider color gamut.

【Heat Stability Test】

Figure 58:
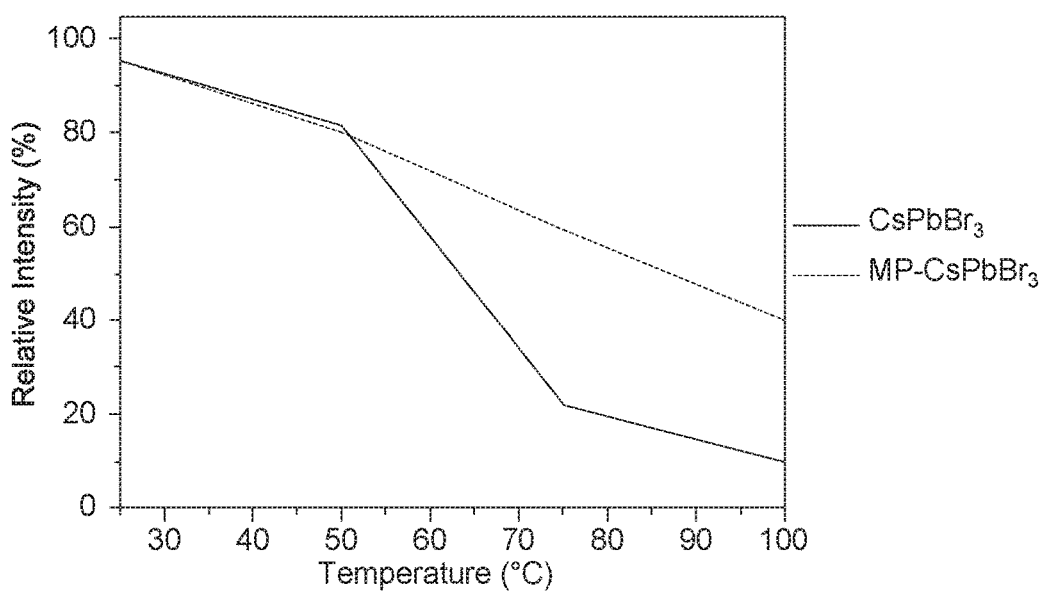
FIG. 58 shows heat stability results of a quantum dot composite material of an embodiment and an all-inorganic perovskite quantum dot of a comparative example tested by a thermal controller.

FIG. 58 shows the heat stability results of the quantum dot composite material of the embodiment (MP-CsPbBr$_3$) and the all-inorganic perovskite quantum dot of the comparative example (CsPbBr$_3$), tested by the thermal controller in a temperature range of 25° C. to 100° C. As the temperature is high, the quantum dot composite material of the embodiment (all-inorganic perovskite quantum dot CsPbBr$_3$ embedded in the silicon dioxide mesoporous particle modification protection, indicated by MP-CsPbBr$_3$ for the curve) has the emission relative intensity with a decrease by an amount less than that of the comparative example (the all-inorganic perovskite quantum dot CsPbBr$_3$ without a modification protection, indicated by CsPbBr$_3$ for the curve). Therefore, the quantum dot composite material of the embodiment has a better heat stability.

Figure 59A:
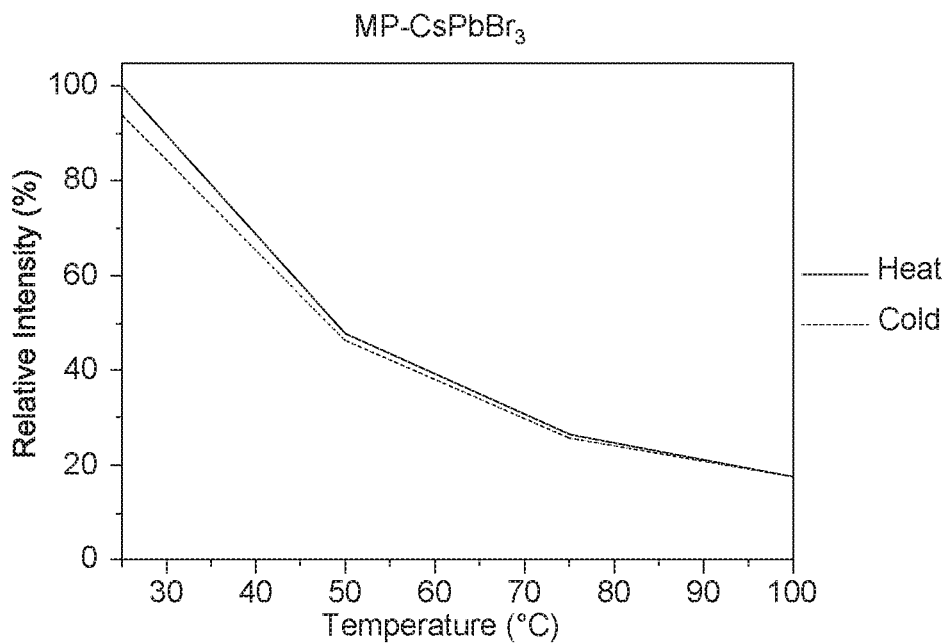
FIG. 59A is a thermal cycle test result of a quantum dot composite material of an embodiment.
Figure 59B:
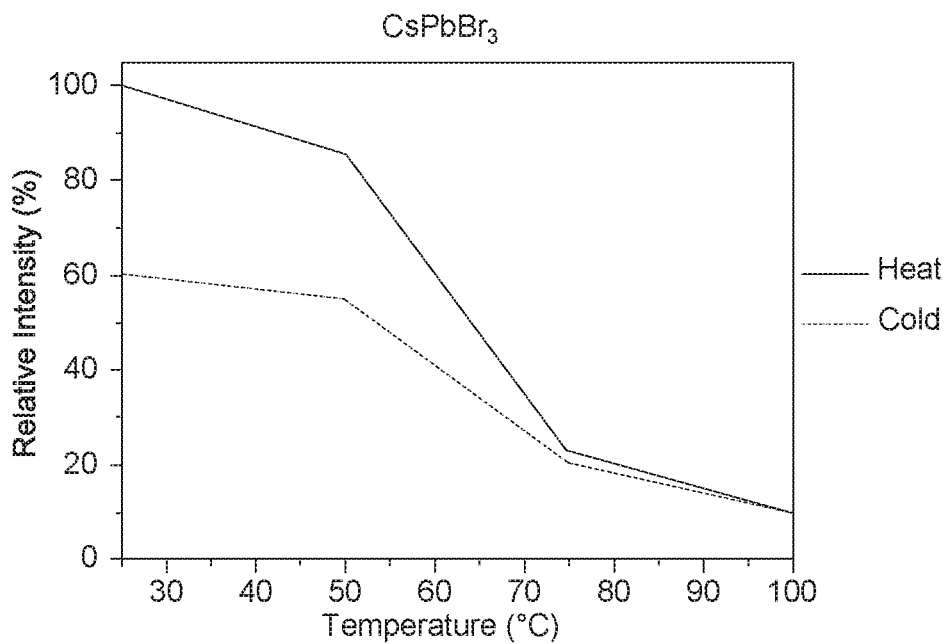
FIG. 59B is a thermal cycle test result of an all-inorganic perovskite quantum dot of a comparative example.

FIG. 59A and FIG. 59B are the thermal cycle test results of the quantum dot composite material of the embodiment (MP-CsPbBr$_3$) and the all-inorganic perovskite quantum dot of the comparative example (CsPbBr$_3$), respectively. The quantum dot composite material of the embodiment has the emission intensity at the room temperature after going through the thermal cycle, almost being the same with the emission intensity at the room temperature before going through the thermal cycle. In addition, from the comparison of the results of FIG. 59A and FIG. 59B, it is found that the quantum dot composite material of the embodiment has a better heat stability than the comparative example.

Figure 60:
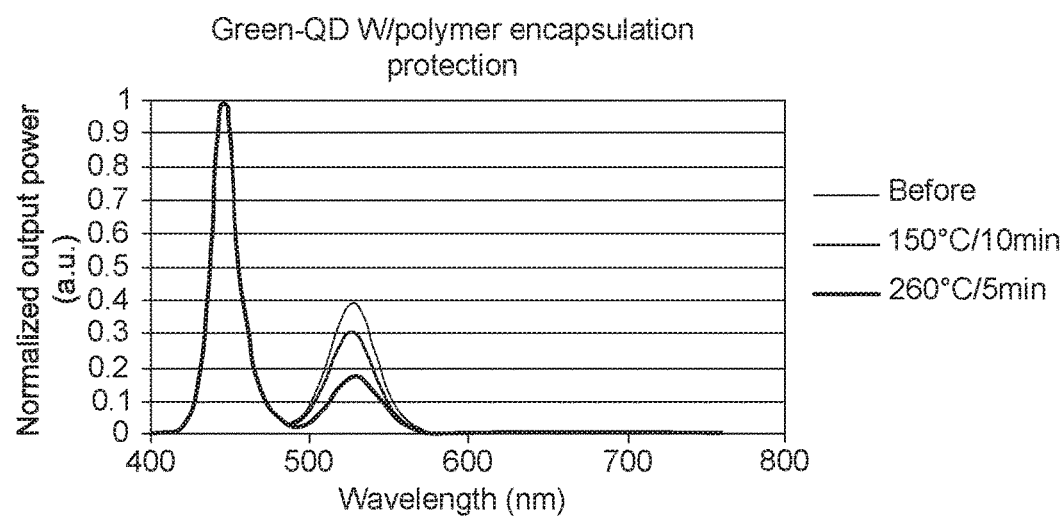
FIG. 60 shows curves of a temperature tolerance test of a light emitting diode package structure of an embodiment, with a quantum dot composite material comprising a green all-inorganic perovskite quantum dot and a modification protection being a polymer encapsulation.
Figure 61:
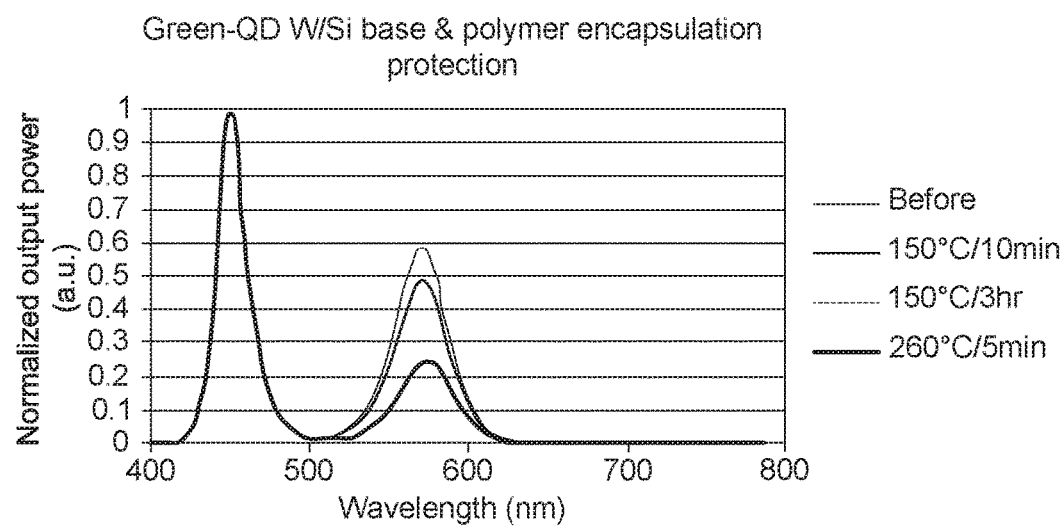
FIG. 61 shows curves of a temperature tolerance test of a light emitting diode package structure of an embodiment, with a quantum dot composite material comprising a green all-inorganic perovskite quantum dot and a modification protection having a two-layer structure with an inner layer of a silicon containing material encapsulation and an outer layer of a polymer encapsulation.
Figure 62:
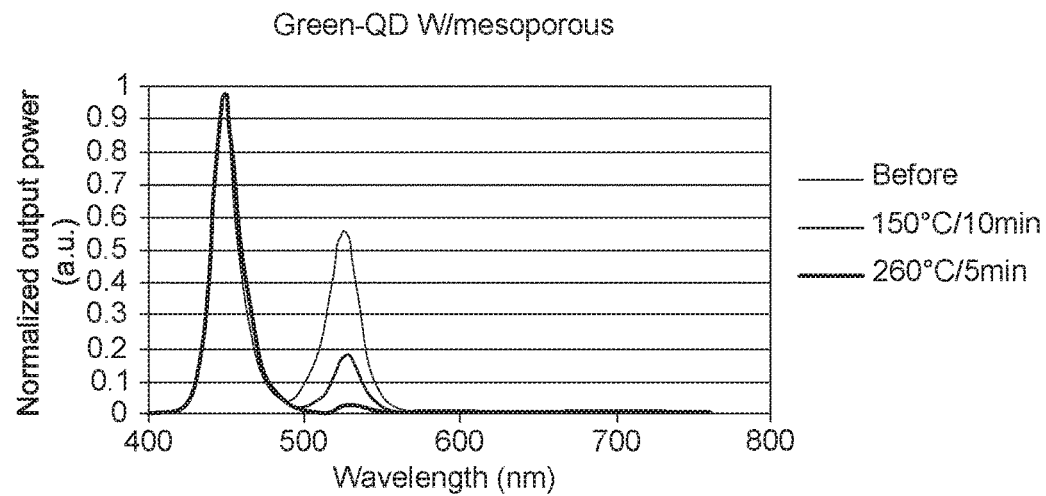
FIG. 62 shows curves of a temperature tolerance test of a light emitting diode package structure of an embodiment, with a quantum dot composite material comprising a green all-inorganic perovskite quantum dot and a modification protection being a mesoporous particle.
Figure 63:
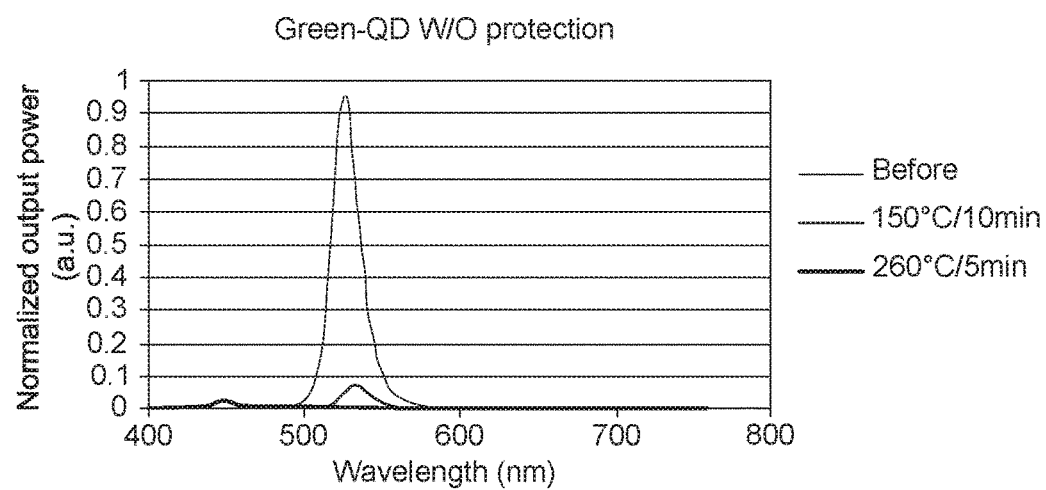
FIG. 63 shows curves of a temperature tolerance test of a light emitting diode package structure of a comparative example.

FIG. 60, FIG. 61 and FIG. 62 show the curves of temperature tolerance test of the light emitting diode package structures of the embodiments. The wavelength-converting materials use the quantum dot composite materials of the green all-inorganic perovskite quantum dots together with the modification protections of different types, respectively being the polymer encapsulation (indicated by Green-QD W/polymer encapsulation protection); the two-layer structure with the inner layer being the silicon containing material encapsulation and the outer layer being the polymer encapsulation (indicated by Green-OD W/Si base & polymer encapsulation protection); and the mesoporous particle (indicated by Green-QD W/mesoporous). FIG. 63 shows the curves of temperature tolerance test of the light emitting diode package structure of the comparative example, using the green all-inorganic perovskite quantum dot without a modification protection formed thereon (indicated by Green-QD W/O protection). The normalized curves are obtained based on the maximum output power before the heating process as the base of 100%. The Data for the curves are shown in Table 3. From the results of FIG. 60, FIG. 61, FIG. 62, FIG. 63 and Table 3, it is found that the quantum dot composite materials of the embodiments having the modification protection on the all-inorganic perovskite quantum dot have better temperature tolerance characteristics than the comparative example.

TABLE 3

| MODIFICATION PROTECTION | 150° C./10 min | 260° C./10 min |
|---|---|---|
| TWO-LAYER STRUCTURE | 83.3% | 41.1% |
| POLYMER ENCAPSULATION | 77.2% | 44.2% |
| MESOPOROUS PARTICLE | 31.5% | 5.3% |
| NONE (COMPARATIVE EXAMPLE) | 4.5% | 0.1% |

【Light Stability Test】

Figure 64:
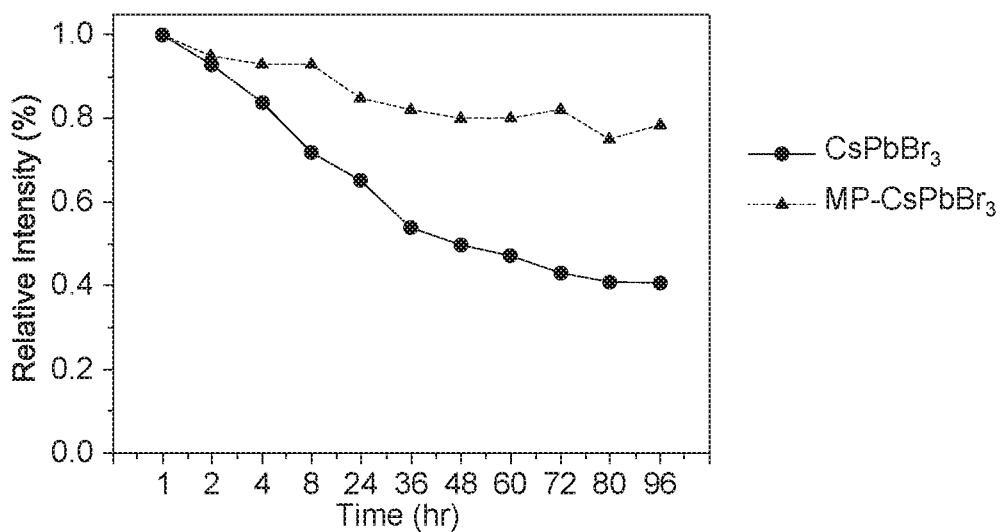
FIG. 64 is test results of light stability of a quantum dot composite material of an embodiment and an all-inorganic perovskite quantum dot of a comparative example.

FIG. 64 is the test results of light stability of the quantum dot composite material of the embodiment (MP-CsPbBr$_3$) and the all-inorganic perovskite quantum dot of the comparative example (CsPbBr$_3$). The test method uses a UV light (with a wavelength of 365 nm, and a power of 6 W) to irradiate the quantum dot composite material MP-CsPbBr$_3$ of the embodiment and the all-inorganic perovskite quantum dot CsPbBr$_3$ of the comparative example dispersed in the hexane solvent. The emission relative intensity of the all-inorganic perovskite quantum dot CsPbBr$_3$ of the comparative example after being irradiated by the light for 96 hours is decreased to 40% with the condition before being irradiated as the base. The emission relative intensity of the quantum dot composite material MP-CsPbBr$_3$ of the embodiment after being irradiated by the light for 96 hours is decreased to 80% with the condition before being irradiated as the base. Therefore, the quantum dot composite material MP-CsPbBr$_3$ of the embodiment has a better light stability than the comparative example.

【Wavelength Converting Film】

Figure 65:
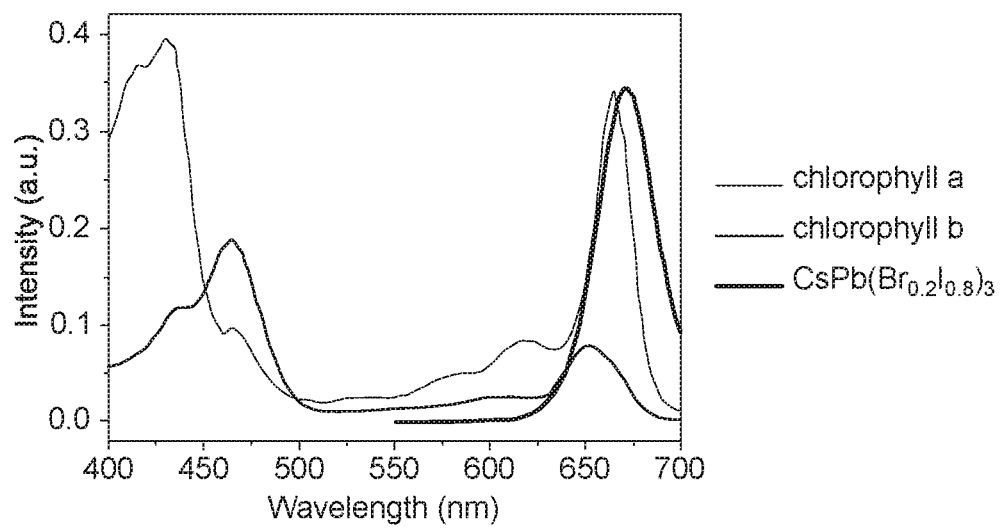
FIG. 65 shows a comparison of an emission spectrum ($\lambda_{ex}$=460 nm) of a wavelength converting film of an embodiment and absorption spectrums of a chlorophyll a and a chlorophyll b.
Figure 66A:
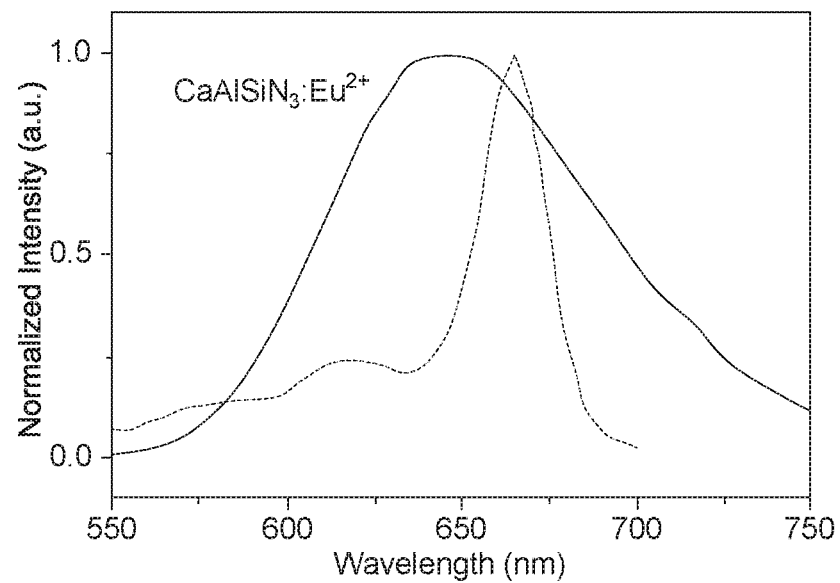
Figure 66B:
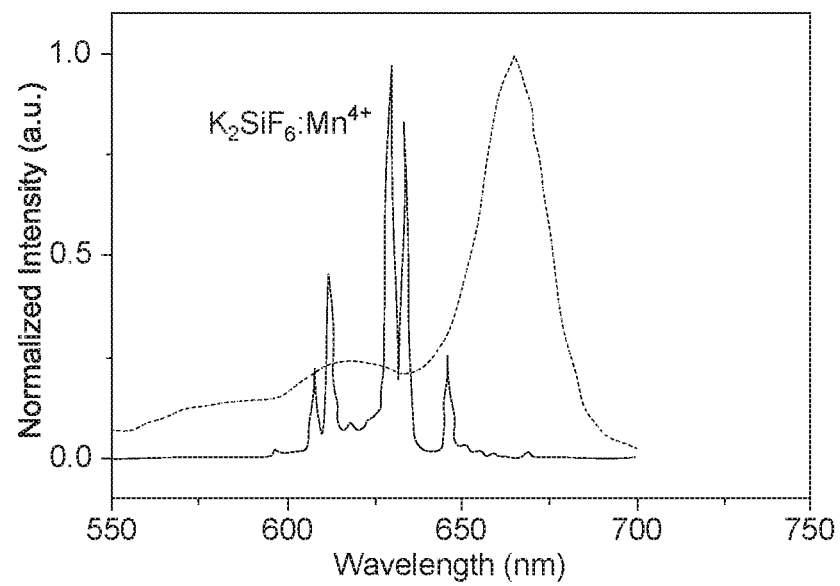
Figure 66C:
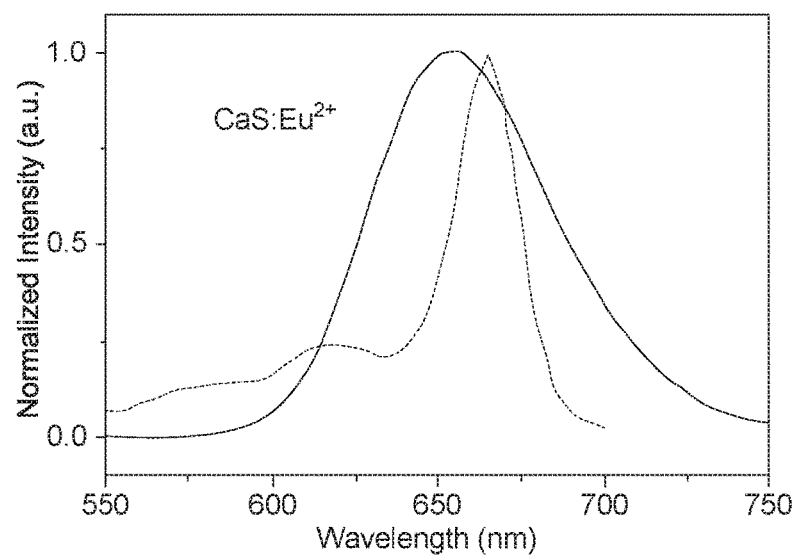

FIG. 65 shows a comparison of the emission spectrum ($\lambda_{ex}$=460 nm) of the wavelength converting film of the embodiment and the absorption spectrums of a chlorophyll a and a chlorophyll b. The wavelength converting film has the quantum dot composite material formed by the red all-inorganic perovskite quantum dot and the silicon dioxide mesoporous particle as the modification protection on the red all-inorganic perovskite quantum dot. FIG. 66A to FIG. 66C show comparisons of the emission spectrums of the red phosphor powders of the comparative examples and the absorption spectrum of the chlorophyll a. The comparative examples respectively use the conventional red phosphor powders CaAlSiN$_3$:Eu$^{2+}$, K$_2$SiF$_6$:Mn$^{4+}$, CaS:Eu$^{2+}$. From the results of FIG. 65 to FIG. 66C, the emission from the red all-inorganic perovskite quantum dot according to the embodiment is the wavelength range of red light more matching the red light absorbing for the chlorophyll a than the comparative examples.

According to the disclosed embodiments, the quantum dot composite material comprising the modification protection on the all-inorganic perovskite quantum dot can exhibit good emission properties and stable characteristics. Therefore, an efficiency stability and lifespan of a device product can be improved by using the quantum dot composite material.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A quantum dot composite material, comprising:
   an all-inorganic perovskite quantum dot having a chemical formula of CsPb(Cl$_a$Br$_{1-a-b}$I$_b$)$_3$, wherein 0≤a≤1, 0≤b≤1; and
   a modification protection on a surface of the all-inorganic perovskite quantum dot,
   wherein the modification protection comprises a mesoporous particle, the mesoporous particle has a surface having pores, the all-inorganic perovskite quantum dot is embedded in the pores.

2. The quantum dot composite material according to claim 1, wherein the modification protection further comprises a microcapsule, a polymer encapsulation, an oxide or nitride dielectric encapsulation or a combination thereof.

3. The quantum dot composite material according to claim 1, wherein the modification protection further comprises a ligand exchange, the ligand exchange is on the surface of the all-inorganic perovskite quantum dot embedded in the pores of the mesoporous particle.

4. The quantum dot composite material according to claim 3, wherein the ligand exchange is formed by a sulfuring treatment performed to the surface of the all-inorganic perovskite quantum dot.

5. The quantum dot composite material according to claim 3, wherein the modification protection further comprises a polymer encapsulation, a silicon containing material encapsulation or an oxide or nitride dielectric encapsulation, covering the mesoporous particle.

6. The quantum dot composite material according to claim 1, wherein the mesoporous particle has a particle diameter in a range of 200 nm to 1000 nm, the pores of the mesoporous particle have a size of 1 nm to 100 nm.

7. The quantum dot composite material according to claim 6, wherein the pores have the size of 2 nm to 20 nm.

8. The quantum dot composite material according to claim 2, wherein:
   the mesoporous particle has a material comprising silicon dioxide;
   the polymer encapsulation has a material comprising PMMA, PET, PEN, PS, PVDF, PVAC, PP, PA, PC, PI, an epoxy, a silicone, or a combination thereof;
   the oxide or nitride dielectric encapsulation has a material comprising a metal oxide, a metal nitride or a combination thereof.

9. The quantum dot composite material according to claim 1, wherein the all-inorganic perovskite quantum dot comprises a red all-inorganic perovskite quantum dot having a chemical formula of CsPb(Br$_{1-b}$I$_b$)$_3$ with 0.5≤b≤1, a green all-inorganic perovskite quantum dot having a chemical formula of CsPb(Br$_{1-b}$I$_b$)$_3$ with 0≤b<0.5, or a blue all-inorganic perovskite quantum dot having a chemical formula of CsPb(Cl$_a$Br$_{1-a}$)$_3$ with 0<a≤1, or a combination thereof.

10. The quantum dot composite material according to claim 9, wherein the red all-inorganic perovskite quantum dot has a particle diameter in a range of 10 nm to 14 nm, the green all-inorganic perovskite quantum dot has a particle diameter in a range of 8 nm to 12 nm, the blue all-inorganic perovskite quantum dot has a particle diameter in a range of 7 nm to 10 nm.

11. A manufacturing method for a quantum dot composite material, comprising:
   providing an all-inorganic perovskite quantum dot having a chemical formula of CsPb(Cl$_a$Br$_{1-a-b}$I$_b$)$_3$, 0≤a≤1, 0≤b≤1; and
   forming a modification protection on a surface of the all-inorganic perovskite quantum dot, wherein the forming the modification protection on the surface of the all-inorganic perovskite quantum dot comprises: embedding the all-inorganic perovskite quantum dot in a pore of a surface of a mesoporous particle.

12. The manufacturing method for the quantum dot composite material according to claim 11, wherein the forming the modification protection on the surface of the all-inorganic perovskite quantum dot further comprises:
before the embedding the all-inorganic perovskite quantum dot in the pore of the surface of the mesoporous particle, performing a sulfuring treatment to the surface of the all-inorganic perovskite quantum dot; and
covering the mesoporous particle with a polymer encapsulation.

13. The manufacturing method for the quantum dot composite material according to claim 12, wherein the sulfuring treatment comprises reacting the all-inorganic perovskite quantum dot with a sulfur containing compound by a ligand exchanging reaction.

14. The manufacturing method for the quantum dot composite material according to claim 13, wherein the sulfur containing compound comprises a sulfur containing quaternary ammonium salt.

15. The manufacturing method for the quantum dot composite material according to claim 13, wherein the sulfuring treatment comprises:
mixing the all-inorganic perovskite quantum dot with an oleic acid; and
mixing the oleic acid and the all-inorganic perovskite quantum dot with a sulfuring agent having the sulfur containing compound,
wherein the sulfuring agent is manufactured by a method comprising mixing an organic solution dissolving a halogen containing quaternary ammonium salt and an aqueous solution dissolving an alkali metal sulfide.

16. The manufacturing method for the quantum dot composite material according to claim 15, wherein the halogen containing quaternary ammonium salt has a formula of $R_4NX$, R is an alkyl group, an alkoxyl group, a phenyl group or an alkyl phenyl group containing a carbon chain having 1-20 carbon atoms, X is chlorine, bromine or iodine.

* * * * *